(12) United States Patent
Udayakumar et al.

(10) Patent No.: US 8,496,842 B2
(45) Date of Patent: Jul. 30, 2013

(54) MEMS DEVICE FABRICATED WITH INTEGRATED CIRCUIT

(75) Inventors: Kezhakkedath R. Udayakumar, Dallas, TX (US); Marie Denison, Plano, TX (US); Ted S. Moise, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/230,350

(22) Filed: Sep. 12, 2011

(65) Prior Publication Data

US 2013/0062996 A1    Mar. 14, 2013

(51) Int. Cl.
*B44C 1/22*     (2006.01)

(52) U.S. Cl.
USPC .................. 216/66; 347/70; 310/321; 438/3

(58) Field of Classification Search
None
See application file for complete search history.

(56) References Cited

U.S. PATENT DOCUMENTS

| 2007/0045687 | A1* | 3/2007 | Kumura et al. | 257/295 |
| 2007/0296008 | A1* | 12/2007 | Natori | 257/295 |
| 2009/0194801 | A1* | 8/2009 | Celii et al. | 257/295 |
| 2011/0037813 | A1* | 2/2011 | Nakatani | 347/70 |
| 2011/0180712 | A1* | 7/2011 | Murakami | 250/338.4 |

* cited by examiner

*Primary Examiner* — Binh X Tran
*Assistant Examiner* — David Cathey, Jr.
(74) *Attorney, Agent, or Firm* — Warren L. Franz; Wade J. Brady, III; Frederick J. Telecky, Jr.

(57) ABSTRACT

A planar integrated MEMS device has a piezoelectric element on a dielectric isolation layer over a flexible element attached to a proof mass. The piezoelectric element contains a ferroelectric element with a perovskite structure formed over an isolation dielectric. At least two electrodes are formed on the ferroelectric element. An upper hydrogen barrier is formed over the piezoelectric element. Front side singulation trenches are formed at a periphery of the MEMS device extending into the semiconductor substrate. A DRIE process removes material from the bottom side of the substrate to form the flexible element, removes material from the substrate under the front side singulation trenches, and forms the proof mass from substrate material. The piezoelectric element overlaps the flexible element.

16 Claims, 37 Drawing Sheets

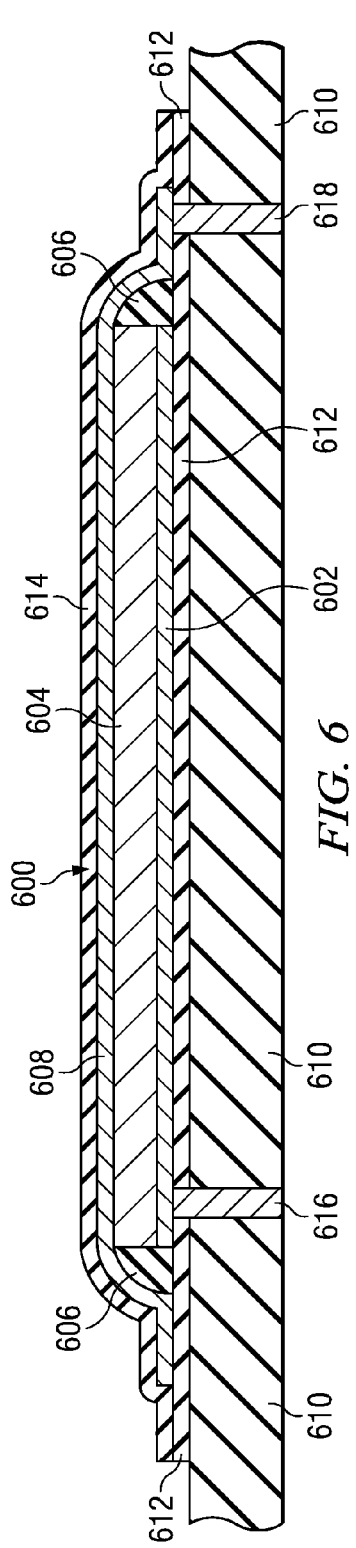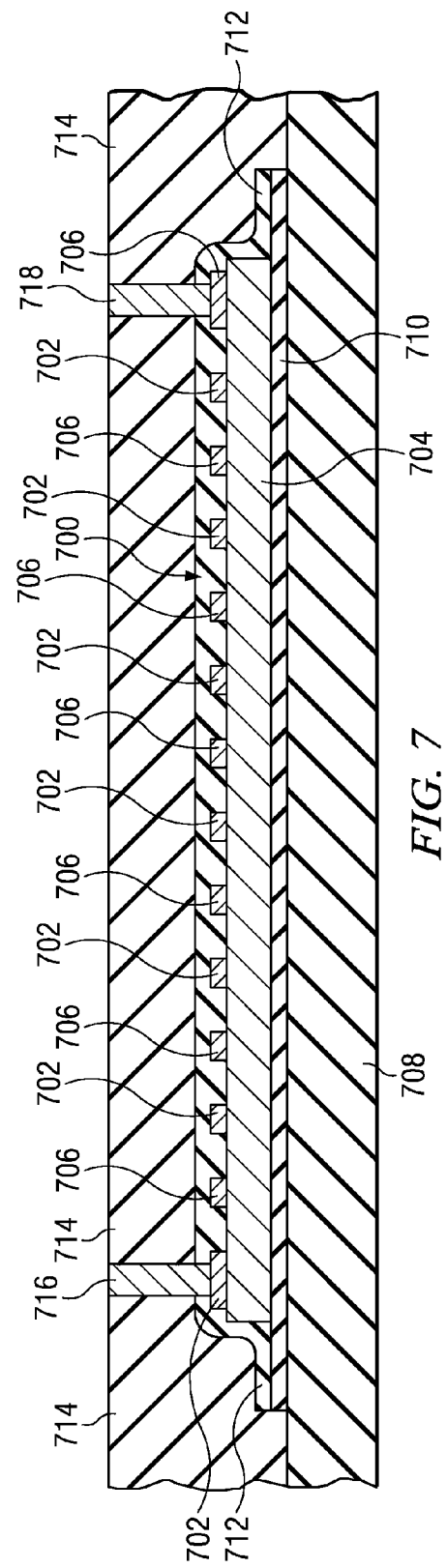

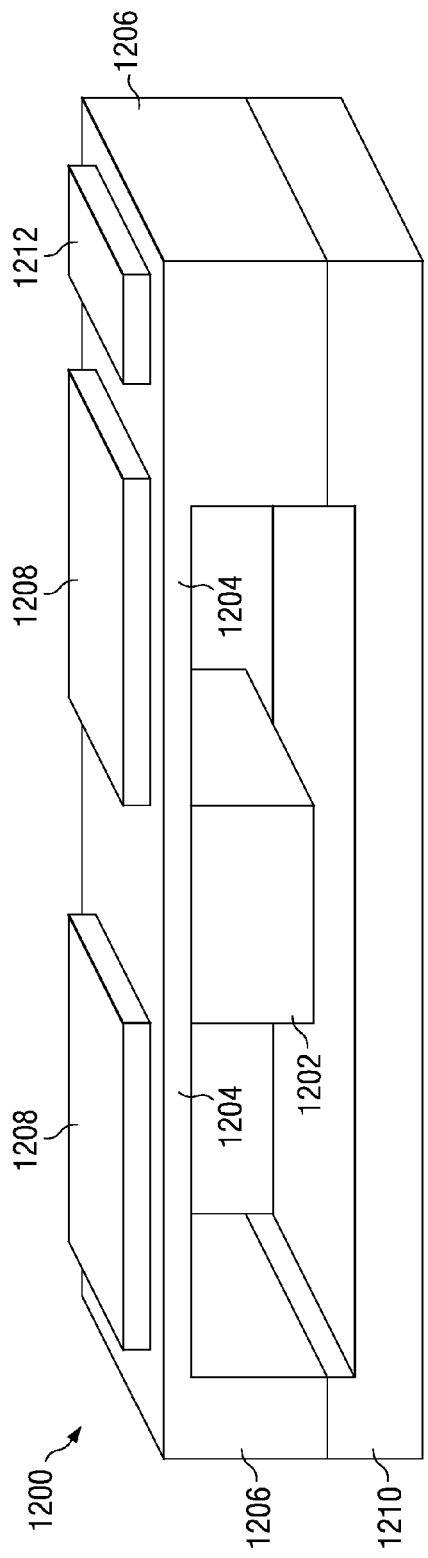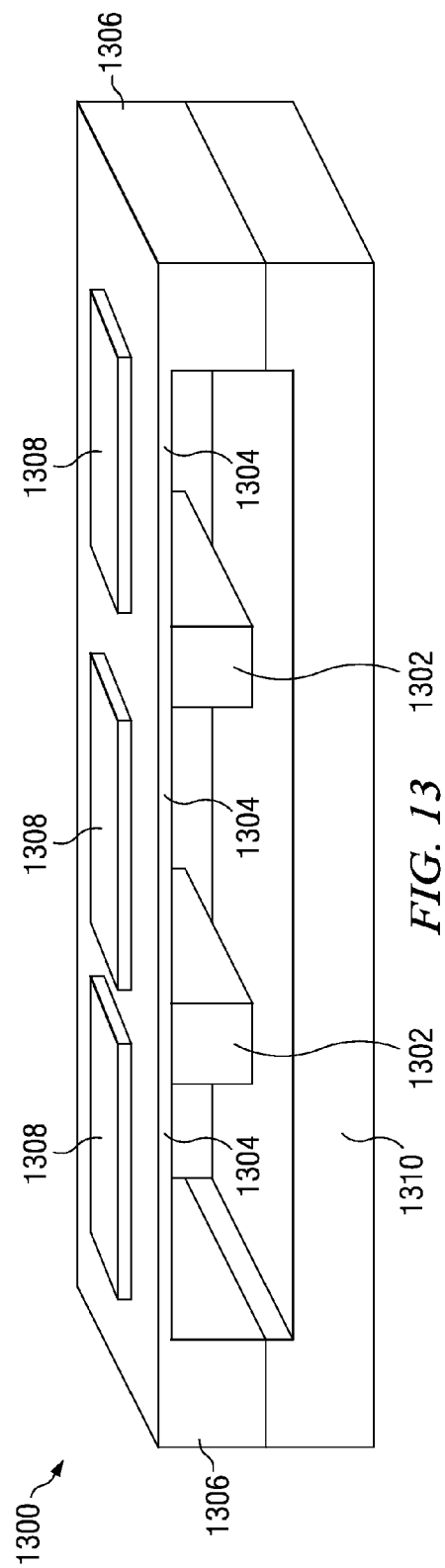

MEMS DEVICE FABRICATED WITH INTEGRATED CIRCUIT

This relates to the field of micro-electromechanical systems (MEMS) devices with piezoelectric elements.

BACKGROUND

Micro-electromechanical systems (MEMS) devices may include piezoelectric elements formed by thin film processes mechanically coupled to a flexible element responsive to force imparted by a proof mass. In some versions, the piezoelectric elements may have electrodes on top and bottom surfaces and operate in the $d_{31}$ mode. In other versions, the piezoelectric elements may have at least two electrodes on the top surfaces and operate in the $d_{33}$ mode. Integrating the piezoelectric elements, the proof mass and the flexible element into the MEMS device may involve a trade-off between fabrication cost of the MEMS device and performance of the piezoelectric element.

SUMMARY

New piezoelectric element micro-electromechanical systems (MEMS) devices and methods for their fabrication are disclosed.

In disclosed embodiments, a MEMS device is integrated on a same substrate as an integrated circuit. A ferroelectric layer is formed and patterned into a piezoelectric element over a dielectric isolation layer over circuit components formed on a substrate. Electrodes for the piezoelectric element are formed on front, back or both front and back surfaces of the piezoelectric element, and contacts are formed to establish electrical connections between the circuitry components and the piezoelectric element electrodes. The back of the substrate is etched to remove material from the substrate and define a flexible element, a proof mass and a base for vibration of the piezoelectric element.

In one form, the piezoelectric element may be formed by applying a plurality of layers of sol gel containing piezoelectric material, such as lead zirconate titanate (PZT), or doped PZT such as lead lanthanum zirconate titanate (PLZT) or lead niobium zirconate titanate (PZNT), over a top surface of the dielectric isolation layer, so that each layer is dried before applying the subsequent layer. After the sol gel layers have been applied, the sol gel layer stack is annealed to form a ferroelectric layer with a perovskite structure. The ferroelectric layer may also be formed by other processes, for example metal organic chemical vapor deposition (MOCVD) or a physical deposition process such as sputtering.

The ferroelectric element and electrodes may be formed to operate the MEMS device in a $d_{31}$ mode, with one electrode formed on a bottom surface and another electrode formed on a top surface of the ferroelectric element; or in a $d_{33}$ mode, with both electrodes formed on the same surface of the ferroelectric element. Hydrogen barrier layers may be formed over and below the piezoelectric element. Front side trenches may be formed at a periphery of the MEMS device extending down into the substrate to assist singulation. The bottom of the substrate may be etched to expose an area for the flexible element and an area corresponding to the front side trenches for singulation, and to mask an area for the proof mass. The etching removes material from the bottom in the flexible element area so as to form the flexible element at the top of the substrate, to remove material from the singulation area to assist singulation of the MEMS device from a remainder of the substrate, and to form the proof mass by leaving substrate material in the proof mass area. The piezoelectric element overlaps the flexible element so as to be vibrated.

BRIEF DESCRIPTION OF THE DRAWINGS

FIGS. 5-8 are cross-sectional views depicting examples of variations of piezoelectric element electrode patterning and contact arrangements for piezoelectric elements of MEMS devices fabricated in accordance with the example methods of FIGS. 1A-1I, 2A-2G and 3A-3D.

FIGS. 12-14 depict examples of MEMS devices with multiple piezoelectric elements formed at same processing levels.

DETAILED DESCRIPTION OF EXAMPLE EMBODIMENTS

Figure 1A:
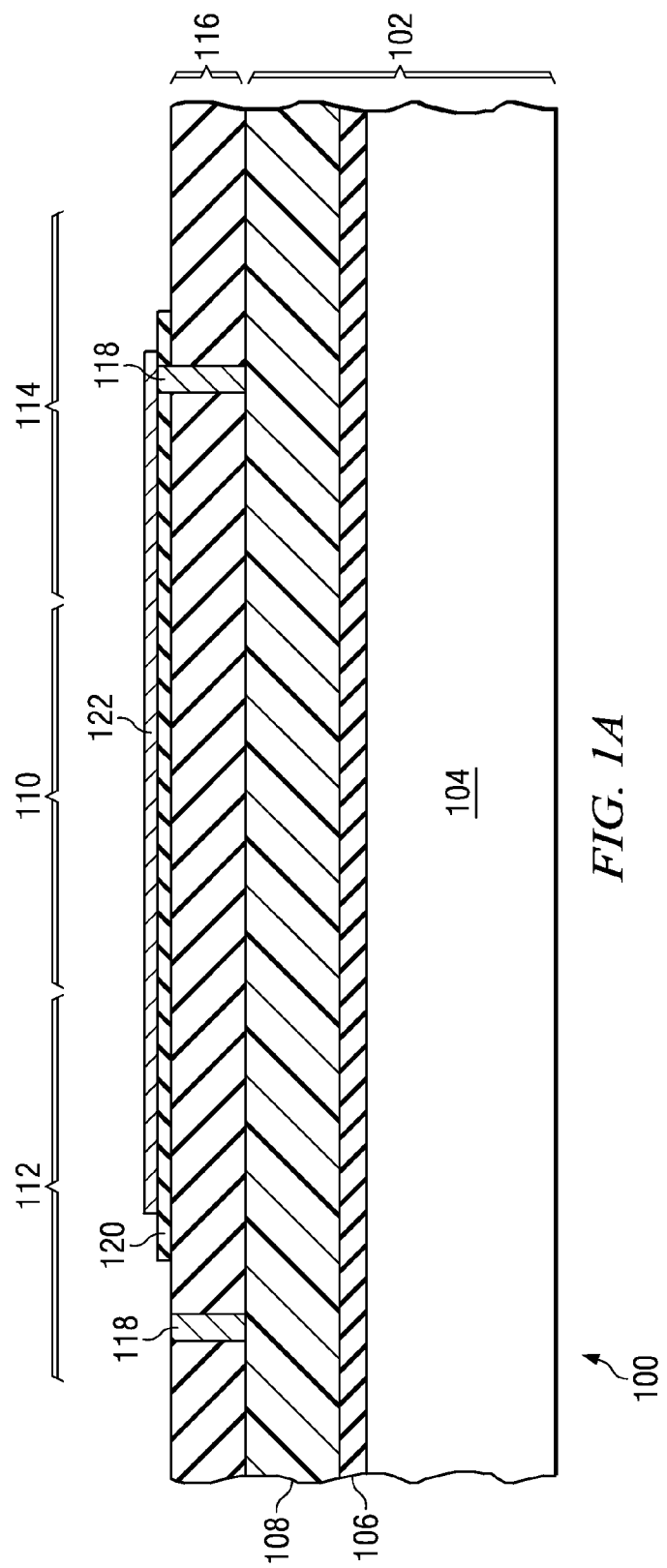
FIGS. 1A-1I are cross-sectional views illustrating steps in an example method for the fabrication of MEMS devices with piezoelectric elements.

A planar integrated MEMS piezoelectric device may be formed on a semiconductor substrate. The substrate may, for example, be a silicon-on-insulator (SOI) or a single crystal silicon wafer. An dielectric isolation layer is formed on the substrate in an area defined for a flexible element. A lower hydrogen barrier layer may be formed over the dielectric isolation layer. A ferroelectric layer is formed over the lower hydrogen layer over the dielectric isolation layer by, for example, a sol gel process or a metal organic chemical vapor deposition (MOCVD) process. The ferroelectric layer is patterned to form a piezoelectric element. At least two electrodes are formed on the piezoelectric element. Piezoelectric elements which operate in the $d_{31}$ mode have a lower electrode on a bottom surface of the piezoelectric element and an upper electrode on a top surface of the piezoelectric element. Piezoelectric elements which operate in the $d_{33}$ mode have patterned first and second electrodes both on a top surface or a bottom surface of the piezoelectric element. An upper hydrogen barrier is formed over the piezoelectric element. Metal contacts are formed to make electrical connections to the electrodes. The metal contacts may be in the dielectric isolation layer and connect to bottom surfaces of the electrodes, or may be formed above the piezoelectric element and connect to top surfaces of the electrodes, or both. Front side singulation trenches which extend to the semiconductor substrate are formed around a periphery of the MEMS device.

A back side surface of the substrate is patterned to expose the flexible element area and back side singulation trench areas. A deep reactive-ion etching (DRIE) process removes silicon from the substrate in the flexible element area and in the back side singulation trench areas so as to form a flexible element. The DRIE process leaves silicon of the substrate which forms a proof mass and a base. For MEMS devices formed on SOI wafers, the DRIE process may stop at a buried oxide (BOX) layer in the SOI wafer so that the flexible element includes silicon of the SOI film of the SOI wafer. For some MEMS devices formed on single crystal silicon wafers, the DRIE process may stop at the dielectric isolation layer so that the flexible element includes less than 10 percent silicon of the substrate. For other MEMS devices formed on single crystal silicon wafers, the DRIE process may be a timed etch which stops before reaching the dielectric isolation layer so that the flexible element includes 50 percent or more of the silicon of the substrate.

A storage capacitor may be formed concurrently with the piezoelectric element so that a capacitor insulator is formed of the same ferroelectric material as the piezoelectric element layer. Plates of the capacitor may be formed concurrently with the electrodes of the piezoelectric element.

Transistors and other integrated circuit components may be formed proximate the top surface of the substrate. The transistors and other components may be formed in one or more of the base area, the proof mass area and in the flexible element area. In particular, rectifier diodes may be formed to rectify current from the piezoelectric element.

In one embodiment, the flexible element may be in a cantilever beam configuration, in which the proof mass is disposed at one end of the beam and a base of the device is disposed at an opposite end of the beam. In another embodiment, the flexible element may be take the form of a membrane, with a base disposed around a periphery of the flexible element and the proof mass disposed at a central region of the flexible element or, alternatively, with a base disposed at the central region and the proof mass disposed around the periphery. In variations of these embodiments, more than one proof mass may be mechanically connected to the flexible element.

FIGS. 1A-1I depict successive stages in an example method of fabricating an illustrative planar integrated MEMS device 100 with a piezoelectric element which operates in the $d_{31}$ mode.

FIG. 1A shows an SOI wafer substrate 102 including a silicon support wafer 104 (for example, 250 to 1000 microns thick), a buried oxide (BOX) layer 106 (for example, 2 to 20 microns thick) formed over the support wafer 104, and an SOI film 108 of crystalline silicon (for example, 1 to 25 microns thick) formed over the buried oxide layer 106. The buried oxide layer 106 may, for example, be one or more layers of silicon dioxide, silicon nitride, silicon oxynitride or other dielectric material. An area for a flexible element 110 of the MEMS device 100 is defined. An area for a proof mass 112 of the MEMS device 100 is defined adjacent to the flexible element area 110. An area for a base 114 of the MEMS device 100 is defined adjacent to the flexible element area 110, opposite from the proof mass area 112.

A dielectric isolation layer 116 (for example, 100 nanometers to 3 microns thick) is formed over the SOI film 108, covering one or more of the components of circuits in the MEMS device 100 formed on the substrate. The dielectric layer 116 may include one or more layers of silicon dioxide, silicon nitride, silicon oxynitride, or other dielectric material. In one implementation, for example, the dielectric layer 116 may include a layer of thermally grown silicon dioxide 300 to 800 nanometers thick on the SOI film 108, a layer of silicon nitride 50 to 200 nanometers thick on the thermally grown silicon dioxide layer, and a layer of silicon dioxide 500 nanometers to 2 microns thick formed by chemical vapor deposition (CVD) on the silicon nitride layer.

A lower hydrogen barrier layer 120 may be formed on a top surface of the dielectric layer 116. The hydrogen barrier layer 120 may include aluminum oxide and may, for example, be 10 to 50 nanometers thick. Other dielectric materials with low hydrogen permeability may be included in the hydrogen barrier layer 120. The hydrogen barrier layer 20 may be patterned as depicted in FIG. 1A or may be left unpatterned to cover the dielectric isolation layer 116.

Contacts 118 may be formed in the dielectric isolation layer 116 and in the lower hydrogen barrier 120, for example, as conductive material filled vias to make electrical connection to underlying circuit components, if present. Contacts 118 through the hydrogen barrier layer 120 are formed subsequent to forming the hydrogen barrier layer. Contacts 118 through the dielectric layer 116 (for example, those having exposed top surfaces laterally separated from overlying segments of a patterned hydrogen barrier layer 120) may be formed prior to or after formation of the hydrogen barrier layer 120. Forming contacts 118 that go through the barrier layer 120 simultaneously with contacts 118 that do not go through the barrier layer 120 may advantageously save processing steps and reduce fabrication cost and complexity.

A first electrode 122 is formed and patterned on the lower hydrogen barrier 120, or on the dielectric isolation layer 116 if the lower hydrogen barrier 120 is omitted. The first electrode 122 may include, for example, an optional layer of titanium aluminum 50 to 200 nanometers thick, a layer of titanium aluminum oxynitride 40 to 150 nanometers thick on the titanium aluminum layer, and a layer of iridium 30 to 150 nanometers thick on the titanium aluminum oxynitride layer. In the depicted embodiment, a lateral periphery of the first electrode 122 is recessed or indented to leave a margin relative to a lateral periphery of the underlying hydrogen barrier 120. The first electrode 122 may make electrical connection to other components by way of contacts 118 formed in the lower hydrogen barrier 120, as depicted in FIG. 1A.

Figure 1B:
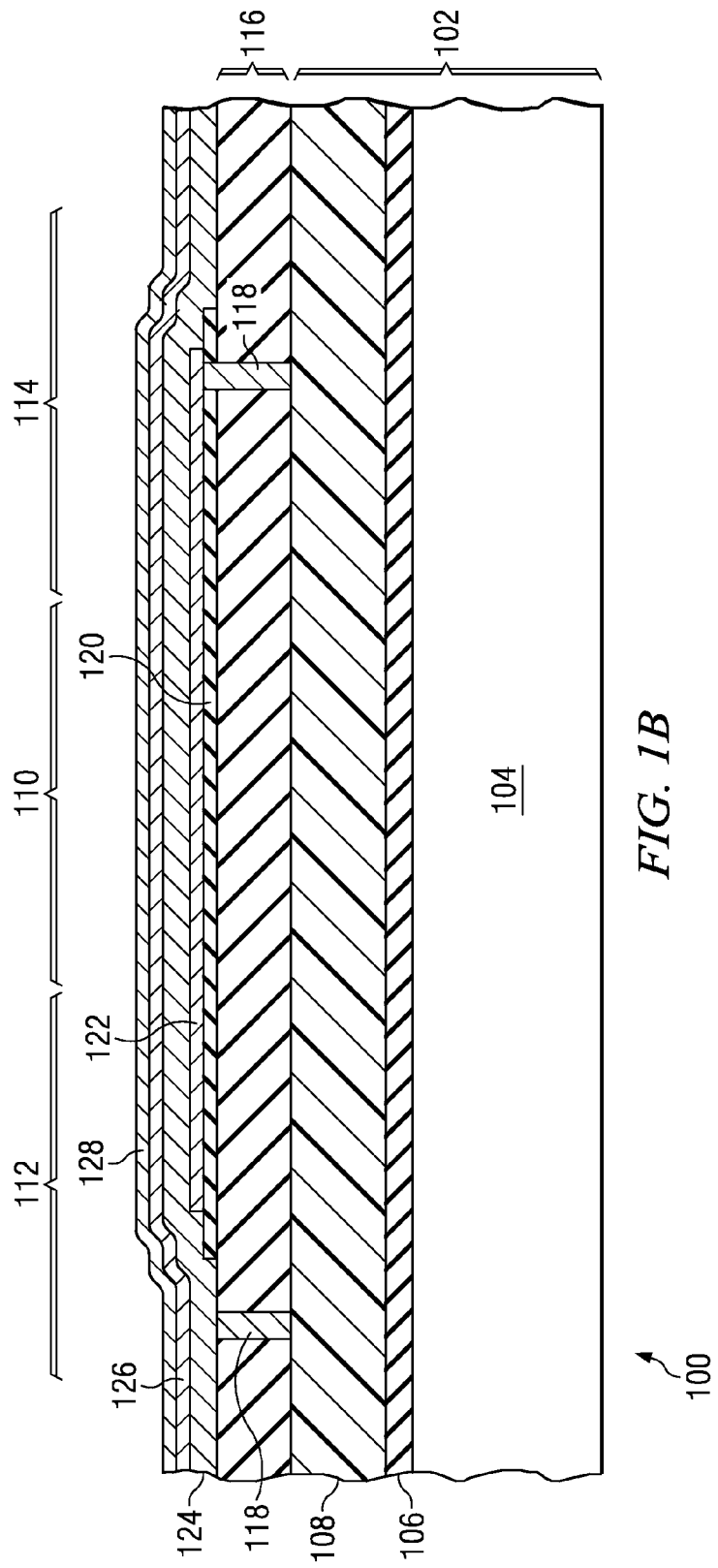

Referring to FIG. 1B, a ferroelectric material layer 124 with a perovskite structure is formed on the first electrode 122. The ferroelectric layer 124 may be 300 nanometers to 1.5 microns thick. In one version, the ferroelectric layer 124 may be a layer of a ceramic perovskite material of lead zirconate titanate ($Pb[Zr_xTi_{1-x}]O_3$ with $0 \leq x \leq 1$), commonly called PZT, with a zirconium-to-titanium ratio between 51/49 and 52/47. In another version, the ferroelectric layer 124 may be a lanthanum-doped lead zirconate titanate (PLZT) with a lead-to-lanthanum ratio between 94/6 and 92/8, and a zirconium-to-titanium ratio between 51/49 and 52/47.

In one version of the instant embodiment, the ferroelectric layer 124 may be formed in a wet-chemical process such as by applying a plurality of layers of sol-gel containing piezoelectric material, drying each layer before applying the subsequent layer, and then annealing the sol gel multi-layer stack. Forming ferroelectric layer 124 using a sol-gel process may advantageously produce a ferroelectric layer 124 with a desired uniformity of stoichiometry.

In another approach, the ferroelectric layer 124 may be formed by an metal organic chemical vapor deposition (MOCVD) process. Forming the ferroelectric layer 124 using an MOCVD process may advantageously allow adjustments to the stoichiometry of the ferroelectric layer 124 with less impact on fabrication costs of the MEMS device 100 compared to other processes for forming the ferroelectric layer 124.

A second electrode layer 126 is formed on the ferroelectric layer 124. The second electrode layer 126 may include, for example, a layer of iridium oxide 20 to 50 nanometers thick on the ferroelectric layer 124, and a layer of iridium 10 to 30 nanometers thick on the iridium oxide layer. An optional layer of titanium aluminum nitride 128 of 100 to 200 nanometers thick may be formed on the iridium layer, to provide a conductive hard mask for subsequent patterning of the ferroelectric layer 124 and the second electrode layer 126.

Figure 1C:
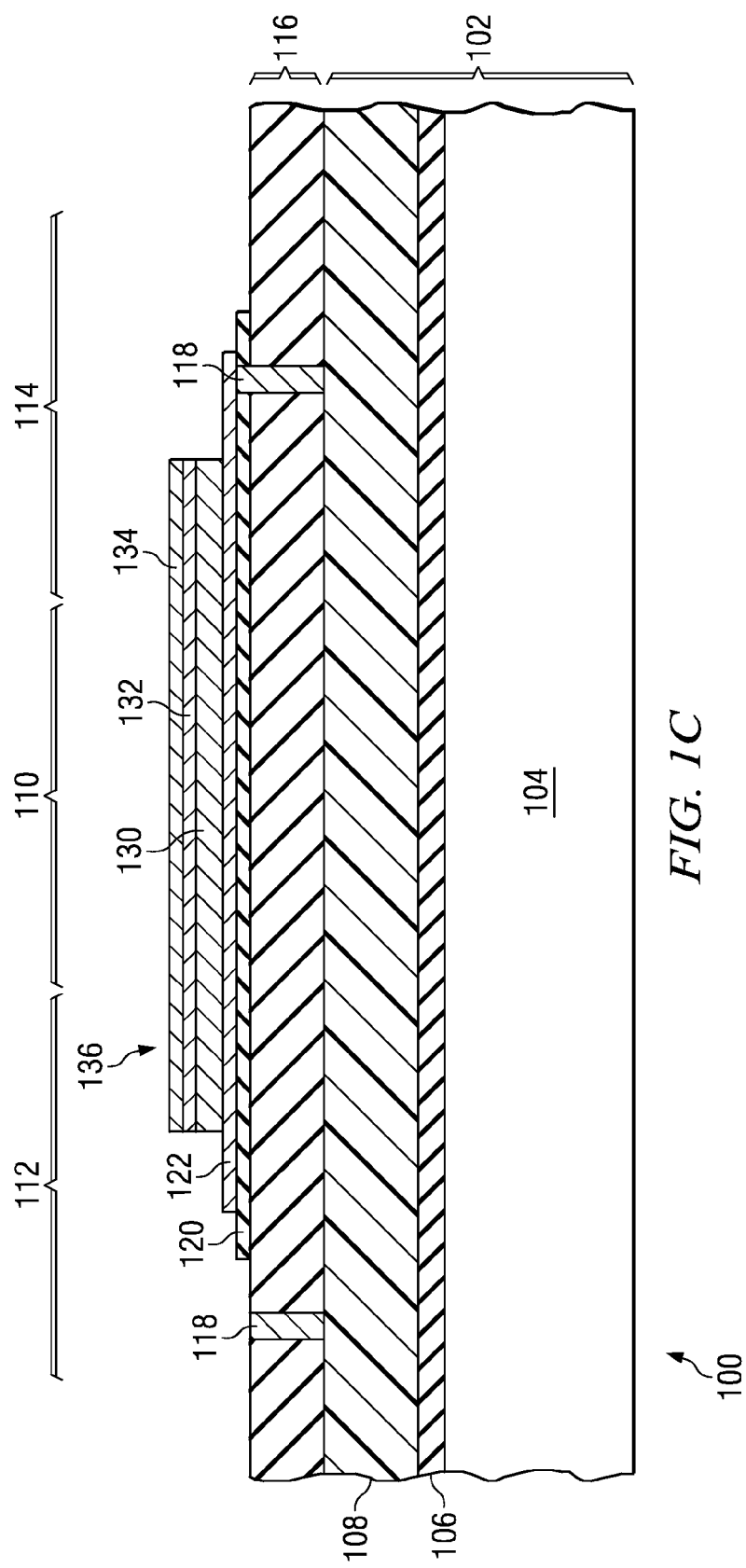

The ferroelectric layer 124, the second electrode layer 126 and the titanium aluminum nitride layer 128 (FIG. 1B) are patterned to form a ferroelectric element 130, a second electrode 132 and a titanium aluminum nitride cap 134, respectively, as shown in FIG. 1C. The patterning may, for example, be done by patterning a photoresist etch mask over the titanium aluminum nitride layer 128, and then performing a reactive-ion etching (RIE) process to remove unwanted material from the titanium aluminum nitride layer 128 and so form the nitride cap 134. Subsequent RIE processes may then be done to remove material from the second electrode layer 126 and from the ferroelectric layer 124 using the nitride cap 134 as an etch mask. A combination of the second electrode 132, the ferroelectric element 130 and the first electrode 122 forms a piezoelectric element 136.

In the instant embodiment, a lateral periphery of the ferroelectric element 130 is relatively uniform and recessed to provide an upper surface margin relative to a lateral periphery of the underlying first electrode 122. In another version, the first electrode 122 may be patterned subsequent to patterning the ferroelectric element 130, using the ferroelectric element 130 as an etch mask, so that the first electrode 122 and the ferroelectric element 130 have substantially coincident boundaries.

Figure 1D:
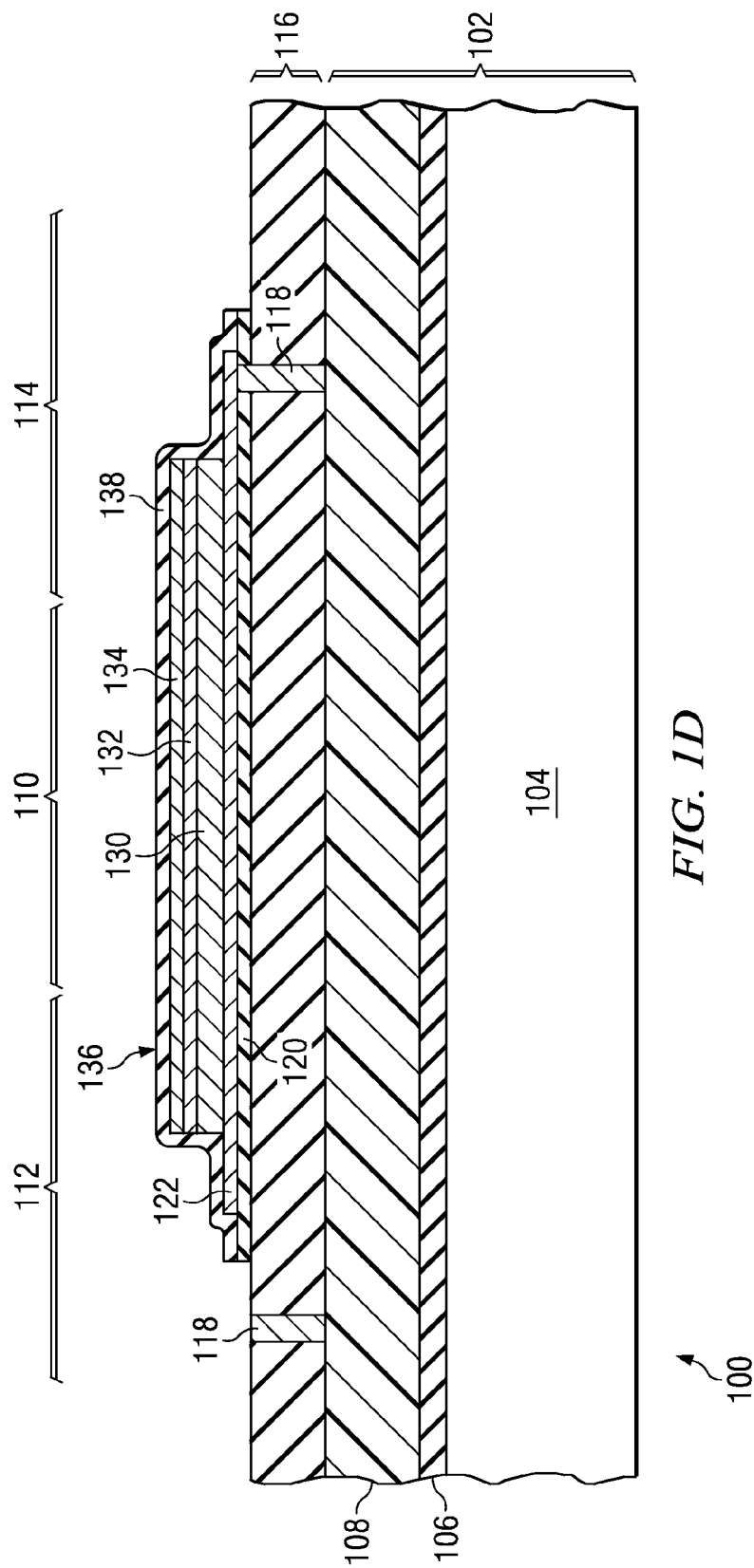

An upper hydrogen barrier layer 138 is then conformally deposited over the patterned nitride cap 134, second electrode 132, ferroelectric element 130 and first electrode 122 (including the upper surface margin between the lateral peripheries of the element 130 and the electrode 122). If the lower hydrogen barrier 120 is present, the barrier layer 138 is also deposited over the barrier 120 (including the upper surface margin between lateral peripheries of the electrode 132 and the barrier 120), so that the second electrode 132, the ferroelectric element 130 and the first electrode 122 may be encapsulated by a combination of the upper hydrogen barrier 138 and the lower hydrogen barrier 120. The upper hydrogen barrier 138 may include aluminum oxide and be, for example, 10 to 50 nanometers thick. Other dielectric materials with low hydrogen permeability may be included in the upper hydrogen barrier 138. The upper hydrogen barrier 138 may be patterned as depicted in FIG. 1D, or may extend laterally across the entire MEMS device 100.

Figure 1E:
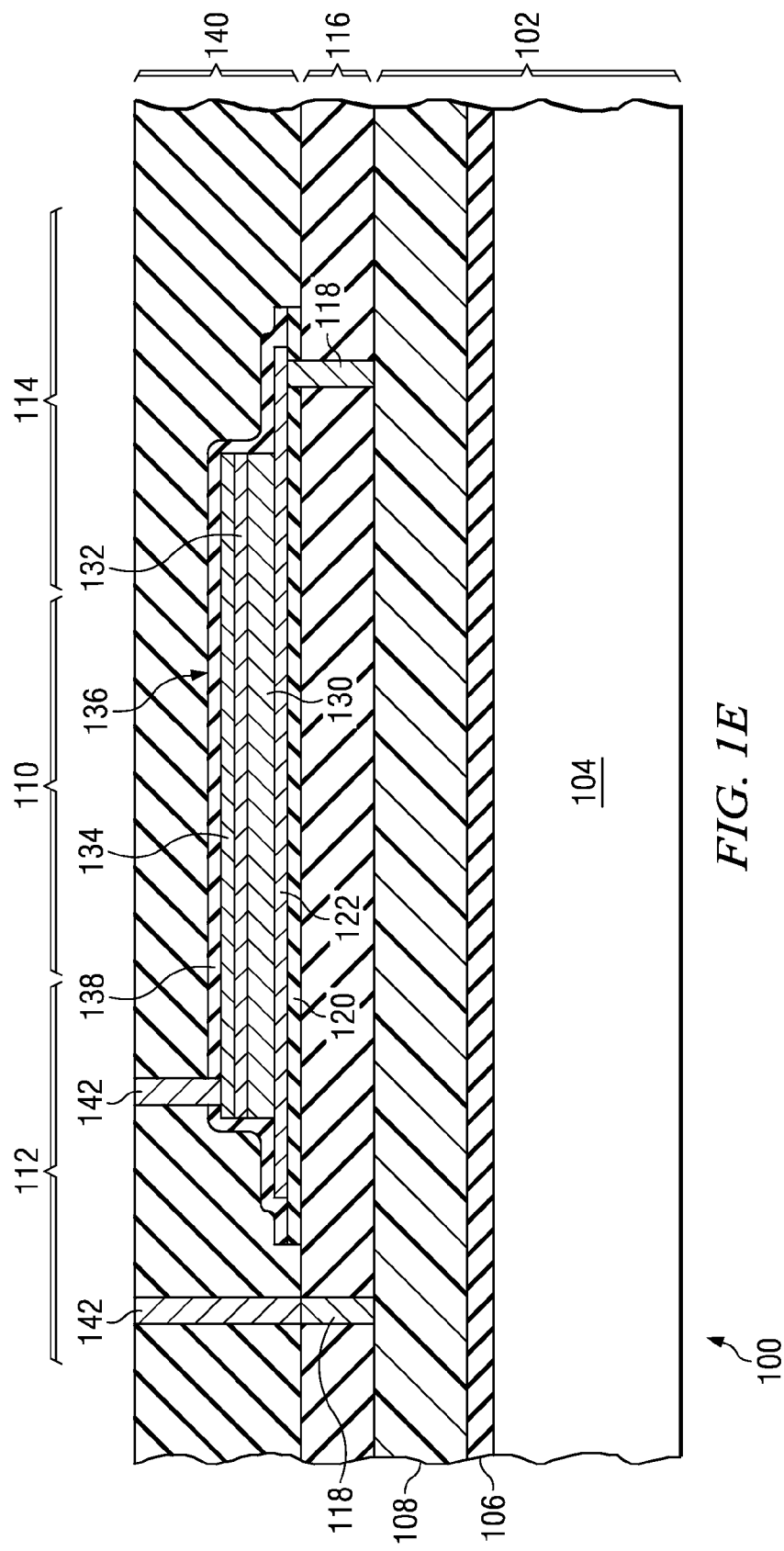

Referring to FIG. 1E, a first interlevel dielectric layer (IDL) 140 is formed over the piezoelectric element 136, over the upper hydrogen barrier layer 138 and over the dielectric isolation layer 116. The first interlevel dielectric layer 140 may include one or more layers of silicon dioxide, silicon nitride, silicon oxynitride, silicon carbon oxide, silicon carbon nitride, silicon carbon oxynitride, or other dielectric material. The layer 140 may be, for example, 300 nanometers to 3 microns thick. Vias 142 (for example, metal filled via openings) are formed in the interlevel dielectric layer 140 and upper hydrogen barrier 138 to establish electrical contact with the second electrode 132 and with contacts 118 outside the piezoelectric element 136 if present.

Figure 1F:
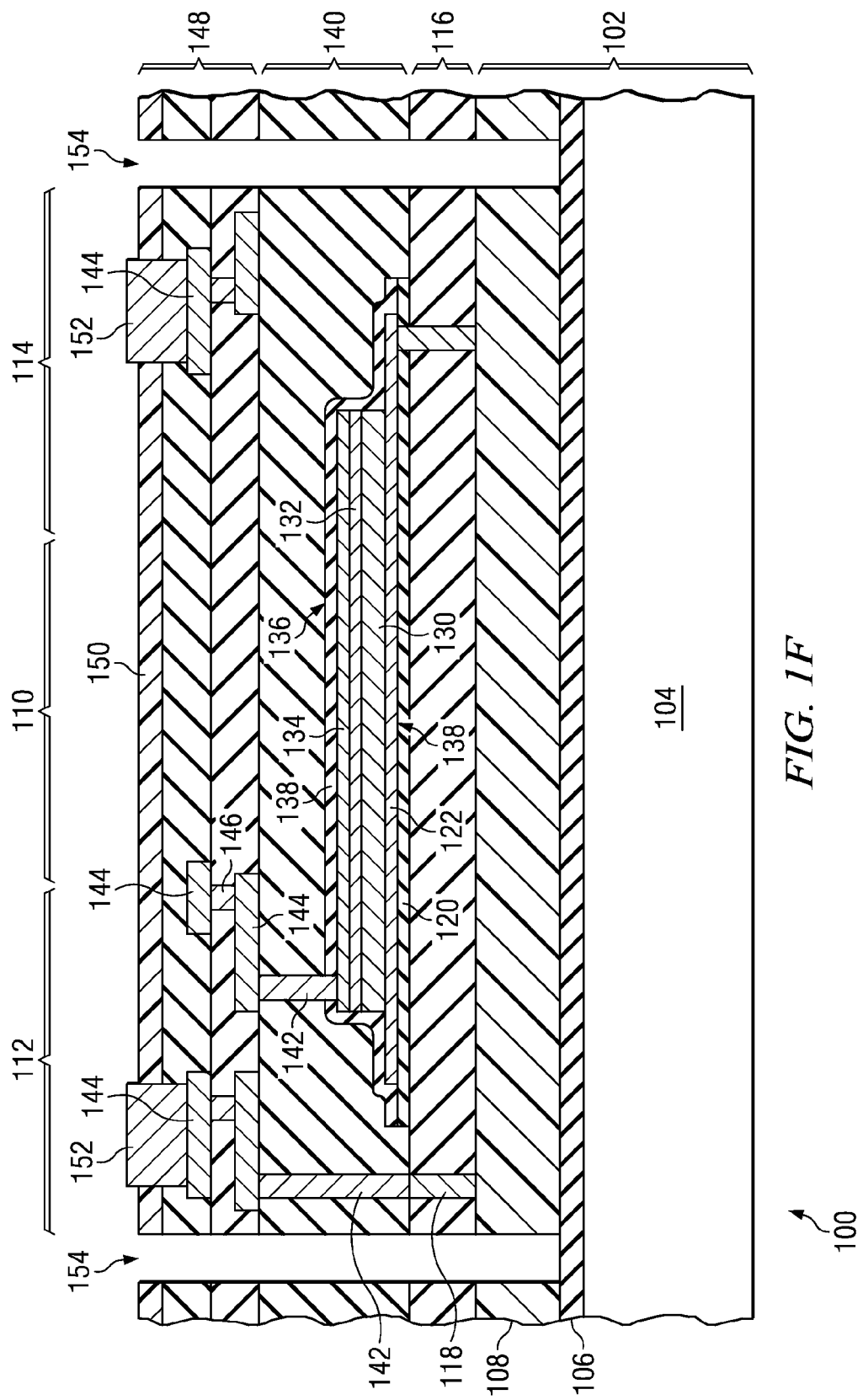

Referring to FIG. 1F, one or more layers of metal interconnects 144, optionally including vias 146, and second interlevel dielectric layers (collectively 148) may be formed over the first interlevel dielectric layer 140. The second interlevel dielectric layers 148 may include one or more top layers 150 of protective overcoat dielectric material, such as silicon nitride, silicon oxynitride and/or polyimide. Input/output (I/O) pads 152 may be formed on instances of the metal interconnects 144 and extend through one or more of the second interlevel dielectric layers 148. The I/O pads 152 may be, for example, bond pads or bump pads. Other configurations of the I/O pads 152 and top protective overcoat layers 150, for example I/O pads 152 which are partially overlapped by the top protective overcoat layers 150, are within the scope of the instant embodiment.

Front side singulation trenches 154 are formed through the second interlevel dielectric layers 148, the first interlevel dielectric layer 140 and the dielectric isolation layer 116, and into the SOI film 108 around a lateral periphery of the MEMS device 100. (The purpose of the singulation trenches is to assist in the later separation of multiple MEMS devices formed on a wafer or other common substrate into individual components.) The front (top) side singulation trenches 154 may be formed using an RIE process, in particular a DRIE process. In one version, the trenches 154 may be connected to completely laterally annularly surround the MEMS device 100. In another version, the trenches 154 may be separated by gaps of unetched material around the periphery of the MEMS device 100 so that material in the second interlevel dielectric layers 148, the first interlevel dielectric layer 140, the dielectric isolation layer 116 and the SOI film 108 is connected at the gap intervals to corresponding material laterally outside the MEMS device 100.

Figure 1G:
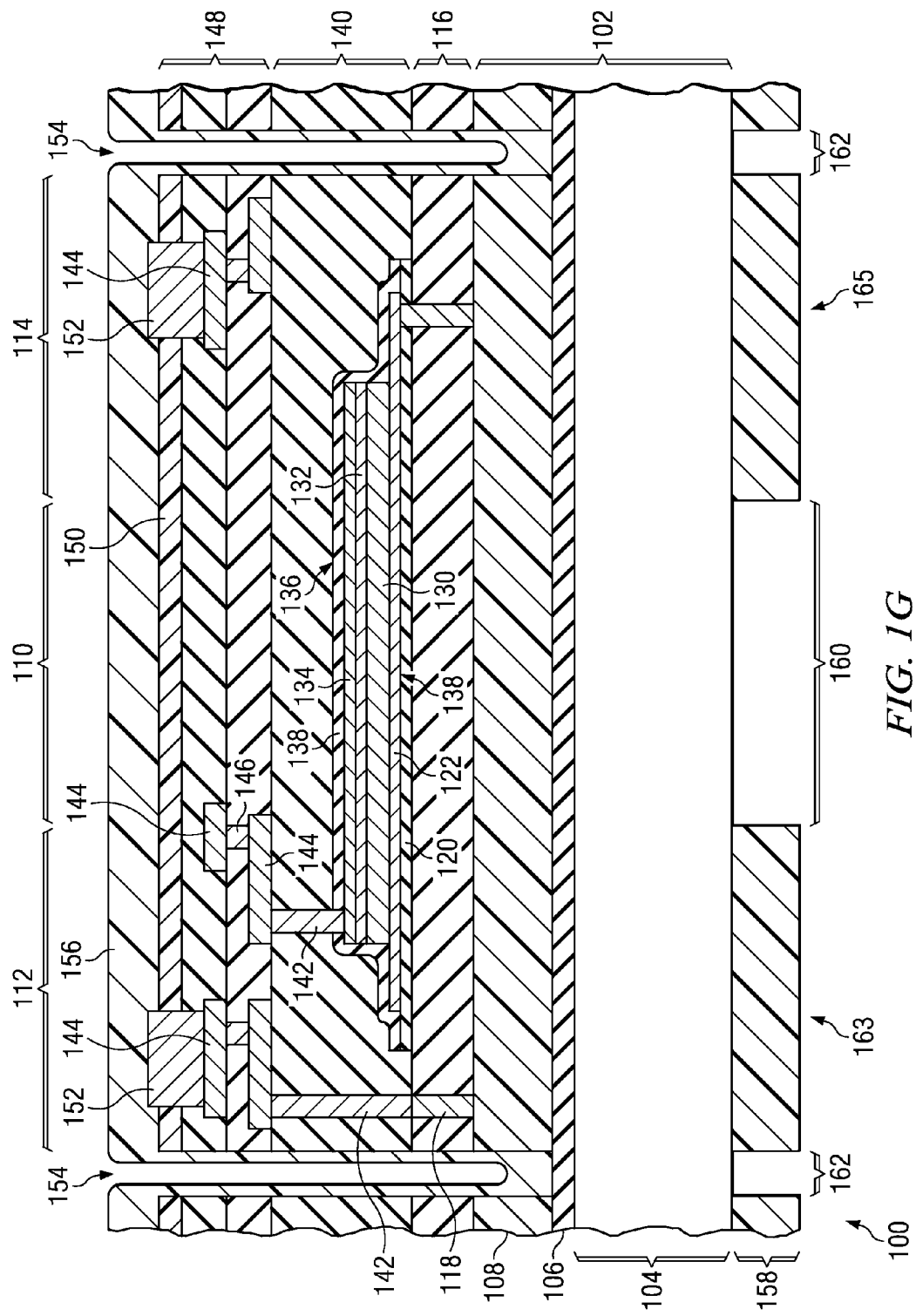

Referring to FIG. 1G, a front (top) side sacrificial overcoat 156 may then be formed on the top surface of a topmost layer 150 of the MEMS device 100, including extending into the singulation trenches 154. The overcoat 156 may, for example, include photoresist, phenolic resin, polyimide, or other organic polymer and be 500 nanometers to 5 microns thick, extending laterally between the trenches 154 over the flexible element area 110, the proof mass area 112 and the base area 114.

In one version of the instant embodiment, the support wafer 104 may optionally be thinned, for example, by back grinding, by plasma etching, or by wet chemical etching, before performing a back side DRIE process. The optional substrate thinning process, if performed, may be performed prior to, or subsequent to, formation of the front side sacrificial overcoat 156. A final thickness of the support wafer 104 after the substrate thinning process may be selected to provide a desired proof mass and/or base thickness. In one version, the support wafer 104 may have a final thickness of, for example, 15 to 20 microns. In another version, the support wafer 104 may have a final thickness of, for example, 100 to 200 microns.

A back side DRIE mask 158 is formed on a bottom surface of the semiconductor substrate 102 to expose a flexible element etch area 160 under the flexible element area 110 and to expose back (bottom) side singulation trench areas 162. The mask 158 includes a proof mass segment 163, adjacent to the flexible element etch area 160, which masks a portion of the substrate 102 in the proof mass area 112. The mask 158 may also include an optional base segment 165, adjacent to the flexible element etch area 160, which masks a portion of the substrate 102 in the base area 114. The back side singulation trench areas 162 are disposed in vertical alignment under the front side singulation trenches 154. The mask 158 may be formed, for example, by spin coating the back (bottom) surface of the wafer 102 with a layer of photoresist and patterning the photoresist using photolithographic methods. The mask 158 may also be formed by screen printing a suitable mask material, such as phenolic resin or polyisoprene, onto the bottom surface of the wafer 102. The back side mask 158 may also be formed by directly dispensing mask material onto the bottom of the wafer 102 using an inkjet dispensing system. In a version of the instant embodiment in which the support wafer 104 is thinned so as to have a final thickness of 15 to 20 microns, the mask 158 may be, for example, 500 nanometers to 1 micron thick. In a version in which the support wafer 104 is thinned so as to have a final thickness of 100 to 200 microns, the mask 158 may be, for example, 3 to d 8 microns thick. In a version in which the support wafer 104 has a final thickness of 500 to 600 microns, the mask 158 may be, for example, 15 to 25 microns thick.

Figure 1H:
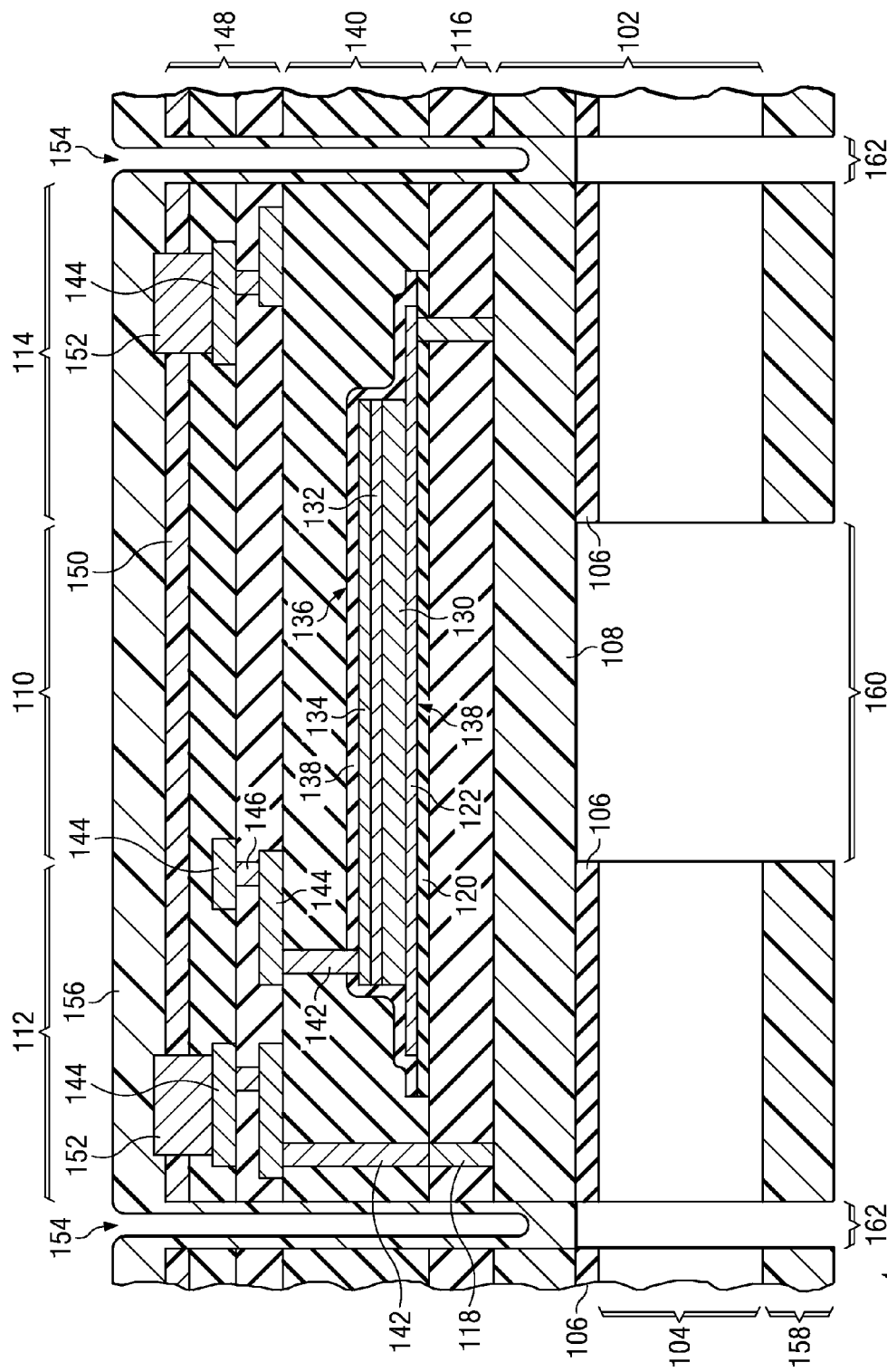

Referring to FIG. 1H, a back side DRIE process is performed on the device 100 which removes material from the support wafer 104 in the flexible element etch area 160 and the back side singulation trench areas 162. The DRIE process may use a so-called "Bosch process," in which a fluoropolymer is used to passivate the etching of the sidewalls. The Bosch process involves alternating between a silicon etch step (using, e.g., $SF_6$) and a fluoropolymer deposition (using, e.g., $C_4F_8$). During the deposition step the fluoropolymer is deposited on all of the sample surfaces. During the etch step, ion assisted etching is used to remove the fluoropolymer from the bottom of the etch feature so as to expose the silicon at the bottom to the etch chemistry while retaining the fluoropolymer on the sidewalls. The Bosch process can achieve aspect ratios of 10-20. Remaining material in the buried oxide layer 106 in the flexible element etch area 160 and the back side singulation trench areas 162 may be removed, as depicted in FIG. 1H.

In one implementation, the back side singulation trench areas 162 may join to completely surround the lateral periphery at the bottom of MEMS device 100. In another implementation, the etched trench areas 162 may be separated by gaps of unetched material left at intervals around the periphery of device 100 so that material in the wafer 102 is connected at the gaps to corresponding material outside device 100.

Figure 1I:
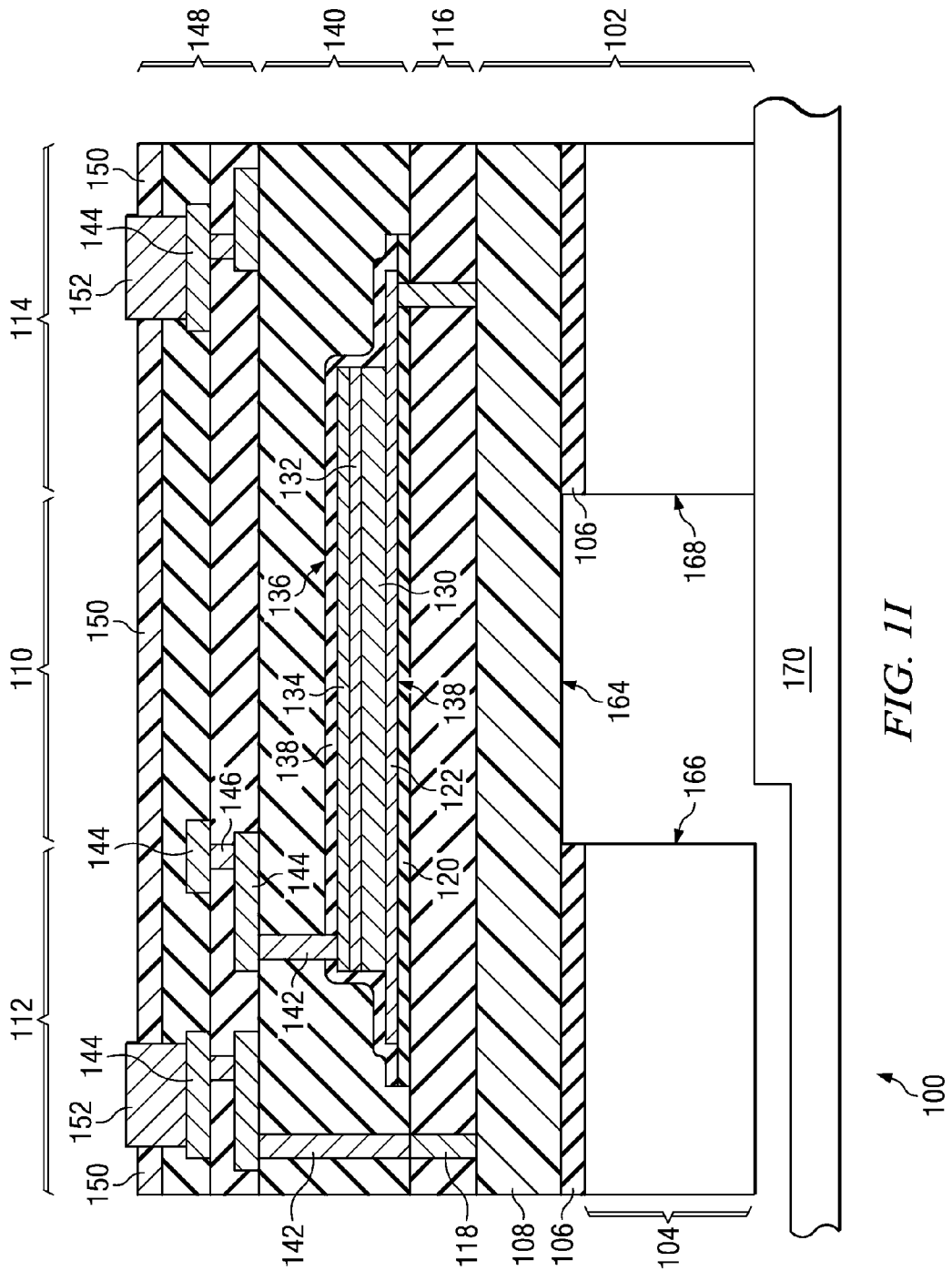

Referring to FIG. 1I, the completed MEMS device 100 has a flexible element 164 which includes a portion of the SOI film 108 in the flexible element area 110. At least a portion of the piezoelectric element 136 overlaps the flexible element 164. The MEMS device 100 also has a proof mass 166 which includes a portion of the support wafer 104 in the proof mass area 112. The device 100 further includes a base 168 which includes a portion of the support wafer 104 in the base area 114. The device 100 is detached from the wafer 102 in FIG. 1H at the aligned front (top) side singulation trenches 154 and back (bottom) side singulation trenches 162. The front (top) side sacrificial overcoat layer 156 may be removed before, during or after detachment of the device 100 from the rest of wafer 102. The layer 156 may, for example, be removed by dissolving in a solvent, or by exposure to oxygen radicals and/or ions, such as in a plasma etcher or downstream asher. The MEMS device 100 is mounted on a carrier, such as the illustrated stepped upper surface carrier 170, which fixedly contacts the base 168 but provides clearance (such as with the illustrated recesses) under the proof mass 166 and flexible element 164.

In operation of the MEMS device 100, the proof mass 166 is oscillated in opposite displacement directions relative to the base 168, causing the flexible element 164, and a portion of the piezoelectric element 136 over the flexible element 164, to be repeatedly flexed and unflexed. Flexure of the portion of the piezoelectric element 136 causes an electric potential difference to be generated between the first electrode 122 and the second electrode 132 and can provide electric current to an electrical load, such as an electrical circuit or an electrical power storage device like a battery or capacitor. Lateral dimensions and thicknesses of the proof mass 166 and the flexible element 164 may be adjusted to increase electrical power generation from the piezoelectric element 136 for a provided oscillation frequency spectrum.

FIGS. 2A-2G depict successive stages in another example method of fabricating an illustrative integrated planar MEMS device with a piezoelectric element which operates in the $d_{31}$ mode.

Figure 2A:
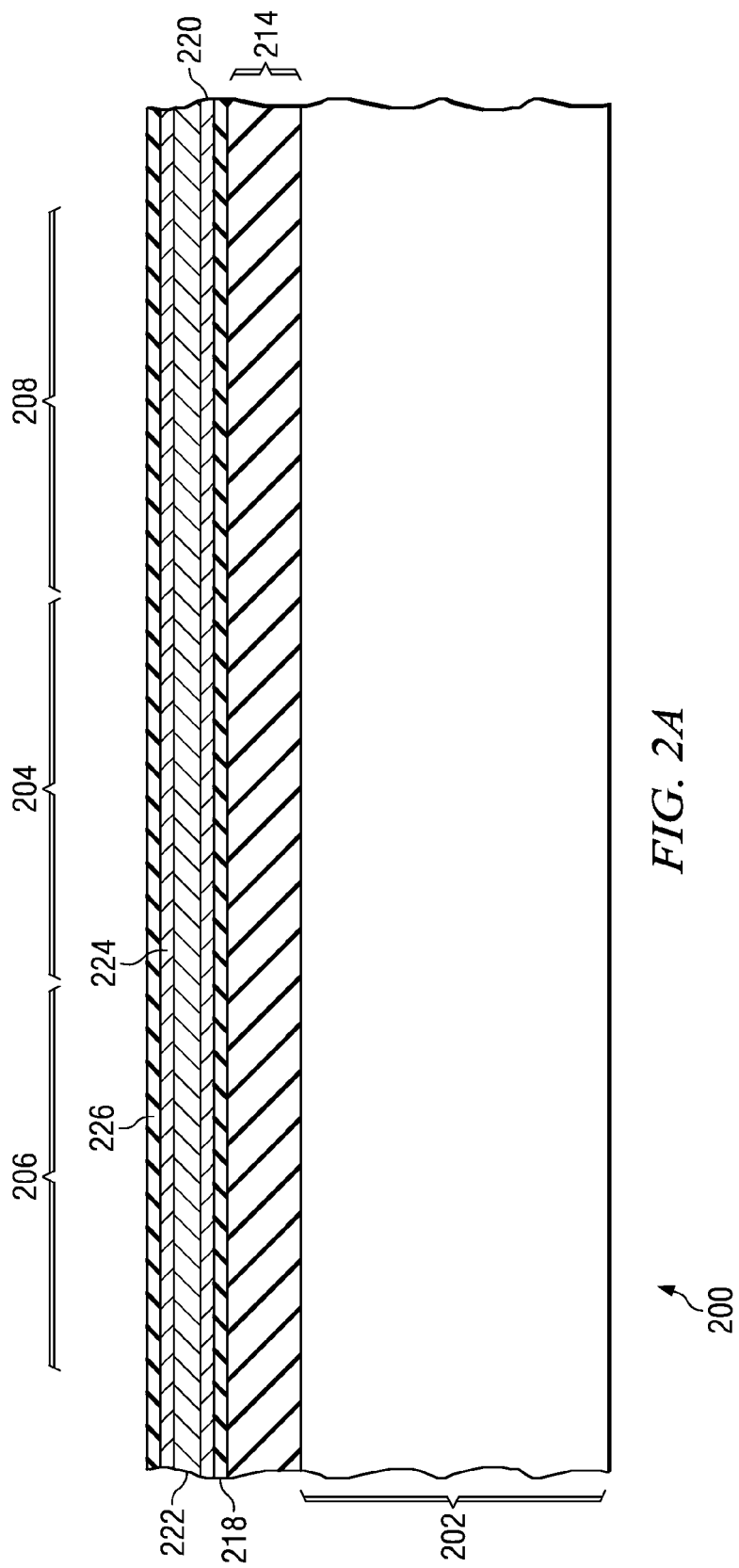
FIGS. 2A-2G are cross-sectional views illustrating steps in a variation of the method of fabrication of FIGS. 1A-1I.

FIG. 2A shows the MEMS device 200 having a monolithic single crystal silicon wafer substrate 202, for example, 500 to 750 microns thick, with an area 204 defined for a flexible element, a laterally adjacent area 206 defined for a proof mass 206, and an opposite laterally adjacent area for an optional base 208. A dielectric isolation layer 214, which may be similar to layer 116 in FIG. 1A, is formed over the semiconductor substrate 202, covering circuit components of device 200, if any, formed on the substrate 202. Contacts 118 described previously for layer 116 (see FIG. 1A) may be formed in the layer 214 for making electrical connection to the components.

A lower hydrogen barrier layer 218, which may be similar to barrier layer 120 of FIG. 1A, may be formed on a top surface of dielectric layer 214. A first electrode layer 220, which may be similar to layer 122 in FIG. 1A, is formed on the barrier layer 218 if present or on the dielectric layer 214 if not present. A ferroelectric material layer 222 with a perovskite structure, which may be similar to layer 124 in FIG. 1B, is formed on electrode layer 220. A second electrode layer 224, which may be similar to layer 126 in FIG. 1B, is formed on the ferroelectric layer 222. A conductive hard mask layer 226, which may be similar to layer 128 in FIG. 1B, is formed on the second electrode layer 224.

Figure 2B:
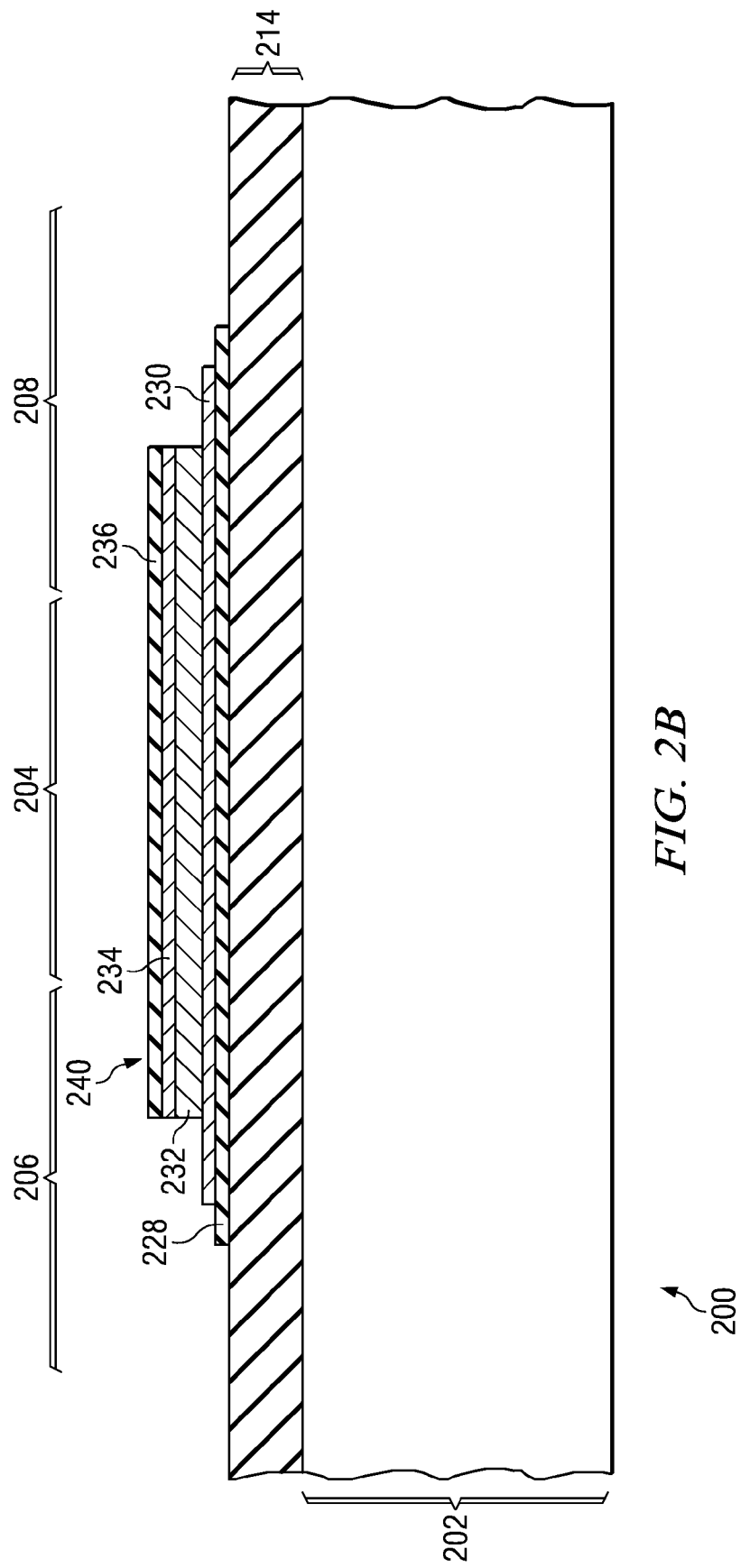

Referring to FIG. 2B, the ferroelectric layer 222, the second electrode layer 224 and the conductive hard mask layer 226 (FIG. 2A) are generally uniformly patterned to form a laterally extending planar structure including a ferroelectric element 232, a second electrode 234 and a conductive hard mask 236, respectively, similar to the corresponding structure previously described in reference to FIG. 1C. The first electrode layer 220 (FIG. 2A) is patterned to form a first electrode 230, for example by forming a photoresist etch mask over the first electrode layer 220 and conductive hard mask 236, and subsequently removing unwanted material from the first electrode layer 220 using an RIE process. A combination of the conductive hard mask 236, the second electrode 234, the ferroelectric element 232 and the first electrode 230 forms a piezoelectric element 240, which may be similar to element 136 in FIG. 1C. The lower hydrogen barrier layer 218 (FIG. 2A), if present, may subsequently be patterned to form a patterned lower hydrogen barrier 228, in a similar manner. As before, a periphery of the first electrode 230 may be marginally laterally indented from a periphery of the upper surface of lower hydrogen barrier, and a periphery of the ferroelectric element 232 (viz., piezoelectric element 240) may be marginally laterally indented from a periphery of the upper surface of the first electrode 230.

Figure 2C:
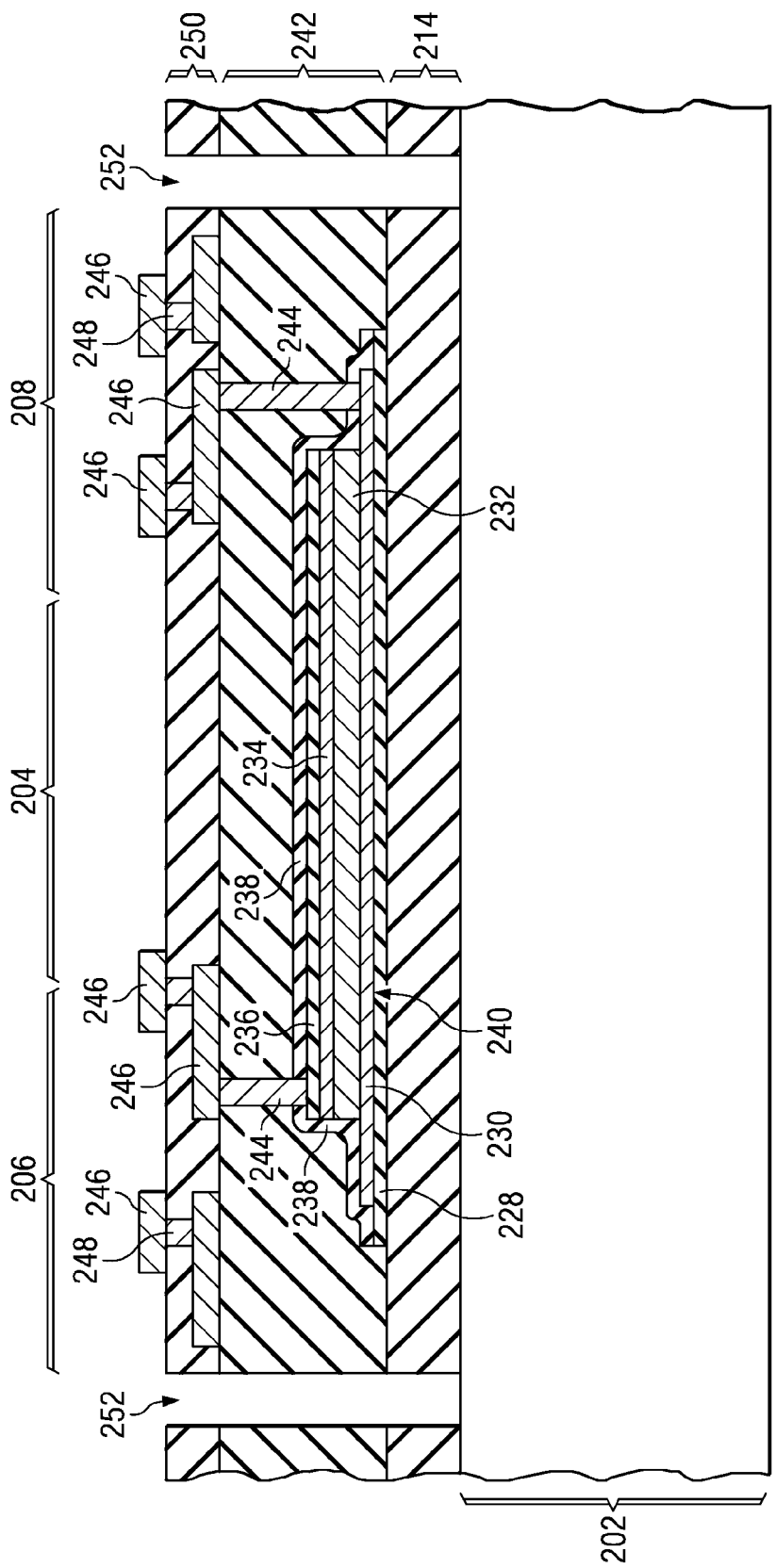

Referring to FIG. 2C, an upper hydrogen barrier layer 238, which may be similar to barrier layer 138 in FIG. 1D, is formed and patterned on the conductive hard mask 236, the second electrode 234, the ferroelectric element 232 and the first electrode 230. If the lower hydrogen barrier 228 is present, the barrier layer 238 is also deposited over the barrier 228, so that the conductive hard mask 236, the second electrode 234, the ferroelectric element 232 and the first electrode 230 may be encapsulated by a combination of the upper hydrogen barrier 238 and the lower hydrogen barrier 228, as depicted in FIG. 2C (similar to the encapsulation previously described for FIG. 1D).

A first interlevel dielectric layer (IDL) 242, which may be similar to layer 140 in FIG. 1E, is formed over the piezoelectric element 240 and over parts of dielectric isolation layer 214 not covered by element 240 as shown in FIG. 2C. Vias 244 are formed in the first interlevel dielectric layer 242 and the upper hydrogen barrier 238 to make electrical contact with the conductive hard mask 236, the first electrode 230 and contacts in the dielectric isolation layer 214 if present. One or more layers of metal interconnects 246, possibly including vias 248, and a second interlevel dielectric layer 250 may be formed on the first interlevel dielectric layer 242. The metal interconnects 246 and vias 248 may combine with contacts and vias connecting to pluralities of transistor elements (gates, sources/drains) or other circuit component elements formed in or on the substrate 202 to form circuits in the MEMS device 200. Other configurations of the MEMS device 200, for example configurations including I/O pads and top protective overcoat layers, are within the scope of the instant embodiment.

Front (top) side singulation trenches 252 are formed through the second interlevel dielectric layer 250, the first interlevel dielectric layer 242 and the dielectric isolation layer 214, and possibly into the semiconductor substrate 202 at peripheral locations surrounding the device 200. The trenches 252 may be completely surround the device 200 with unbroken etched openings or may be interrupted at intervals with gaps of unetched areas around the periphery, such as described in reference to FIG. 1F.

Figure 2D:
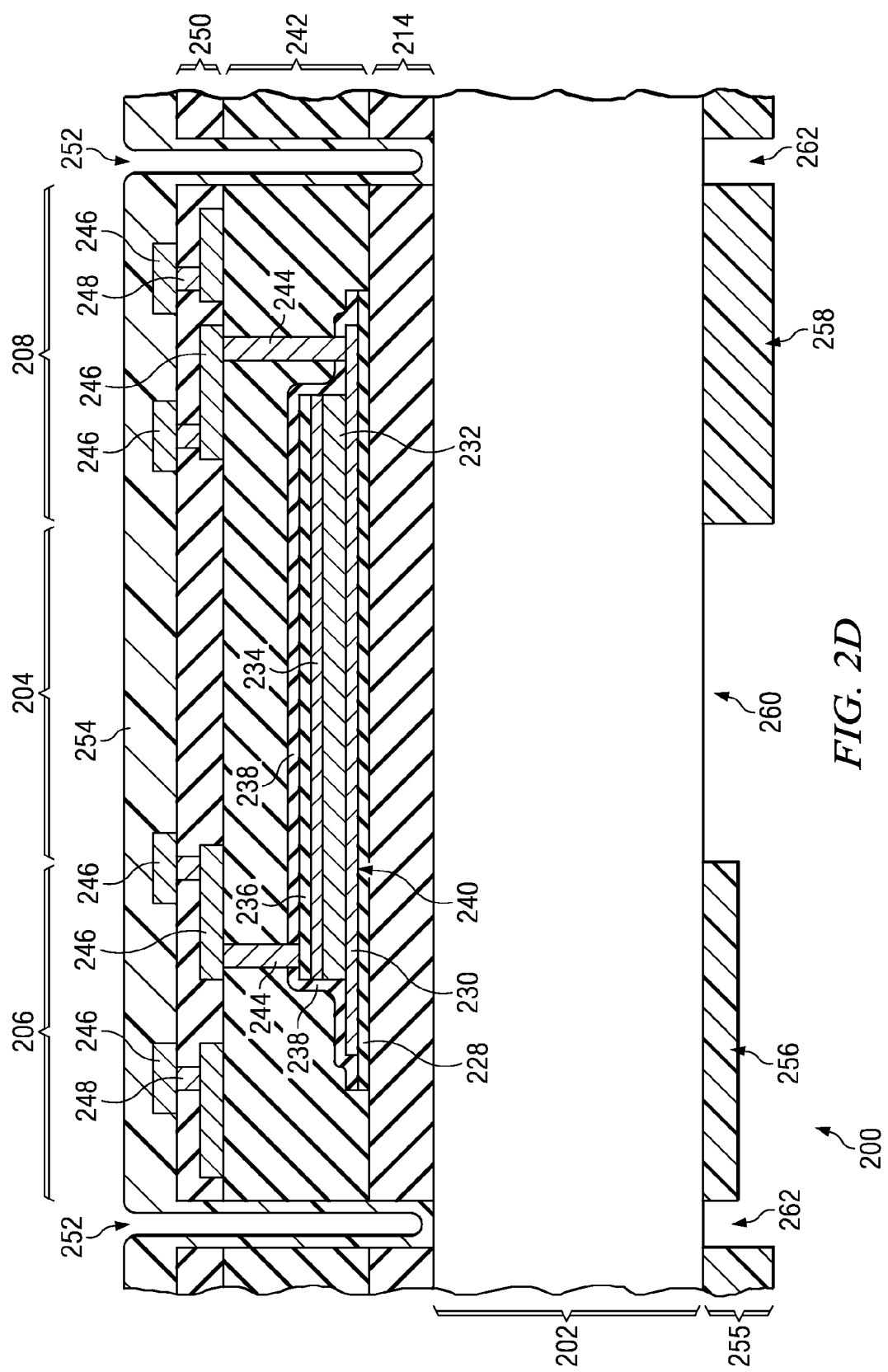

Referring to FIG. 2D, a front (top) side sacrificial overcoat layer 254 is formed over the top of device 200, extending into the front side singulation trenches 252, similar to overcoat layer 156 previously described in reference to FIG. 1G. A DRIE mask 255 may then be formed on a bottom surface of the semiconductor substrate 202, such as by any of the processes described for the DRIE mask 158 of FIG. 1G. The DRIE mask 255 includes a thin proof mass segment 256 which masks a portion of the substrate 202 in the proof mass area 206 and a thick base segment 258 which masks a portion of the semiconductor substrate 202 in the base area 208. The thicker base segment 258 provides more etch resistance to a subsequent back side DRIE etch than the thinner proof mass segment 256. The base segment 258 and the proof mass segment 256 may be formed of similar or dissimilar materials. A portion of the base segment 258 may be formed concurrently with the proof mass segment 256. A flexible element etch area 260 and back side singulation trench areas 262 are left uncovered on the bottom surface of the substrate 202 in the flexible element area 204. As with trench areas 162, the trench areas 262 are disposed in vertical alignment under the front side singulation trenches 252.

Figure 2E:
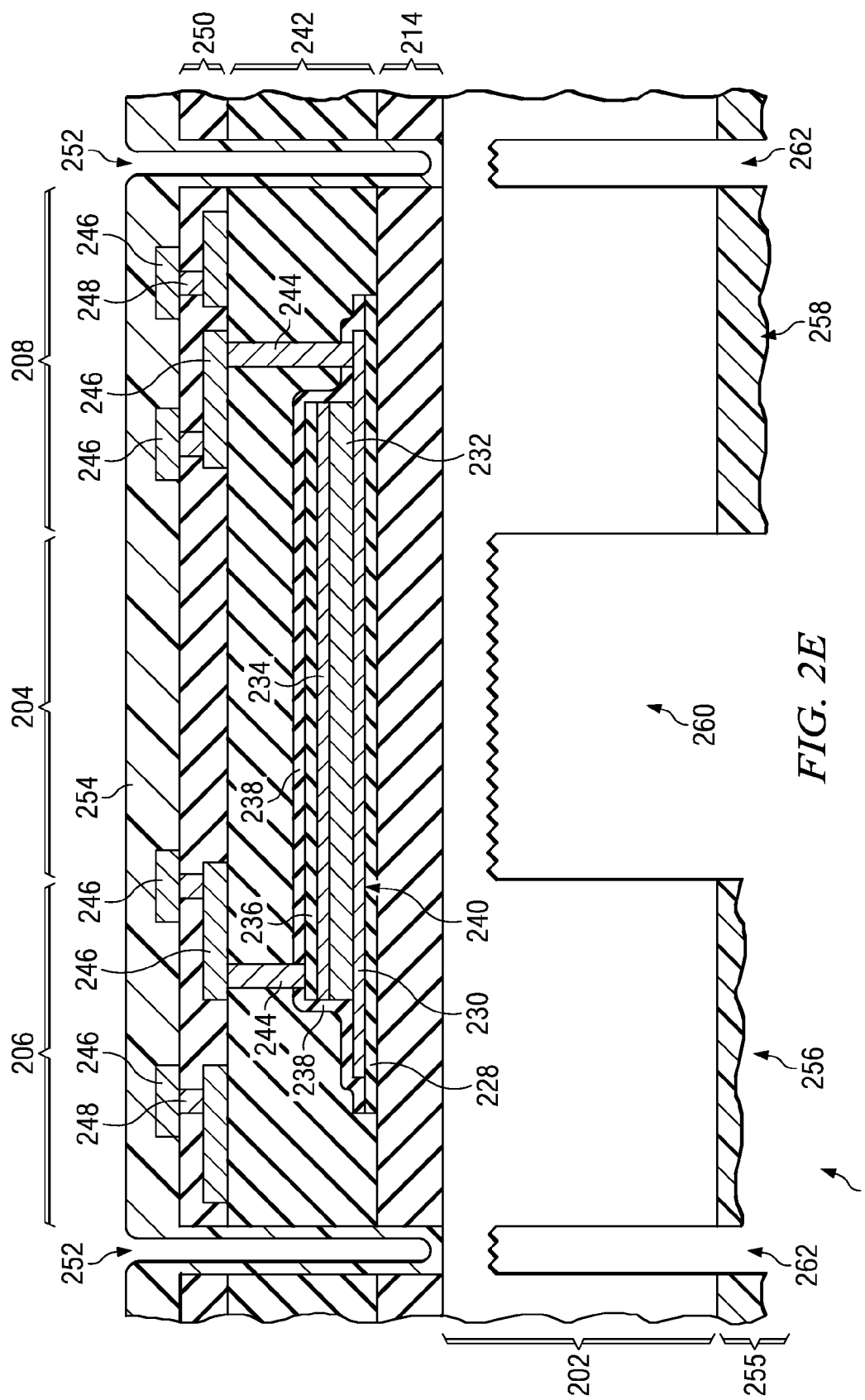

FIG. 2E depicts the device 200 during a back side DRIE process. The DRIE process, similar to that described in reference to FIG. 1F, removes material from the substrate 202 in the exposed flexible element etch area 260 and back side singulation trench areas 262. The proof mass segment 256 of mask 255 is eroded by the etch process, so that all of proof mask segment 256 but not all of base segment 258 is removed before the back etch process is completed.

Figure 2F:
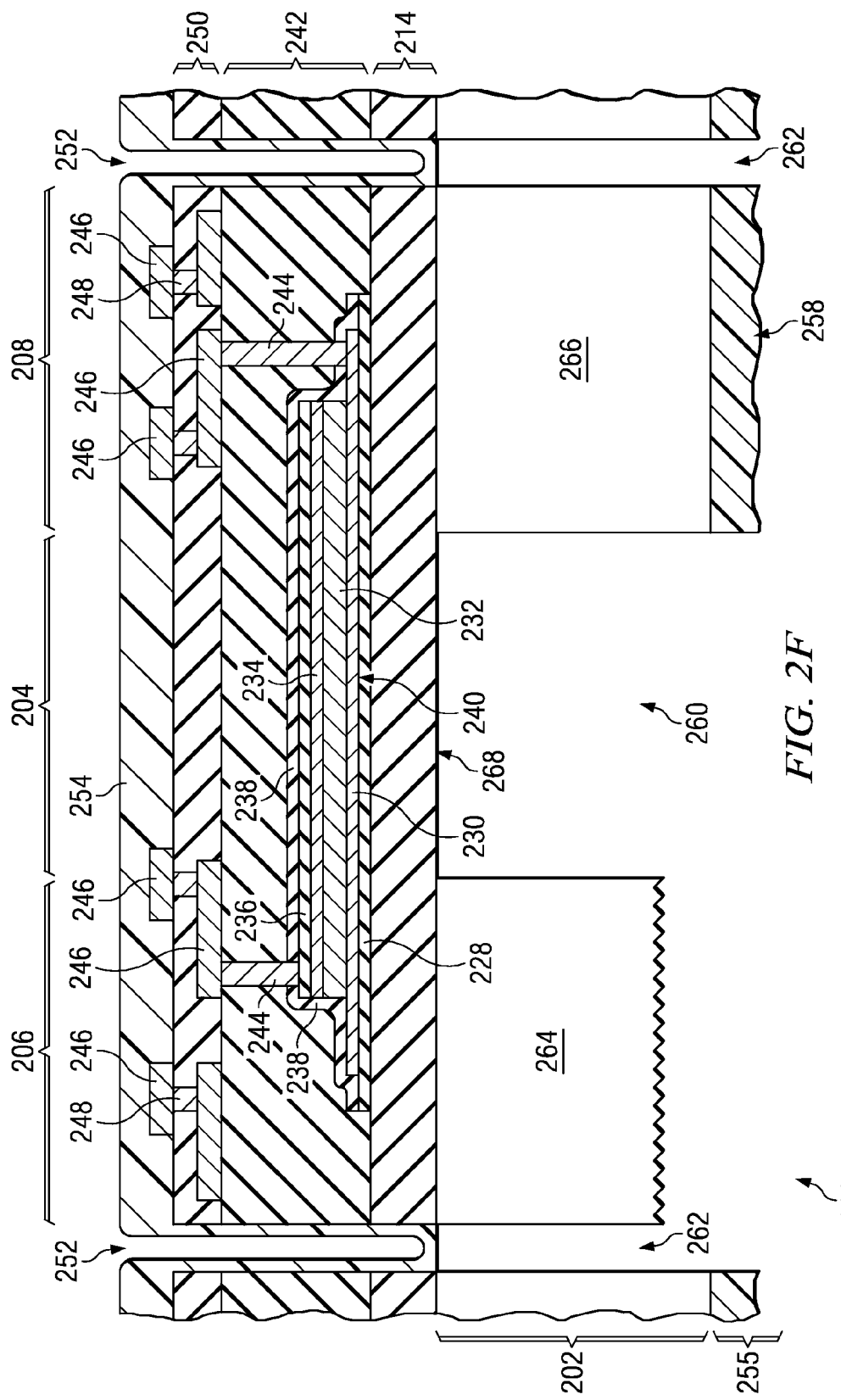

FIG. 2F depicts the device 200 after the back etch process is complete. Material from the substrate 202 in the flexible element etch area 260 is removed so that the dielectric isolation layer 214 is exposed at the flexible element 268. Similarly, material from the substrate 202 in the back side singulation trench areas 262 is removed so that the front side sacrificial overcoat 254 is exposed. The elimination through erosion of the proof mass segment of 256 of mask 255 midway through the back etch process, results in back etching of the substrate in the proof mass area 206 to a depth less than the depth of the etched area 260, to form a proof mass 264 in the proof mass area 206 similar to the proof mass 166 of FIG. 1I. A base 266 is formed by a portion of the substrate in the base area 208 remaining unetched because it remained covered by the thicker mask material of base segment 258. The bottom surface of the proof mass 264 etched by the back side etch is thus elevated relative to the unetched bottom surface of base 266. A flexible element 268 is defined by the etched area 260 that includes a portion of the dielectric isolation layer 214 in the flexible element area 204 bounded by the proof mass 264 on one side and the base 266 on the other. The device 200 is subsequently singulated and the front side sacrificial overcoat 254 removed, as described in reference to FIG. 1H.

Figure 2G:
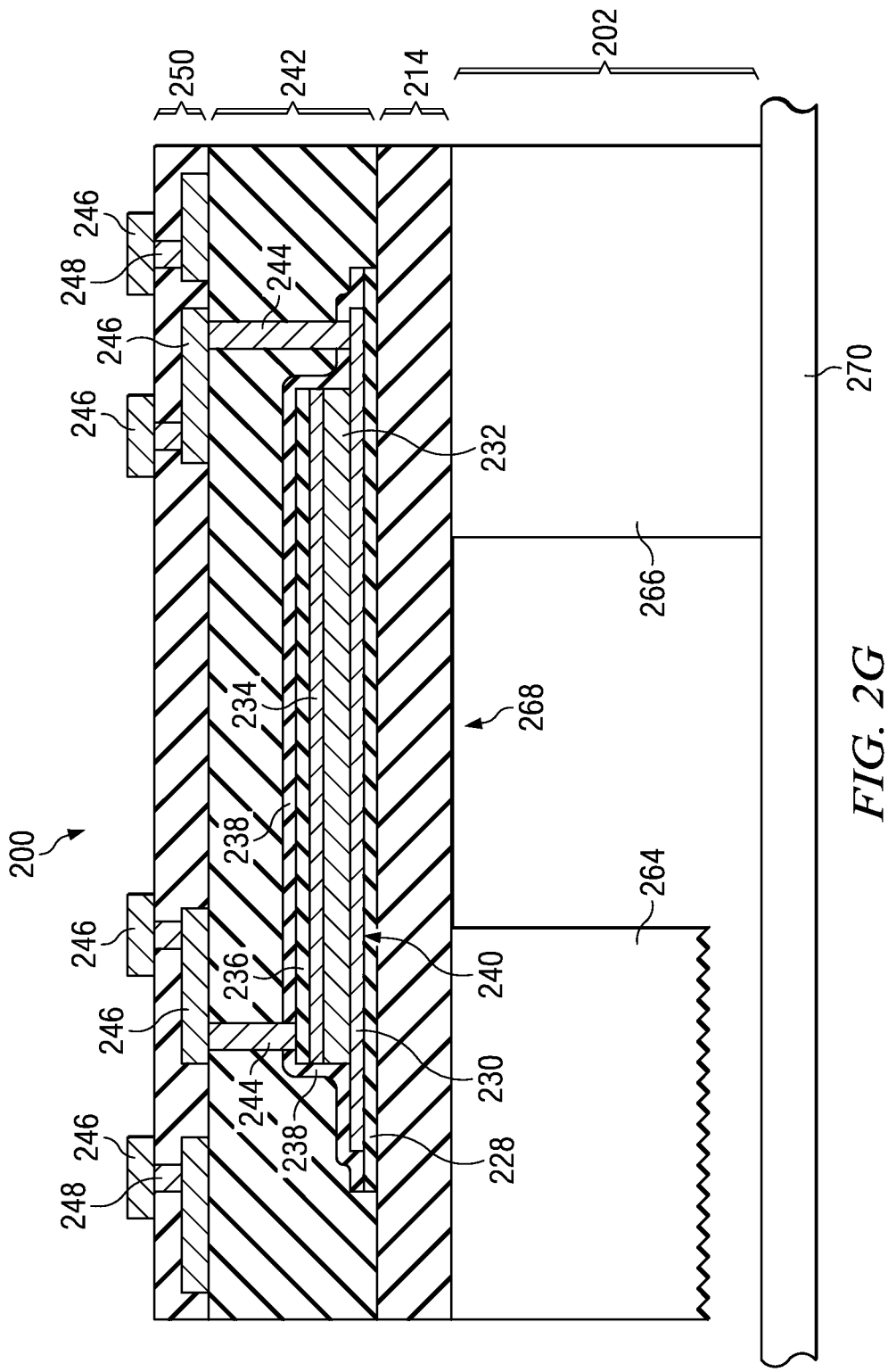

Referring to FIG. 2G, the completed device 200 may be mounted on a planar carrier 270 which contacts the base 266. Formation of the proof mass 264 with its bottom surface elevated above the bottom surface of the base 266 (i.e., forming proof mass 264 shorter than base 266) provides clearance under the proof mass 264 above the planar carrier 270.

FIGS. 3A-3E depict successive stages in an example method of fabricating an illustrative integrated planar MEMS device 300 with a piezoelectric element which operates in the $d_{33}$ mode.

Figure 3A:
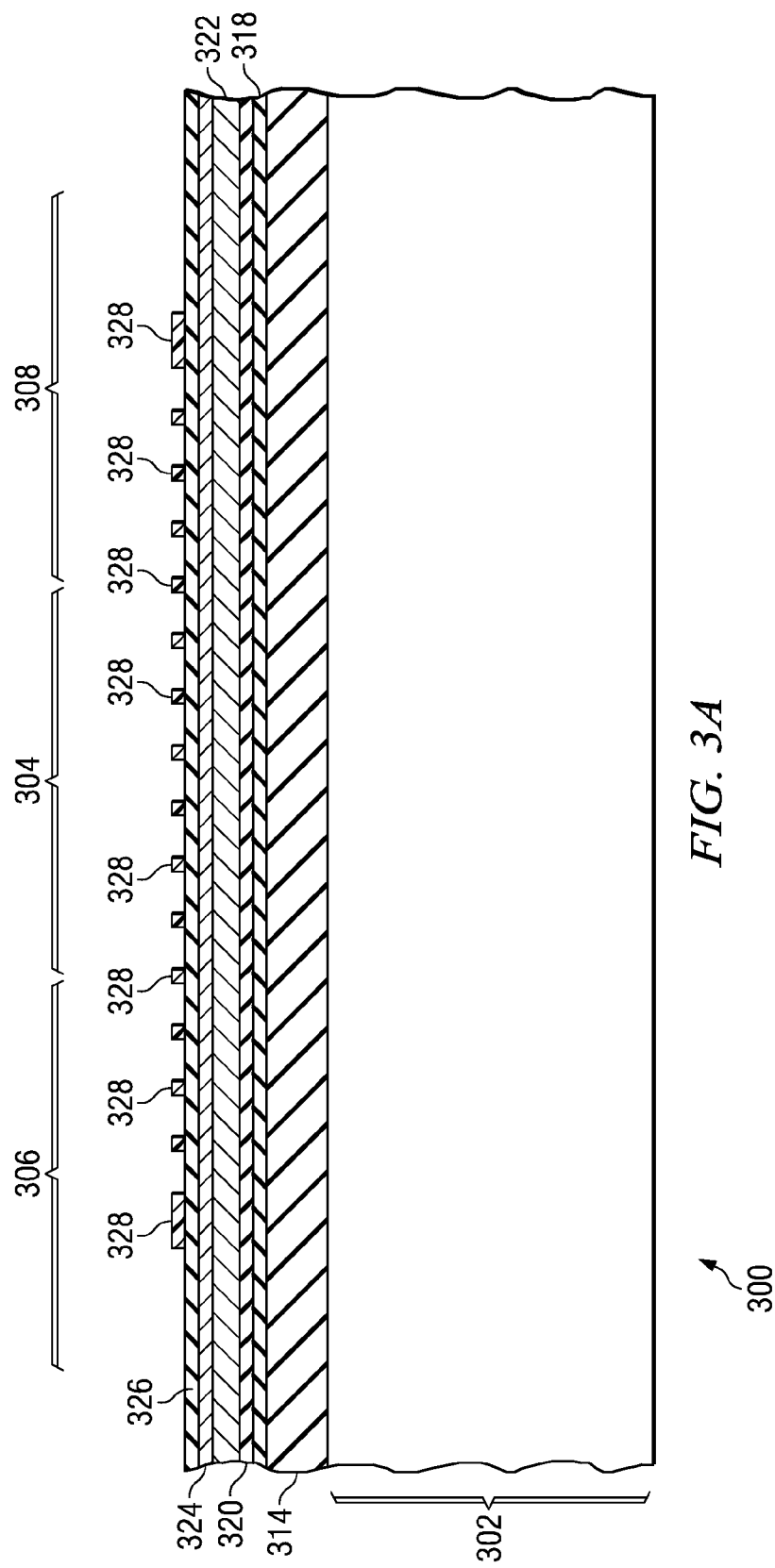
FIGS. 3A-3D are cross-sectional views illustrating steps in another variation of the method of fabrication of FIGS. 1A-1I.

FIG. 3A shows the device 300 formed on a monolithic single crystal semiconductor substrate 302, for example, 500 to 750 microns thick, with an area 304 defined for a flexible element 304, an area 306 defined for a proof mass, and an area 308 defined for a base. The area 304 is bounded on one side by the area 306 and on an opposite side by the area 308. A dielectric isolation layer 314 is shown formed over the substrate 302 and a lower hydrogen barrier layer 318 is shown formed on a top surface of the dielectric layer 314. An insulating buffer layer 320 is formed on the barrier layer 318 if present, else on the dielectric layer 314. The insulating buffer layer 320 is substantially free of silicon and may include, for example, 50 to 200 nanometers thickness of zirconium oxide and/or titanium oxide. The insulating buffer layer 320 may be formed, for example, using a sol-gel process or an MOCVD process.

A ferroelectric layer 322, similar to previously described layer 124 or 222, is formed on the insulating buffer layer 320. An electrode layer 324, including iridium and iridium oxide as described in reference to FIG. 1B, is formed on ferroelectric layer 322. An optional conductive hard mask layer 326 may be formed on the electrode layer 324. An electrode etch mask 328 is formed over the conductive hard mask layer 326 if present and the electrode layer 324. The electrode etch mask 328 may be formed, for example, of photoresist using a photolithographic process. The electrode etch mask 328 includes separate patterned areas for a first electrode and a second electrode.

Figure 3B:
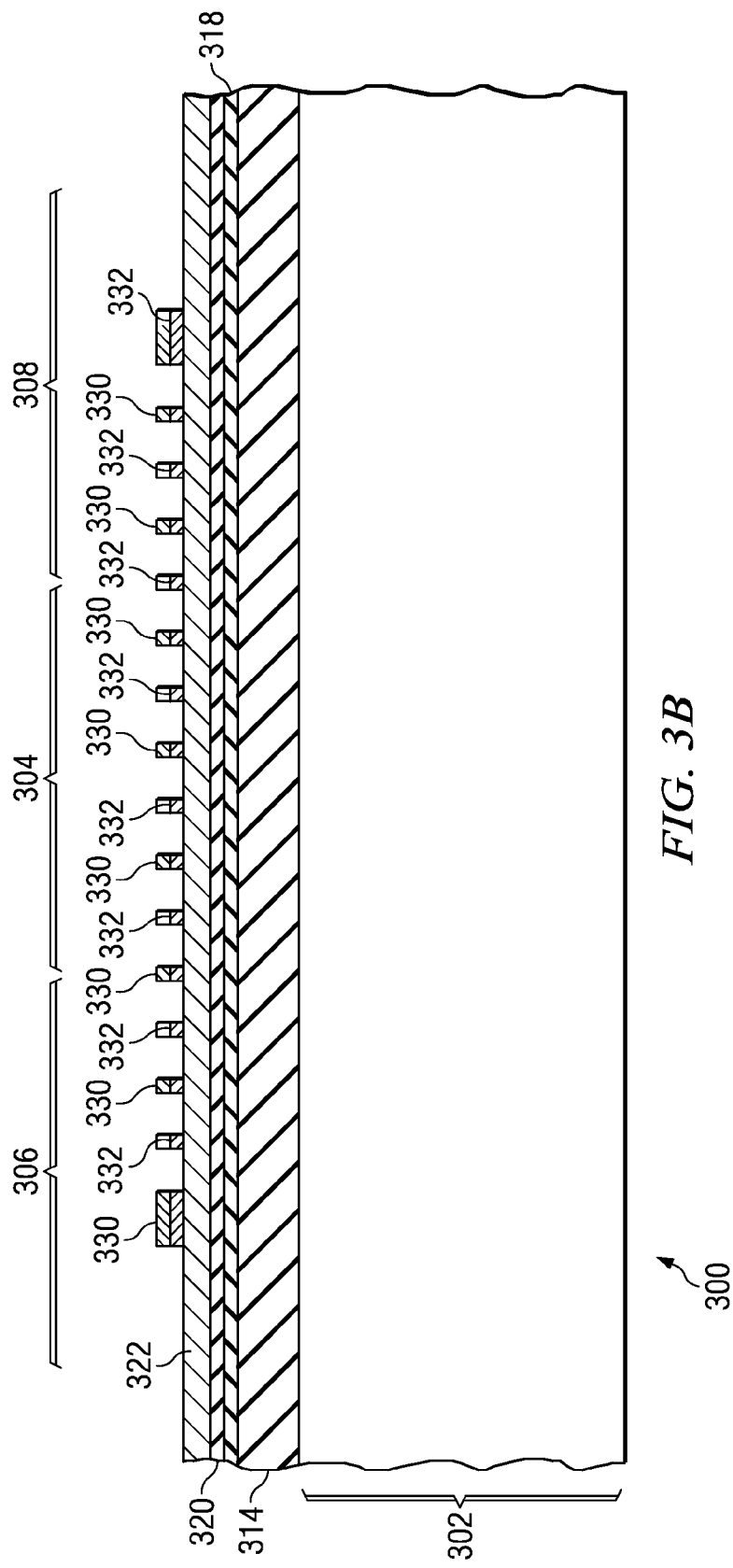

Referring to FIG. 3B, an electrode etch process, for example an RIE process, is performed to remove unwanted material from hard mask layer 326 if present and from the electrode layer 324 (FIG. 3A) to form a first electrode 330 and a second electrode 332 on the ferroelectric layer 322. The first electrode 330 and the second electrode 332 include material from the electrode layer 324 and the conductive hard mask layer 326 if present. The electrode etch mask 328 (FIG. 3A) is removed, for example by exposing the device 300 to an oxygen-containing plasma.

Figure 3C:
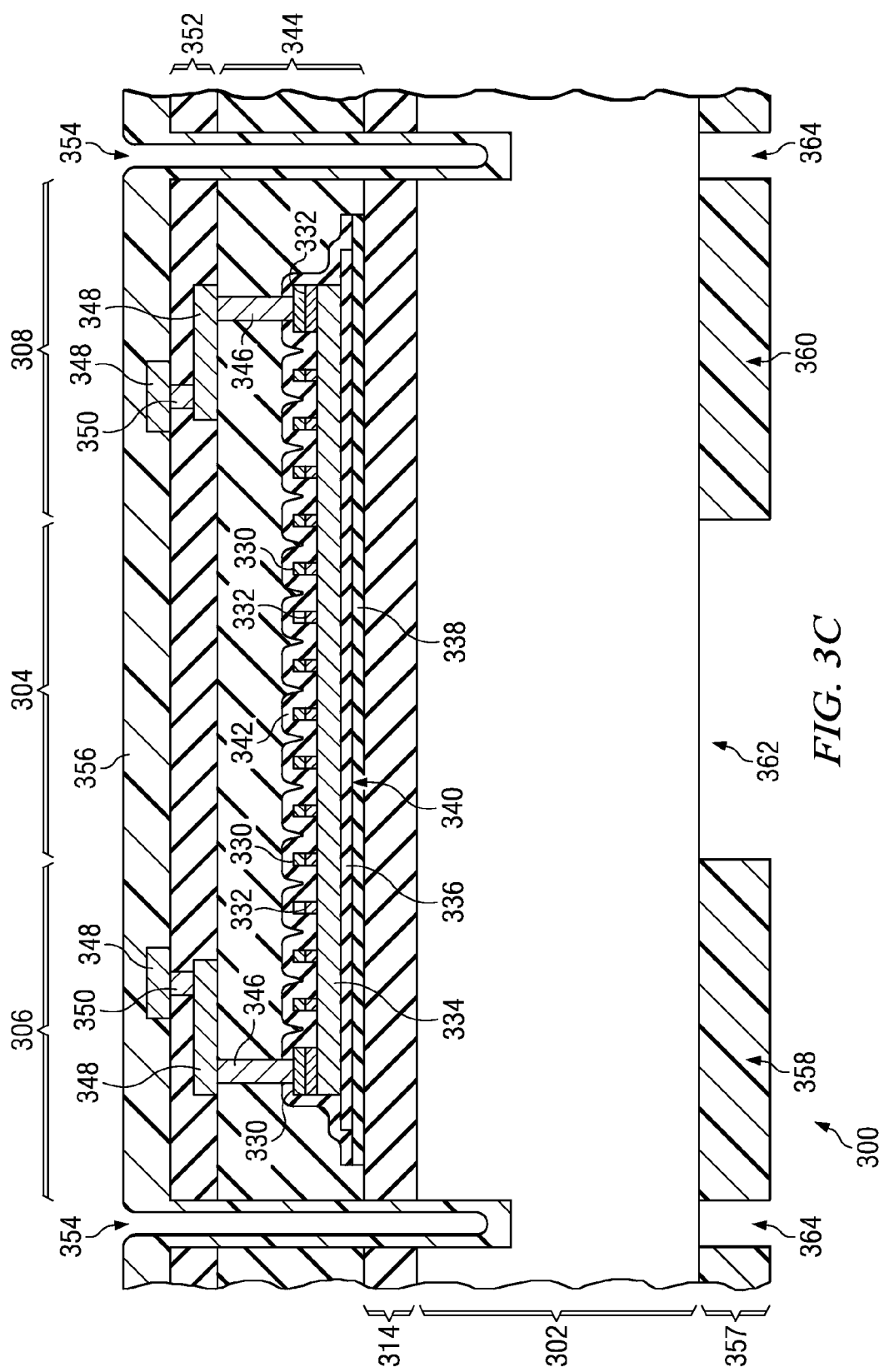

The ferroelectric layer 322, insulating buffer layer 320 and lower hydrogen barrier layer 318 if present (FIG. 3B) are optionally patterned, as depicted in FIG. 3C, to form a ferroelectric element 334, an insulating buffer 336 and a lower hydrogen barrier 338, respectively, in a manner similar to that described previously. A combination of the ferroelectric element 334, the first electrode 330 and the second electrode 332 forms a piezoelectric element 340. In an alternate version, the ferroelectric layer 322, insulating buffer layer 320 and lower hydrogen barrier layer 318 if present, may be left unpatterned.

An upper hydrogen barrier layer 342, which may be similar to barrier layer 138 or 238, is formed conformally over the piezoelectric element 340 and patterned as shown in FIG. 3C. If the lower hydrogen barrier 338 is present, the piezoelectric element 340 may be encapsulated by a peripheral joinder of the upper hydrogen barrier 342 with the lower hydrogen barrier 338, as described previously.

A first interlevel dielectric layer 344 is formed over the piezoelectric element 340 and over the dielectric isolation layer 314. Vias 346 are formed in the first interlevel dielectric layer 344 and the upper hydrogen barrier 342 to make electrical contact with the first electrode 330 and the second electrode 332. One or more layers of metal interconnects 348 and vias 350, and a second interlevel dielectric layer 352 may be formed on the first interlevel dielectric layer 344. The metal interconnects 348 and vias 350 may connect to components formed on substrate 302 to form circuits in the device 300. Other configurations of the device 300 may include I/O pads and top protective overcoat layers.

Front (top) side singulation trenches 354 are formed through the second interlevel dielectric layer 352, the first interlevel dielectric layer 344 and the dielectric isolation layer 314, and into the semiconductor substrate 302, to surround a periphery of the device 300 in an unbroken way or with unetched gaps at intervals. A front (top) side sacrificial overcoat 356 is formed over the device 300, extending into the front side singulation trenches 354.

An patterned mask 357 is formed on a bottom surface of the substrate 302, including a proof mass segment 358 which masks a substrate portion in the proof mass area 306 and an optional base segment 360 which masks a substrate portion in the base area 308. The mask 357 leaves exposed a flexible element etch area 362 in the flexible element area 304 and back side singulation trench areas 364 on the bottom surface of the substrate 302. The trench areas 364 are disposed in alignment under the front side trenches 354.

Figure 3D:
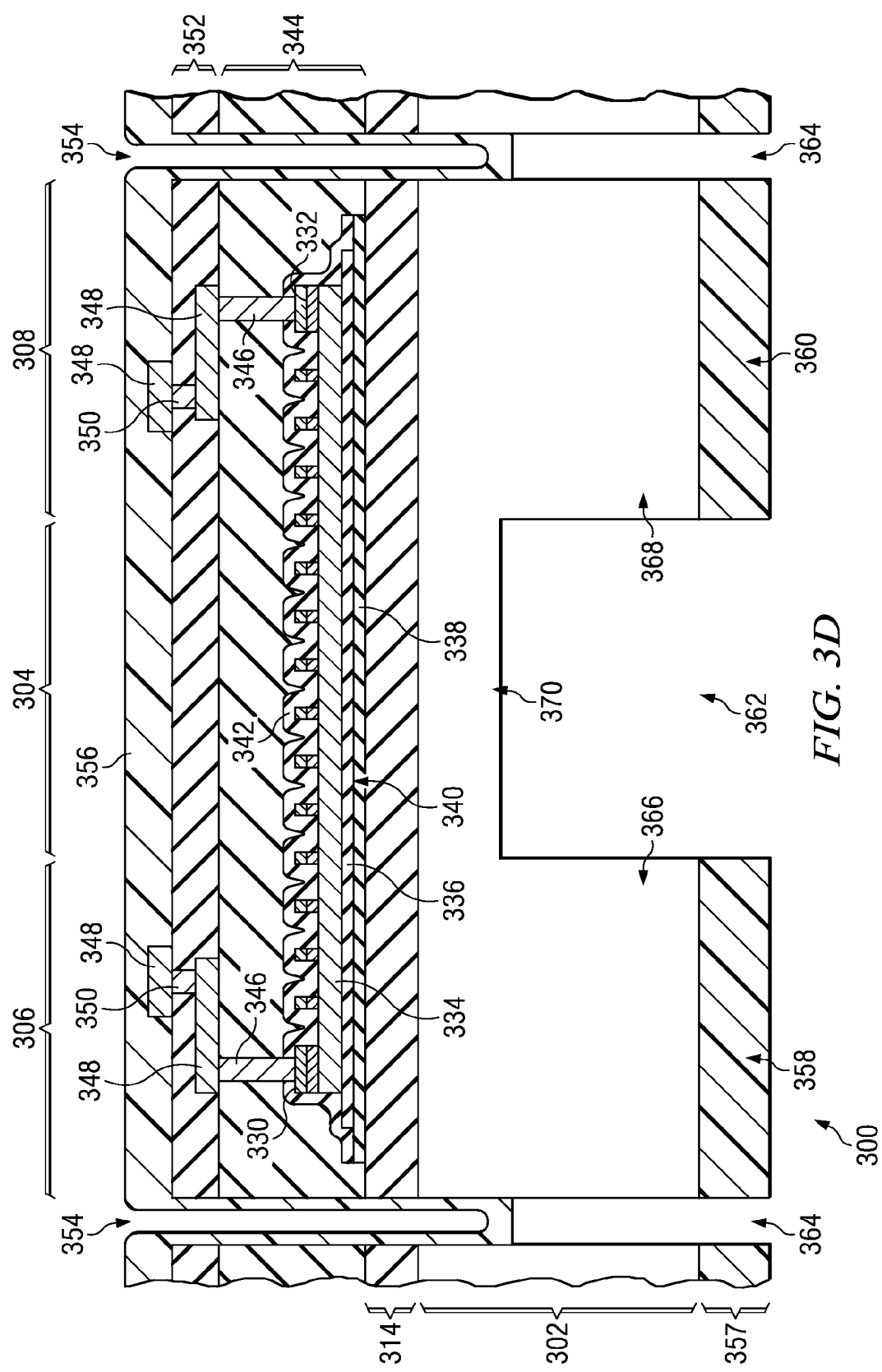

FIG. 3D depicts the device 300 during a back side etch process, similar to the DRIE processes already described. The etch removes material from the substrate 302 in the flexible element etch area 362 and from the back side trench areas 364. In this case, however, the process is a timed etch performed for a pre-determined time period or until a pre-determined amount of silicon has been removed from the substrate 302. In the illustrated case, a DRIE process is used that is stopped before the dielectric isolation layer 314 is exposed.

FIG. 3E shows the device 300 after completion of the back side etch. Material from substrate 302 in the flexible element etch area 362 is removed so that a flexible element 370 includes a portion of the substrate 302 and a portion of the dielectric isolation layer 314 in the flexible element area 304. In one implementation, semiconductor material of the substrate 302 in the flexible element 370 is at least as thick as the dielectric isolation layer 314 in the flexible element 370. Likewise, material from substrate 302 is removed from back side trench areas 364 so that the front side sacrificial overcoat 356 in front side trenches 354 is exposed. Unetched covered areas of substrate 302 define a proof mass 366 in the proof mass area 306 and a base 368 in the base area 308. The device 300 is subsequently singulated and the front side overcoat layer 354 is removed.

Figure 4:
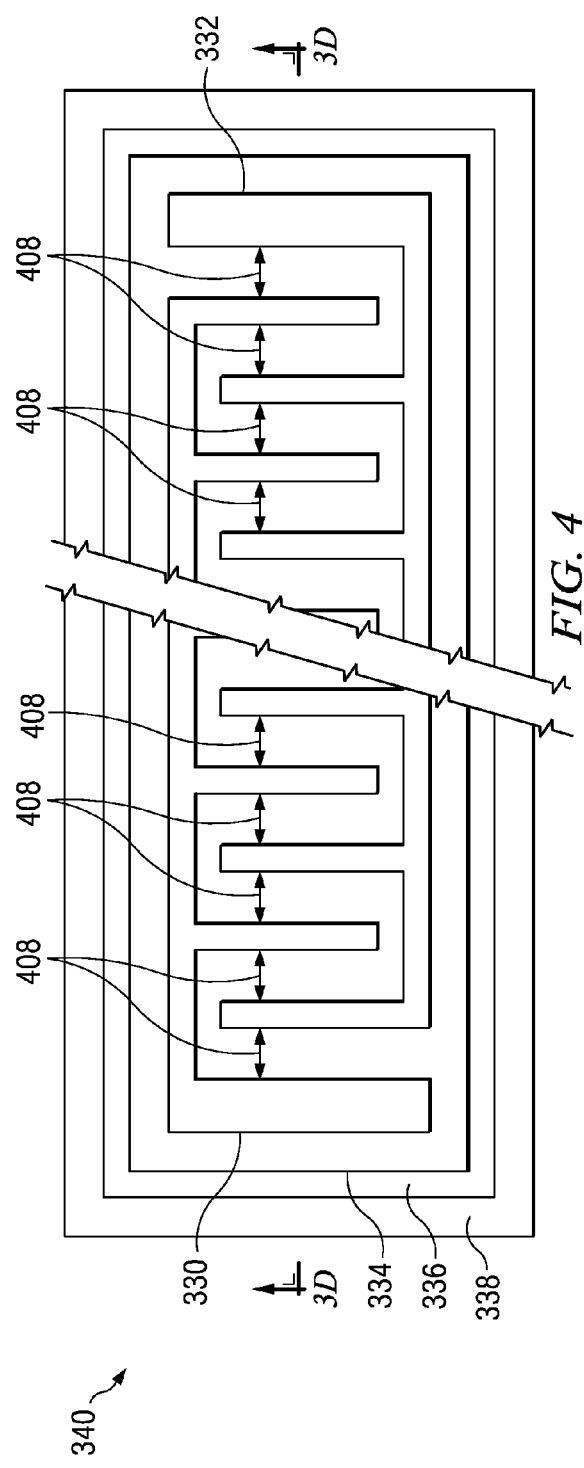
FIG. 4 is a top view showing an example electrode configuration for the piezoelectric element 340 of FIGS. 3A-3D.

FIG. 4 shows a top view of a piezoelectric element 400 for $d_{33}$ mode operation having a configuration like element 340 shown in section in FIGS. 3C-3E. The piezoelectric element 400 includes a planar ferroelectric element 402 (like element 334). A first electrode 404 (like 330) and a second electrode 406 (like 332) are formed on a top surface of the ferroelectric element 402 in an interleaved finger configuration with gaps 408 laterally spacing alternating fingers of the first and second electrodes 404, 406. The piezoelectric element 400 is disposed over a flexible element similar to the disposition of element 340 over flexible element 370 (see FIG. 3E). During operation, flexing and unflexing of the flexible element causes the piezoelectric element 400 to undergo like flexing and unflexing, which generates a potential difference between the first and the second electrodes 404, 406.

Figure 5:
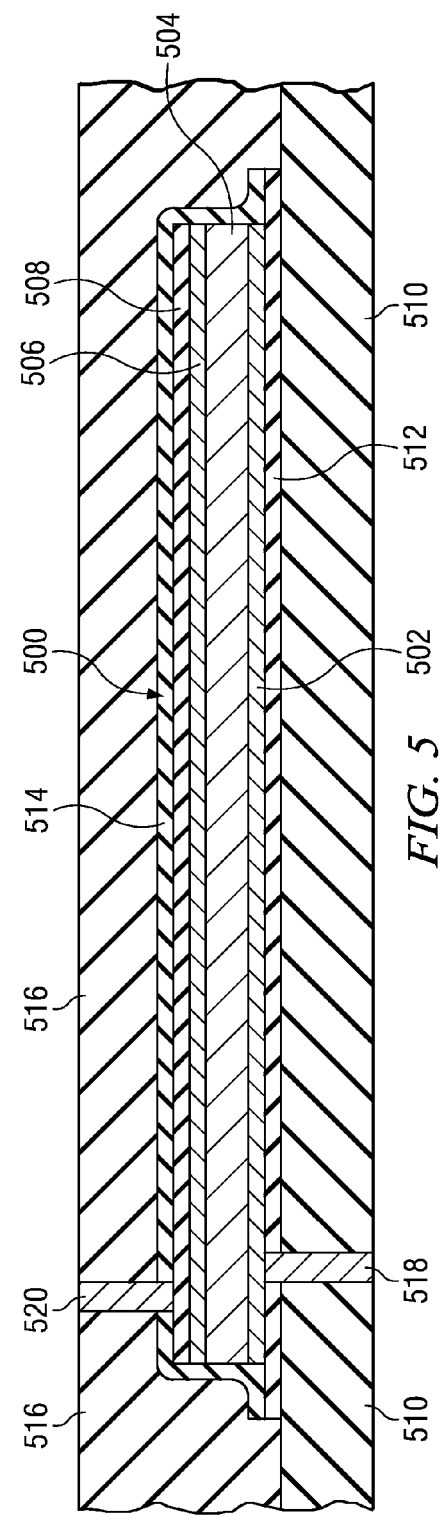

FIGS. 5 and 6 show piezoelectric elements which operate in the $d_{31}$ mode, depicting alternate configurations of contacts to first and second electrodes of the piezoelectric elements.

Piezoelectric element 500 shown in FIG. 5 includes planar ferroelectric element 504 sandwiched between first and second electrodes 502, 504, formed over dielectric layer 510 and capped with an optional conductive hard mask 508. The element 500 is encapsulated between lower and upper hydrogen barriers 512, 514 and interlevel dielectric layer 516 is formed thereover. Electrical contact to first electrode 502 is made through contact 518 formed in dielectric layer 510. Electrical contact to conductive hard mask 508 is made through via 520 formed over ferroelectric element 504 in interlevel dielectric layer 516. Forming the via 520 over the ferroelectric element 504 allows patterning the first electrode 502, the ferroelectric element 504, the second electrode 506 and the conductive hard mask 508 using a single etch mask, advantageously reducing fabrication cost and complexity.

Piezoelectric element 600 shown in FIG. 6 includes planar ferroelectric element 604 sandwiched between first and second electrodes 602, 604, formed over dielectric layer 610 and encapsulated between hydrogen barriers 612, 614. In the illustrated arrangement, dielectric sidewalls 606 abut lateral sides of first electrode 602 and ferroelectric element 604 whose lateral peripheries are substantially vertically aligned, and second electrode layer 608 is formed over ferroelectric element 604 and sidewalls 606 and extends laterally beyond the element 604 and sidewalls 606 over and onto the lower barrier 612 or dielectric layer 610. The sidewalls 606 may be formed, for example, by forming a conformal layer of dielectric material such as silicon nitride or silicon dioxide on the ferroelectric element 604 and the dielectric layer 610, followed by an anisotropic etch, such as a reactive ion etch. The anisotropic etch removes dielectric material from top surfaces of ferroelectric element 604 and dielectric layer 610 and leaves sidewalls 606 contacting lateral surfaces of ferroelectric element 604 and first electrode 602.

In the arrangement shown in FIG. 6, electrical contact to first electrode 602 is made, as shown, through a first contact 616 formed in the dielectric isolation layer 610 under the ferroelectric element 604. Electrical contact to the second electrode 608 is made through a second contact 618, formed in the dielectric isolation layer 610 adjacent to the sidewalls 606 and not directly under the ferroelectric element 604. Forming the first contact 616 to the first electrode 602 and the second contact 618 to the second electrode 608 in the dielectric layer 610 may be advantageous, for example, in implementations which use only one level of metal interconnects, thereby reducing fabrication cost and complexity.

Figure 8:
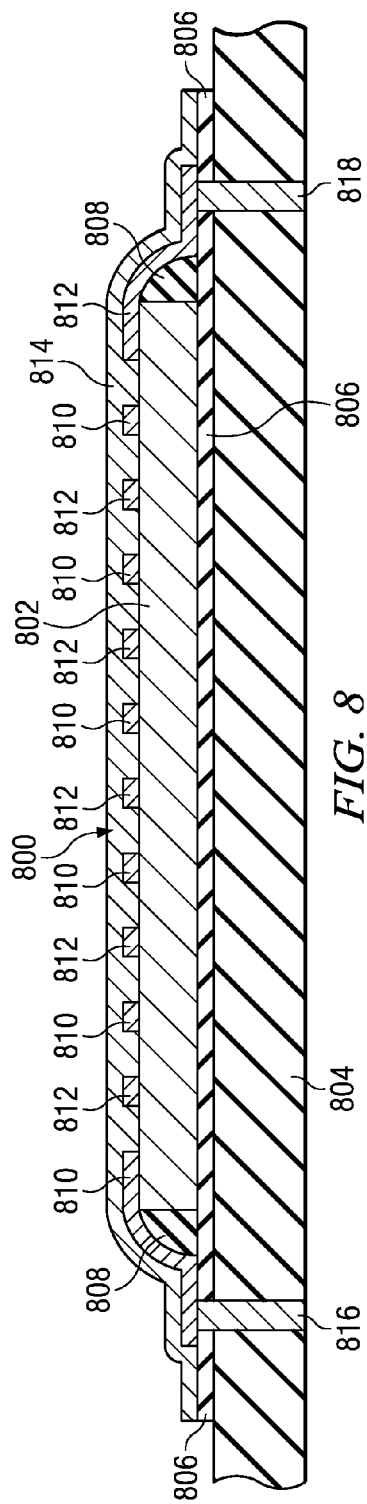

FIGS. 7 and 8 are cross sections of piezoelectric elements which operate in the $d_{33}$ mode, depicting alternate configurations of contacts to first and second electrodes of the piezoelectric elements. Referring to FIG. 7, the piezoelectric element 700 includes a first electrode 702 formed on a top surface of a planar ferroelectric element 704, and a second electrode 706 formed on the top surface of a ferroelectric element 704, interleaved with the first electrode 702. The piezoelectric element 700 is formed over a dielectric isolation layer 708, possibly on a lower hydrogen barrier 710. The piezoelectric element 700 is covered by an upper hydrogen barrier 712. A first interlevel dielectric layer 714, as described in reference to FIG. 1D, is formed over the piezoelectric element 700 and over the dielectric isolation layer 708.

Electrical contact to the first electrode 702 is made through a first via 716 over the ferroelectric element 704, formed in the first interlevel dielectric layer 714. Electrical contact to the second electrode 706 is made through a second via 718 over the ferroelectric element 704, formed in the first interlevel dielectric layer 714. The first via 716 and the second via 718 may be formed concurrently with other vias, not shown, in a MEMS device which contains the piezoelectric element 700, advantageously reducing fabrication cost and complexity of the MEMS device.

Referring to FIG. 8, the piezoelectric element 800 includes a planar ferroelectric element 802 formed over a dielectric isolation layer 804, possibly on a lower hydrogen barrier 806. Dielectric sidewalls 808 are formed on lateral surfaces of the ferroelectric element 802, for example as described in reference to FIG. 4. The piezoelectric element 800 further includes a first electrode 810 formed on a top surface of a ferroelectric element 802, and a second electrode 812 formed on the top surface of a ferroelectric element 802, interleaved with the first electrode 810. The first electrode 810 overlaps the sidewalls 808 at one or more locations on a periphery of the ferroelectric element 802 and extends laterally over the dielectric isolation layer 804 adjacent to the ferroelectric element 802. Similarly, the second electrode 812 overlaps the sidewalls 808 at one or more locations on the periphery of the ferroelectric element 802 and extends laterally over the dielectric isolation layer 804 adjacent to the ferroelectric element 802. The piezoelectric element 800 is covered by an upper hydrogen barrier 814.

Electrical contact to the first electrode 810 is made through a first contact 816 formed in the dielectric isolation layer 804 adjacent to the sidewalls 808 and not directly under the ferroelectric element 802. Similarly, electrical contact to the second electrode 812 is made through a second contact 818, formed in the dielectric isolation layer 804 adjacent to the sidewalls 808 and not directly under the ferroelectric element 802. Forming the first contact 816 to the first electrode 810 and the second contact 819 to the second electrode 812 in the dielectric isolation layer 804 may be advantageous, for example in versions of the instant embodiment which use only one level of metal interconnects, thereby reducing fabrication cost and complexity of the MEMS device.

Figure 9A:
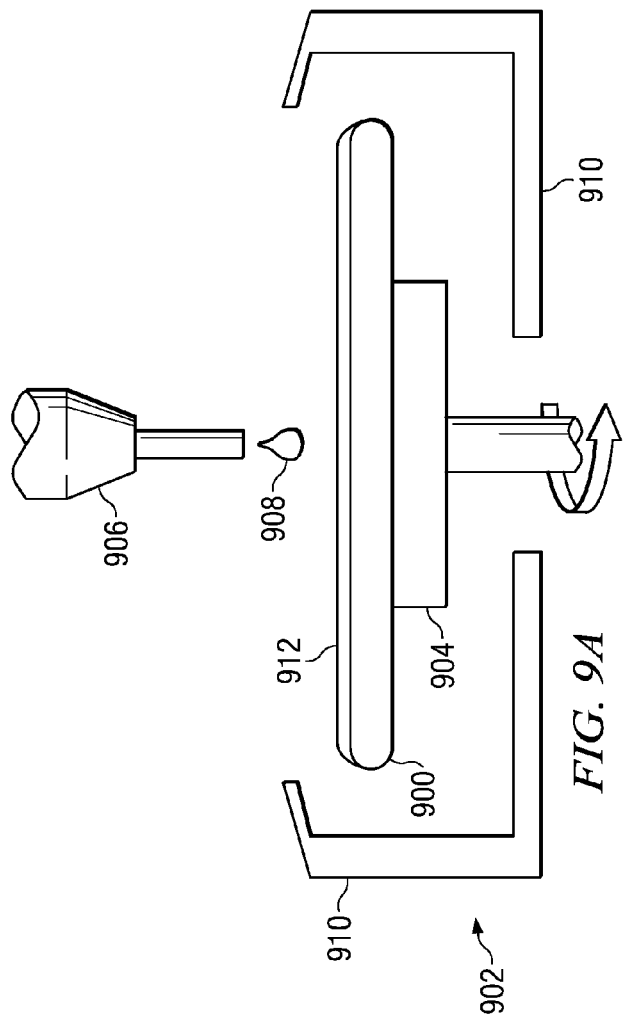
FIGS. 9A-9C are schematic views depicting example processes for forming planar ferroelectric layers in the methods of FIGS. 1A-1I, 2A-2G and 3A-3D.
Figure 9B:
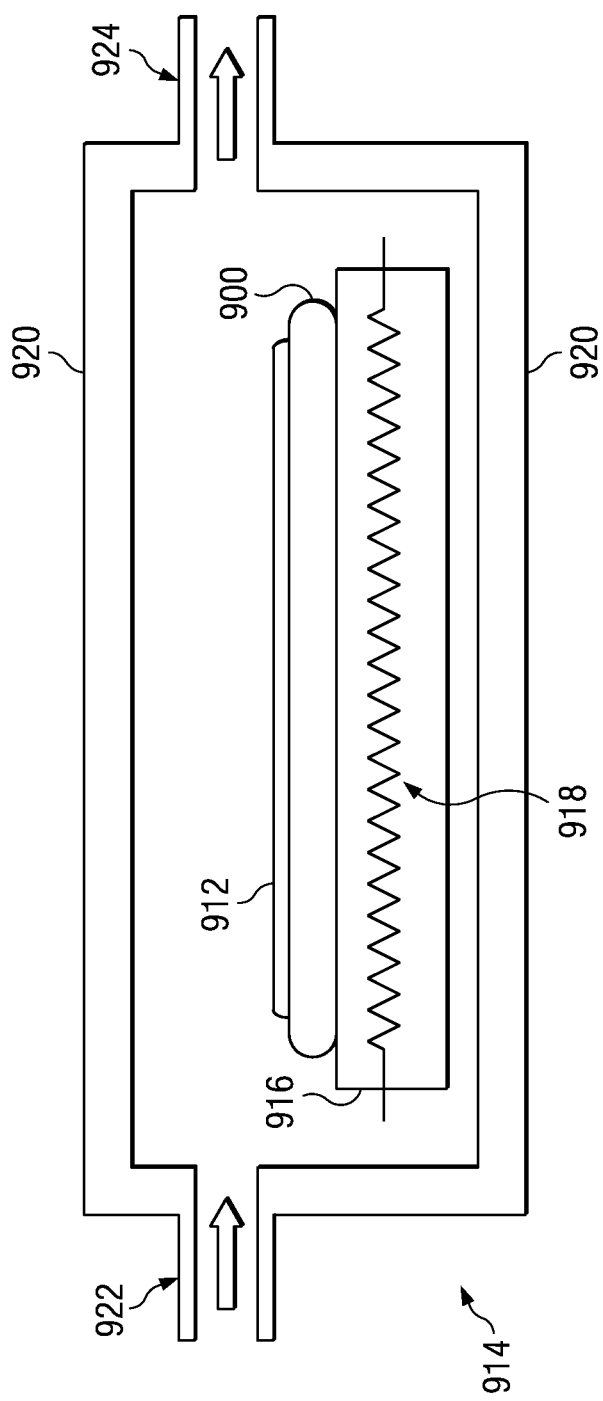
Figure 9C:
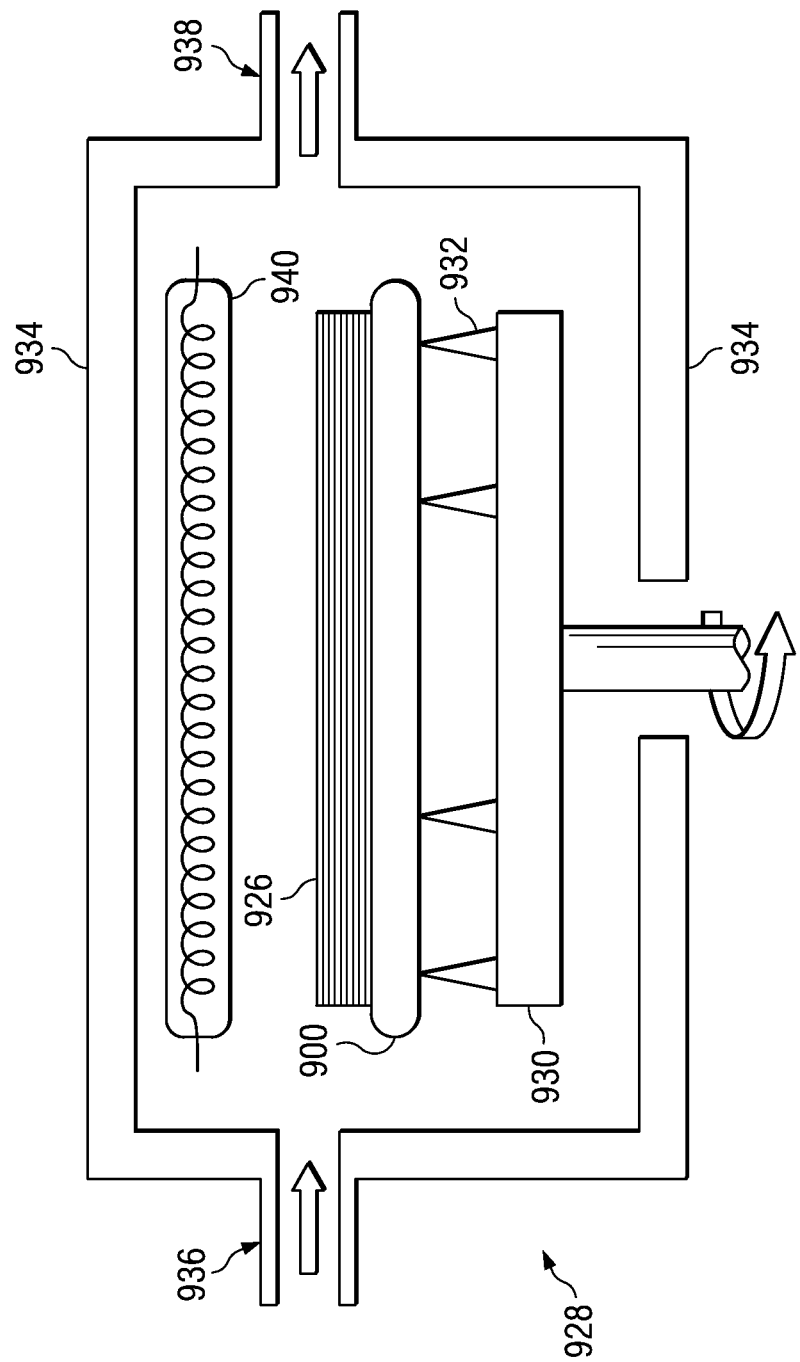

FIG. 9A through FIG. 9C depict a process for forming a planar ferroelectric layer on a semiconductor substrate. It is understood that the term "semiconductor substrate" in reference to FIG. 9A through FIG. 9C includes a dielectric isolation layer over the semiconductor substrate, as described in reference to FIG. 1A. The ferroelectric layer is formed by forming multiple sol gel layers to obtain a desired final thickness, followed by a sol gel anneal process. Referring to FIG. 9A, the semiconductor substrate 900 is disposed in the spin coat apparatus 902 on a rotating chuck 904 capable of spinning the semiconductor substrate 900 up to several thousand revolutions per minute (rpm). The spin coat apparatus 902 includes a sol gel dispense head 906 which delivers sol gel solution to a top surface of the dielectric isolation layer on the semiconductor substrate 900, for example, 2 cm³ of sol gel solution 908 onto a 200 mm semiconductor substrate 900, as depicted schematically in FIG. 9A by a dispensed sol gel dose 908. The spin coat apparatus 902 may include a spinner bowl 910 to control excess sol gel solution. The dispensed sol gel solution on the top surface of the semiconductor substrate 900 is distributed over the top surface of the semiconductor substrate by rotating the chuck 904, for example between 500 rpm and 1500 rpm, to form a sol gel layer 912. Subsequent to dispensing the sol gel solution 908, the semiconductor substrate is spun, for example between 1500 rpm and 3500 rpm, to form the sol gel layer 912 on the top surface of the semiconductor substrate 900 with a thickness in a desired range. For a given concentration of sol gel solution, spin speeds and accelerations may be selected to provide a desired thickness and uniformity while avoiding radial striations. A portion of solvents in the sol gel layer 912 may be removed during the spinning operation. Water vapor in an ambient over the semiconductor substrate 900 may react with the sol gel layer 912 in a gelation reaction to form a gel.

The sol gel layer 912 is subsequently dried by spinning the semiconductor substrate 900, for example between 800 rpm and 2500 rpm, in non-reducing ambient for at least 5 seconds. The non-reducing ambient has at least 1 percent relative humidity at 25 C, and may include at least 1 percent oxygen. A flow rate of the non-reducing ambient may be between 300 cm³/minute and 1000 cm³/minute. A further portion of solvent in the sol gel layer 912 may be removed during the drying operation. Oxidizing agents in the ambient may react with the sol gel layer 912 to form more gel.

After forming the sol gel layer as described in reference to FIG. 9A, the sol gel layer is baked before forming a subsequent sol gel layer. FIG. 9B depicts the semiconductor substrate 900 in a sol gel layer bake apparatus 914. The semiconductor substrate 900 with the sol gel layer 912 is disposed on a bake chuck 916. The sol gel layer bake apparatus 914 includes a bake chamber 920 with an inlet port 922 and an outlet port 924. A non-reducing ambient, not shown, is provided in the bake chamber 920 by delivering non-reducing gas through the inlet port 922 and extracting it through the outlet port 924. Heat is applied to the semiconductor substrate 900, for example by heating the bake chuck 916 with a heater element 918 as depicted in FIG. 9B, so that a temperature of the sol gel layer 912 increases from a starting temperature between 100 C. and 225 C. to a final temperature between 275 C. and 425 C. and over a time period of at least 2 minutes. Other means of heating the semiconductor substrate 900 are within the scope of the instant embodiment. The bake process is performed so that at least 90 percent of solvent in the sol gel layer 912 is removed at a rate which does not introduce defects or voids in the sol gel layer 912.

FIG. 9C depicts the semiconductor substrate 900 with a sol gel layer stack 926 in a sol gel layer anneal apparatus 928. The semiconductor substrate 900 is disposed over a rotating chuck 930, possibly on standoff pins 932. The anneal apparatus 928 includes an anneal chamber 934 with an inlet port 936 and an outlet port 938. An oxidizing ambient, not shown, is provided in the anneal chamber 934 by delivering oxidizing gas through the inlet port 936 and extracting it through the outlet port 938. Heating means 940, for example one or more heating lamps 940 as depicted in FIG. 9A, are disposed in the anneal chamber 934.

An exemplary sol gel anneal process includes seven steps. The anneal process begins with baking the semiconductor substrate 900 and sol gel layer stack 926 at a temperature between 250 C and 350 C for at least 30 seconds while ramping a pressure of the oxidizing ambient from less than 100 torr to between 700 torr and 1000 torr at a ramp rate greater than 10 torr per second while flowing an oxidant in the ambient between 3 and 7 standard liters per minute (slm). The semiconductor substrate 900 may be spun during the first four steps, for example between 50 and 125 rpm. Next, the temperature of the semiconductor substrate 900 and sol gel layer stack 926 is ramped to between 425 C and 475 C over a time period of at least 20 seconds while the ambient pressure is maintained between 700 torr and 1000 torr and the flow rate of the oxidant in the ambient is maintained between 3 and 7 slm. Subsequently, the semiconductor substrate 900 and sol gel layer stack 926 are baked at a temperature between 475 C and 525 C for at least 30 seconds while the ambient pressure is maintained between 700 torr and 1000 torr and the flow rate of the oxidant in the ambient is maintained between 3 and 7 slm. Next, the temperature of the semiconductor substrate 900 and sol gel layer stack 926 is ramped to between 650 C and 750 C at a ramp rate between 20 and 60 degrees C. per minute while the ambient pressure is maintained between 700 torr and 1000 torr and the flow rate of the oxidant in the ambient is maintained between 3 and 7 slm.

Subsequently, the semiconductor substrate 900 and sol gel layer stack 926 are annealed at a temperature between 650 C and 750 C for at least 60 seconds while spinning the semiconductor substrate 900 between 50 and 125 rpm and while the ambient pressure is maintained between 700 torr and 1000 torr and the flow rate of the oxidant in the ambient is maintained between 3 and 7 slm. Next, the semiconductor substrate 900 and sol gel layer stack 926 are annealed at a temperature between 650 C and 750 C for at least 20 seconds while spinning the semiconductor substrate 900 between 50 and 125 rpm and while the ambient pressure is maintained between 4 torr and 10 torr and the flow rate of the oxidant in the ambient is at least 5 slm. The sol gel layer stack 926 is thus formed into the planar ferroelectric layer with a perovskite structure. Subsequently, the temperature of the semiconductor substrate 900 and sol gel layer stack 926 is reduced at a ramp rate greater than 5 degrees C. per second to a temperature below 475 C while spinning the semiconductor substrate 900 between 50 and 125 rpm and while the ambient pressure is maintained between 4 torr and 10 torr and the flow rate of the oxidant in the ambient is at least 5 slm. Forming the planar ferroelectric layer as described in reference to FIG. 9A through FIG. 9C results in a layered structure which may be observable in a high resolution transmission electron microscope.

Figure 10:
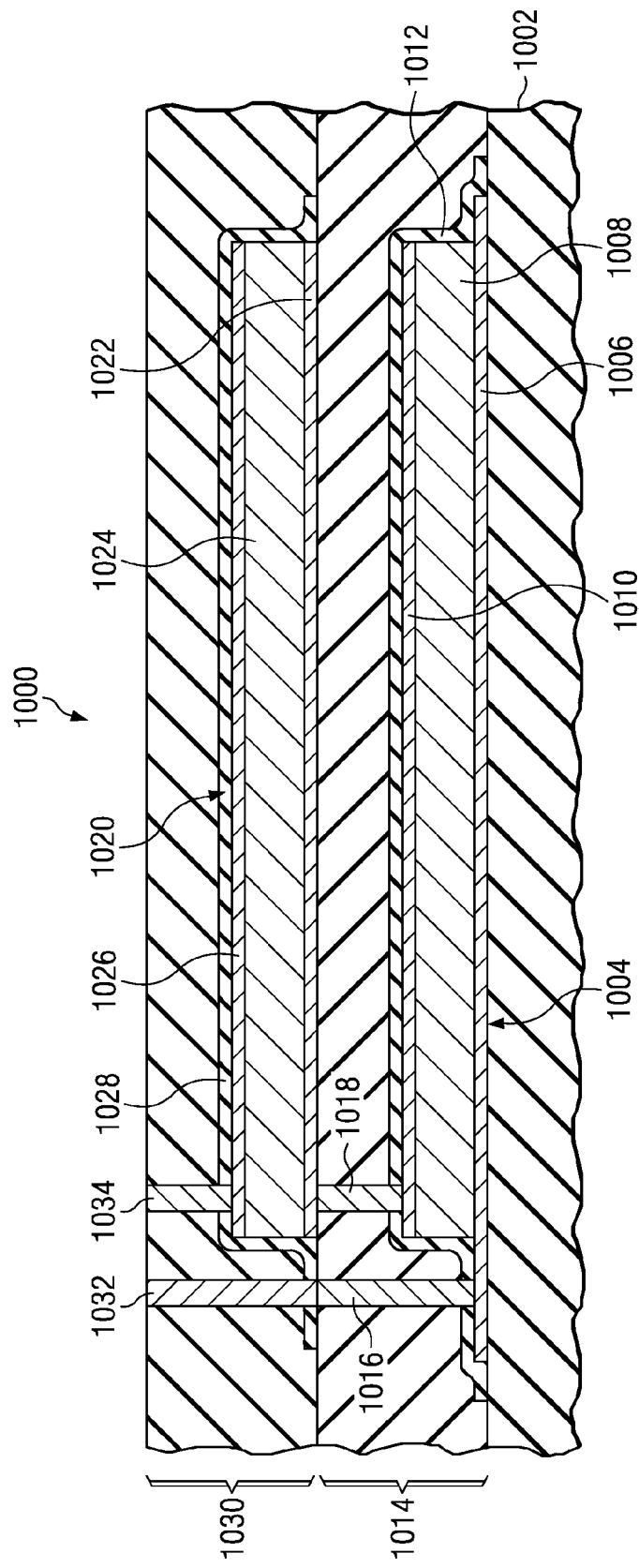
FIGS. 10 and 11 are cross-sectional views depicting examples of MEMS devices formed with multiple piezoelectric elements at different processing levels.
Figure 11:
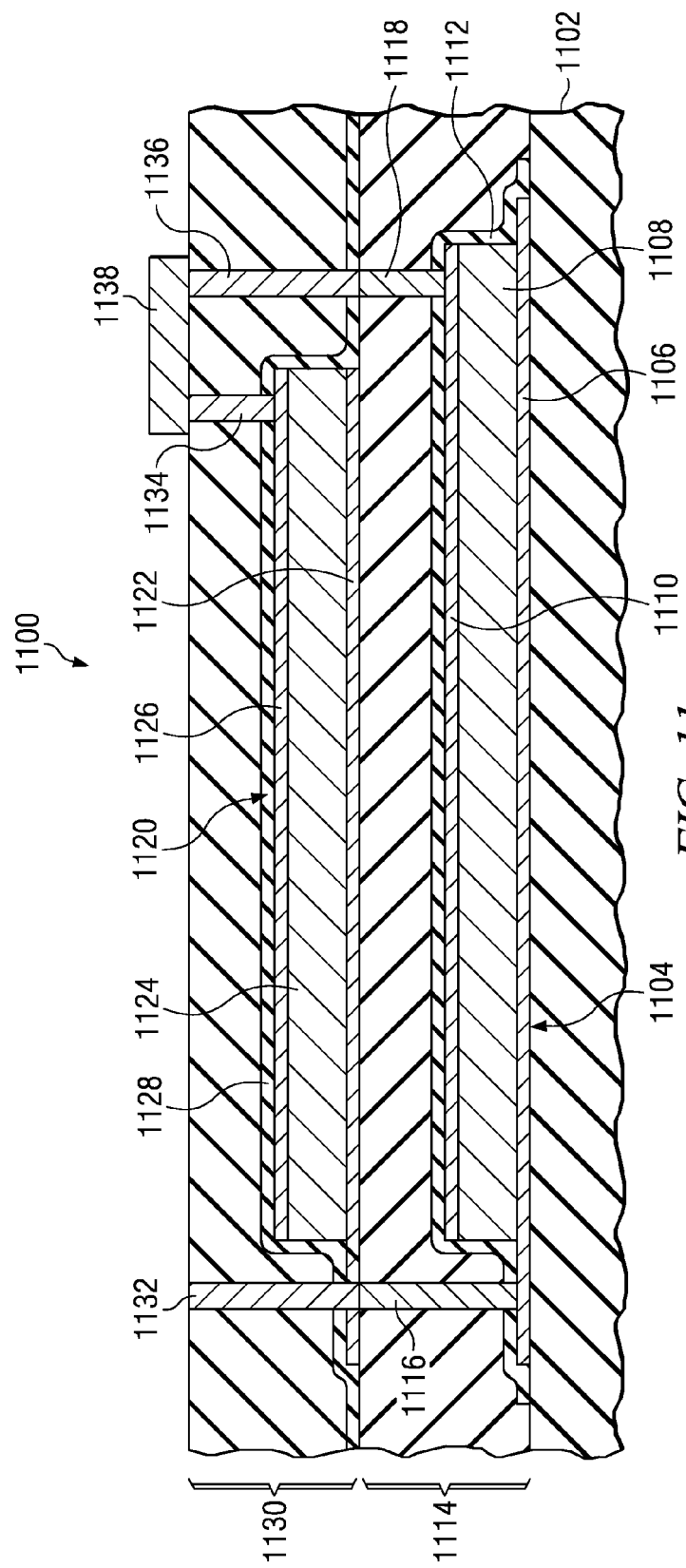

FIG. 10 and FIG. 11 depict MEMS devices with dual piezoelectric elements, which operate in the $d_{31}$ mode, formed according to embodiments. Referring to FIG. 10, a MEMS device 1000 includes a dielectric isolation layer 1002 formed as described in reference to FIG. 1A. A first piezoelectric element 1004, including a lower first electrode 1006, a first ferroelectric element 1008 and an upper second electrode 1010, is formed on the dielectric isolation layer 1002. The first piezoelectric element 1004 may be formed as described in reference to any of the embodiments recited herein. A first lower hydrogen barrier, not shown, may be formed over the dielectric isolation layer 1002 prior to forming the first piezoelectric element 1004. A first upper hydrogen barrier 1012 is formed over the first piezoelectric element 1004, as described in reference to FIG. 1D. A first interlevel dielectric layer 1014 is formed over the first upper hydrogen barrier 1012, as described in reference to FIG. 1E. First contacts 1016 and 1018 are formed in the first interlevel dielectric layer 1014 so as to make electrical contact with the first electrode 1006 and the second electrode 1010 of the first piezoelectric element 1004, respectively. Top surfaces of the first contacts 1016 and 1018 are exposed at a top surface of the first interlevel dielectric layer 1014.

A second piezoelectric element 1020, including a lower first electrode 1022, a second ferroelectric element 1024 and an upper second electrode 1026, is formed over the first interlevel dielectric layer 1014. The second piezoelectric element 1020 may be formed as described in reference to any of the embodiments recited herein. In the instant embodiment, the first electrode 1022 of the second piezoelectric element 1020 makes electrical connection to the first contact 1018 which is connected to the second electrode 1010 of the first piezoelectric element 1004. A second lower hydrogen barrier, not shown, may be formed over the first interlevel dielectric layer 1014 prior to forming the second piezoelectric element 1020. A second upper hydrogen barrier 1028 is formed over the second piezoelectric element 1020, as described in reference to FIG. 1D. A second interlevel dielectric layer 1030 is formed over the second upper hydrogen barrier 1028, as described in reference to FIG. 1E. Second contacts 1032 and 1034 are formed in the second interlevel dielectric layer 1030 so as to make electrical contact with the first contact 1016 and the second electrode 1026 of the second piezoelectric element 1020, respectively.

In the instant embodiment, the first piezoelectric element 1004 and the second piezoelectric element 1020 are electrically connected in series, so that the second contact 1032 is electrically coupled to the first electrode 1006 of the first piezoelectric element 1004, the second electrode 1010 of the first piezoelectric element 1004 is electrically coupled to the first electrode 1022 of the second piezoelectric element 1020, and the second electrode 1026 of the second piezoelectric element 1020 is electrically coupled to the second contact 1034. Electrically connecting the first piezoelectric element 1004 and the second piezoelectric element 1020 in series may advantageously increase a voltage produced by the MEMS device 1000. It will be recognized that the piezoelectric elements 1004 and 1020 and contacts 1016, 1018, 1032 and 1034 may be configured according to other embodiments described herein, and be electrically connected in series. It will further be recognized that a MEMS device with dual piezoelectric elements operating in the $d_{33}$ mode and electrically connected in series may be formed as described in reference to FIG. 10, with appropriately configured electrodes and contacts.

Referring to FIG. 11, a MEMS device 1100 includes a dielectric isolation layer 1102 formed as described in reference to FIG. 1A. A first piezoelectric element 1104, including a lower first electrode 1106, a first ferroelectric element 1108 and an upper second electrode 1110, is formed on the dielectric isolation layer 1102. The first piezoelectric element 1104 may be formed as described in reference to any of the embodiments recited herein. A first lower hydrogen barrier, not shown, may be formed over the dielectric isolation layer 1102 prior to forming the first piezoelectric element 1104. A first upper hydrogen barrier 1112 is formed over the first piezoelectric element 1104, as described in reference to FIG. 1D. A first interlevel dielectric layer 1114 is formed over the first upper hydrogen barrier 1112, as described in reference to FIG. 1E. First contacts 1116 and 1118 are formed in the first interlevel dielectric layer 1114 so as to make electrical contact with the first electrode 1106 and the second electrode 1110 of the first piezoelectric element 1104, respectively. Top surfaces of the first contacts 1116 and 1118 are exposed at a top surface of the first interlevel dielectric layer 1114.

A second piezoelectric element 1120, including a lower first electrode 1122, a second ferroelectric element 1124 and an upper second electrode 1126, is formed over the first interlevel dielectric layer 1114. The second piezoelectric element 1120 may be formed as described in reference to any of the embodiments recited herein. In the instant embodiment, the first electrode 1122 of the second piezoelectric element 1120 makes electrical connection to the first contact 1116 which is connected to the first electrode 1106 of the first piezoelectric element 1104. A second lower hydrogen barrier, not shown, may be formed over the first interlevel dielectric layer 1114 prior to forming the second piezoelectric element 1120. A second upper hydrogen barrier 1128 is formed over the second piezoelectric element 1120, as described in reference to FIG. 1D. A second interlevel dielectric layer 1130 is formed over the second upper hydrogen barrier 1128, as described in reference to FIG. 1E. Second contacts 1132, 1134 and 1136 are formed in the second interlevel dielectric layer 1130 so as to make electrical contact with the first electrode 1122 of the second piezoelectric element 1120, the second electrode 1126 of the second piezoelectric element 1120, and the first contact 1118 which is electrically connected to the second electrode 1110 of the first piezoelectric element 1004, respectively. The second electrodes 1134 and 1136 are electrically coupled to each other, for example by a metal interconnect 1138.

In the instant embodiment, the first piezoelectric element 1104 and the second piezoelectric element 1120 are electrically connected in parallel, so that the second contact 1132 is electrically coupled to the first electrode 1106 of the first piezoelectric element 1104 and the first electrode 1122 of the second piezoelectric element 1120, and the second contact 1136 is electrically coupled to the second electrode 1110 of the first piezoelectric element 1104 and the second electrode 1126 of the second piezoelectric element 1120. Electrically connecting the first piezoelectric element 1104 and the second piezoelectric element 1120 in parallel may advantageously increase a current produced by the MEMS device 1100. It will be recognized that the piezoelectric elements 1104 and 1120 and contacts 1116, 1118, 1132, 1134 and 1136 may be configured according to other embodiments described herein, and be electrically connected in parallel. It will further be recognized that a MEMS device with dual piezoelectric elements operating in the $d_{33}$ mode and electrically connected in parallel may be formed as described in reference to FIG. 11, with appropriately configured electrodes and contacts.

FIG. 12 is a perspective of a MEMS device with a dual flexible element, formed according to an embodiment. The MEMS device 1200 includes a single proof mass 1202 attached to a center region of the dual flexible element 1204 in a beam configuration. The flexible element 1204 is supported on each end by bases 1206. One or more piezoelectric elements 1208 are disposed over, and mechanically coupled to, the flexible element 1204. The MEMS device 1200 is attached to a carrier 1210 at the bases 1206 which is configured to provide clearance under the proof mass 1202. Configuring the flexible element 1204 to be supported on both ends may advantageously increase reliability of the MEMS device 1200.

The MEMS device 1200 further includes a storage capacitor 1212 which has a dielectric element that includes a ferroelectric element which is formed concurrently with ferroelectric elements in the piezoelectric elements 1208, so that the ferroelectric element in the storage capacitor 1212 is of substantially equal thickness as the ferroelectric elements in the piezoelectric elements 1208. The storage capacitor 1212 stores electric charge from the piezoelectric elements 1208. Forming the storage capacitor 1212 with a ferroelectric element in the dielectric element may advantageously improve performance of the MEMS device 1200. Forming the ferroelectric elements in the storage capacitor 1212 and the piezoelectric elements 1208 concurrently may advantageously reduce fabrication cost and complexity of the MEMS device 1200.

FIG. 13 is a perspective of a MEMS device with more than one proof mass, formed according to an embodiment. The MEMS device 1300 includes two proof masses 1302 attached to a flexible element 1304 in a beam configuration supported on both ends by bases 1306. One or more piezoelectric elements 1308 are disposed over, and mechanically coupled to, the flexible element 1304. The MEMS device 1300 is attached to a carrier 1310 at the bases 1306 which is configured to provide clearance under the proof mass 1302. Forming the MEMS device 1300 with more than one proof mass 1302 attached to the flexible element 1304 may advantageously improve a frequency response spectrum of the MEMS device 1300.

Figure 14:
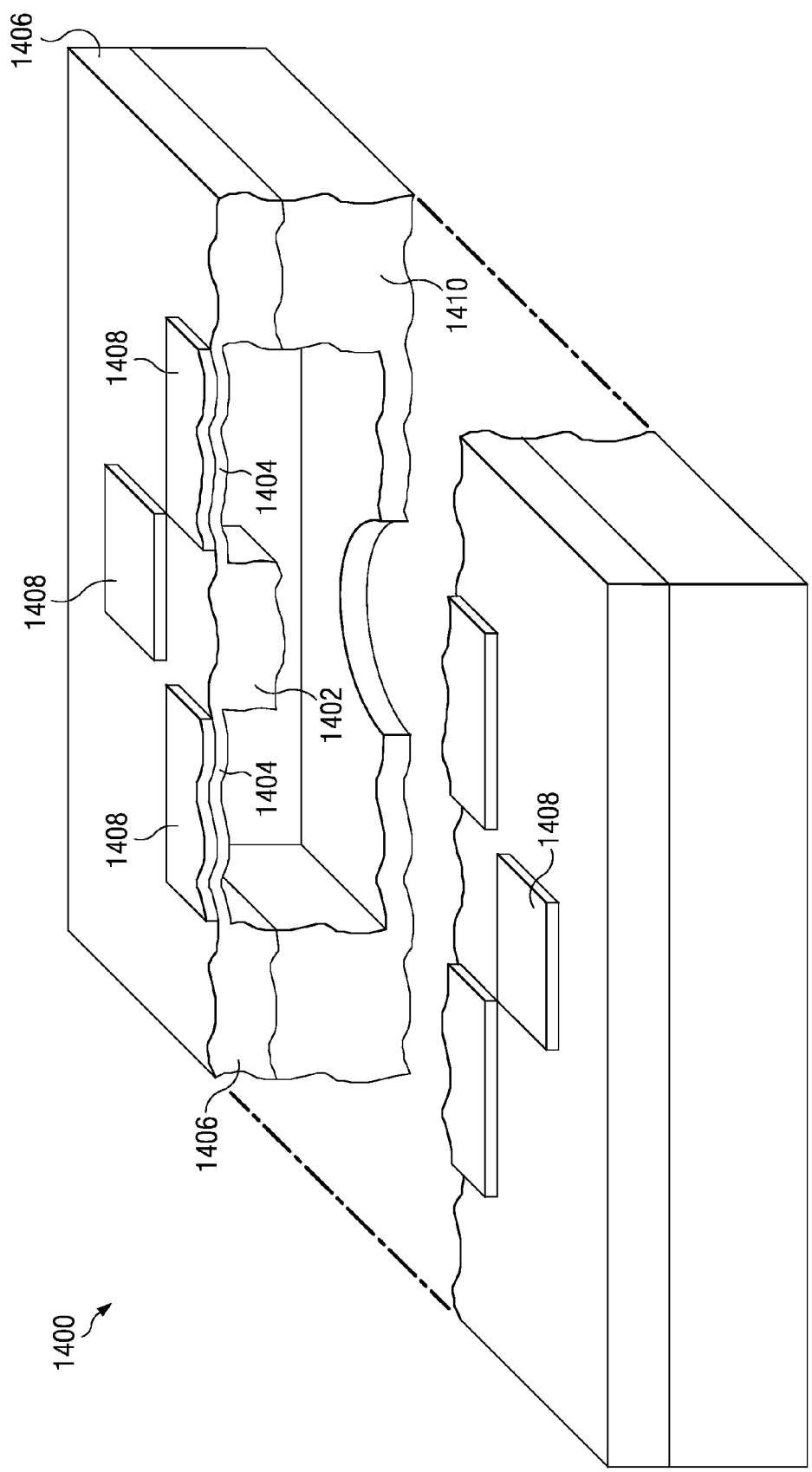

FIG. 14 is a broken perspective of a MEMS device with a flexible element configured as a membrane, formed according to an embodiment. The MEMS device 1400 has a single proof mass 1402 attached to a center of the flexible element 1404. The flexible element 1404 is configured as a membrane supported around a periphery by a continuous base 1406. Piezoelectric elements 1408 are disposed over, and mechanically coupled to, the flexible element 1404. The MEMS device 1400 is attached to a carrier 1410 along the continuous base 1406; the carrier 1410 is configured to provide clearance under the proof mass 1402. Forming the MEMS device 1400 with the flexible element 1404 configured as a membrane may advantageously improve a power efficiency of the MEMS device 1400 when disposed in an environment with a varying air pressure, such as in a Helmholtz resonator, as depicted in FIG. 14.

Figure 15:
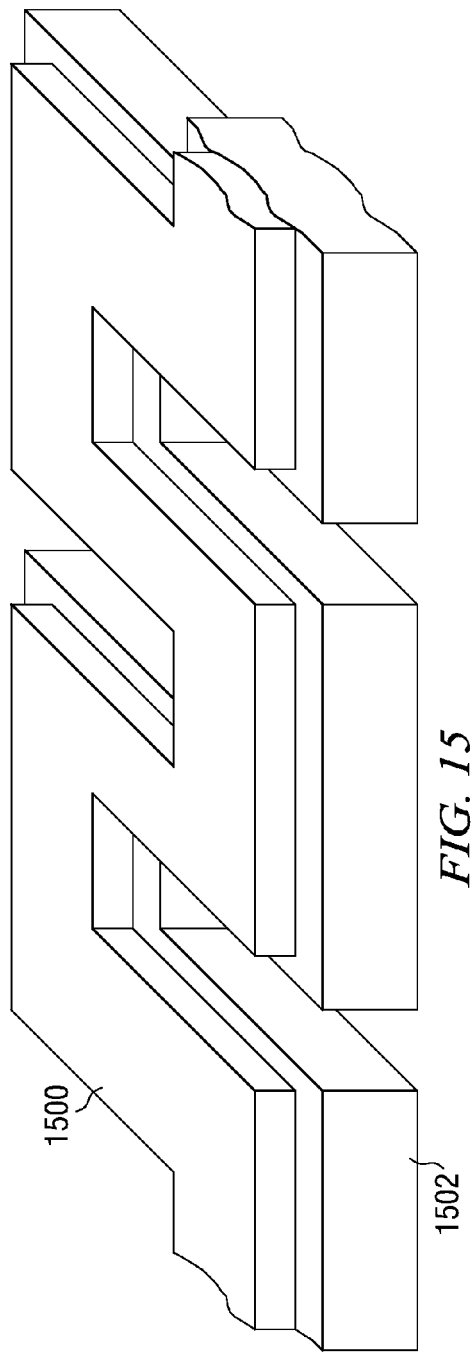
FIGS. 15-17 depict examples of piezoelectric elements formed with tortuous configurations.
Figure 16:
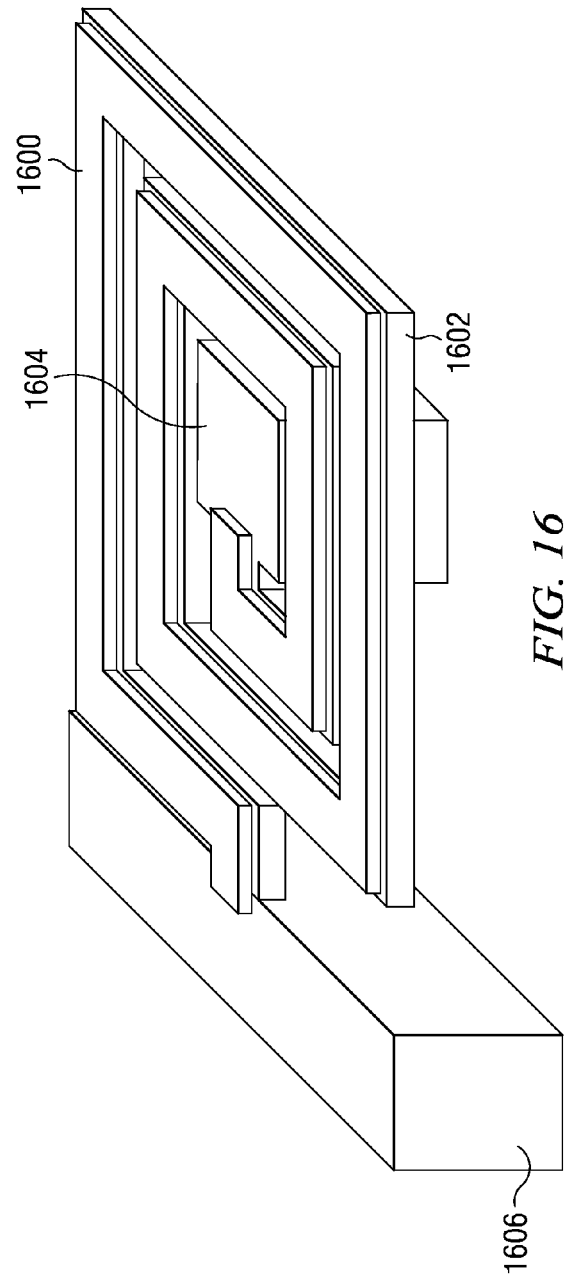
Figure 17:
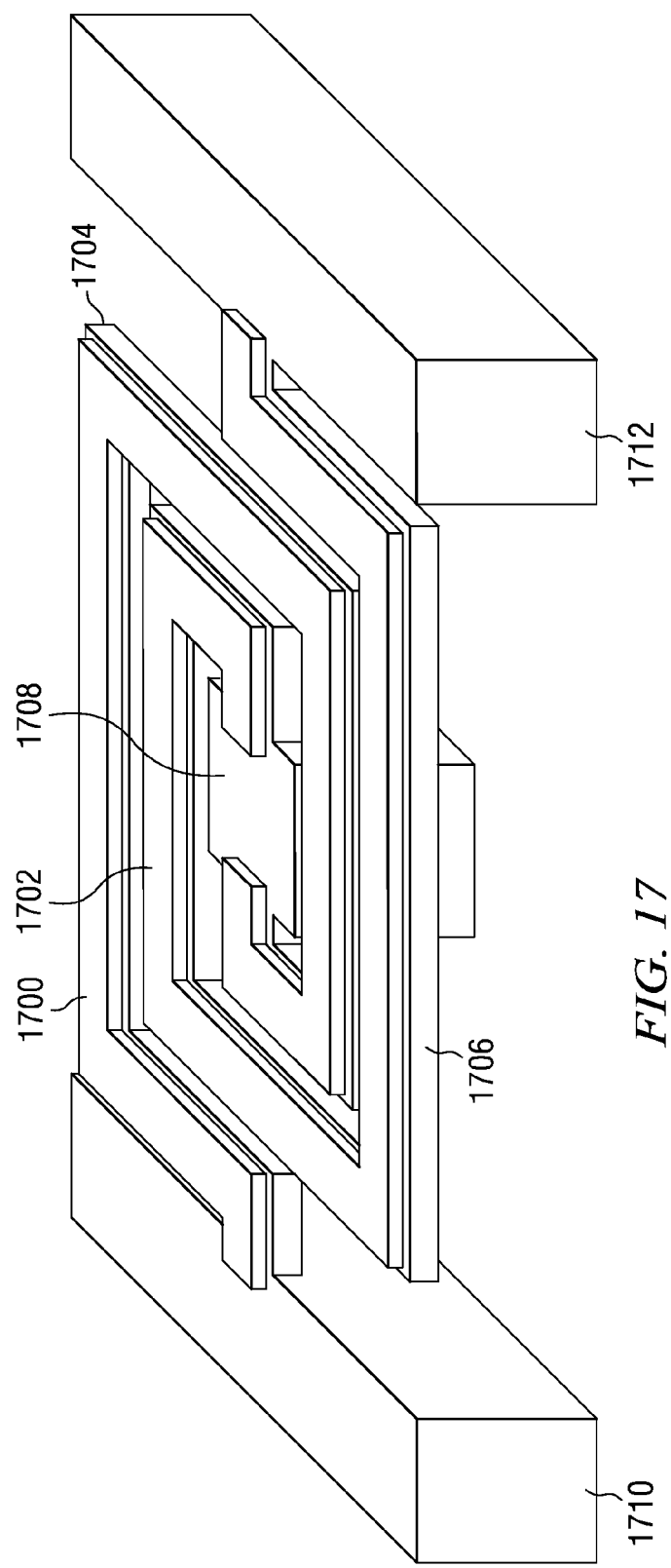

FIG. 15 through FIG. 17 depict alternate configurations of piezoelectric elements, formed according to embodiments. Referring to FIG. 15, a piezoelectric element 1500 has a serpentine configuration. The serpentine piezoelectric element 1500 is formed on a flexible element 1502, which also has a serpentine configuration in the instant embodiment. The serpentine piezoelectric element 1500 may be configured to operate in the $d_{31}$ mode or the $d_{33}$ mode. A proof mass, not shown, is attached to an end of the flexible element 1502. Forming the piezoelectric element 1500 and the flexible element 1502 in a serpentine configuration may advantageously reduce a resonant frequency of the flexible element 1502 for a given proof mass.

Referring to FIG. 16, a piezoelectric element 1600 has a spiral configuration. The spiral piezoelectric element 1600 is formed on a flexible element 1602, which also has a spiral configuration in the instant embodiment. The spiral piezoelectric element 1600 may be configured to operate in the $d_{31}$ mode or the $d_{33}$ mode. The spiral flexible element 1602 is attached to a proof mass 1604 at a central end of the spiral flexible element 1602. The spiral flexible element 1602 may optionally be attached to a base 1606 at an outer end of the spiral flexible element 1602. Forming the piezoelectric element 1600 and the flexible element 1602 in a spiral configuration may advantageously reduce a resonant frequency of the flexible element 1602 for a given proof mass 1604.

Referring to FIG. 17, a first piezoelectric element 1700 and a second piezoelectric element 1702 have an entwined spiral configuration. The first piezoelectric element 1700 is formed on a first flexible element 1704 and the second piezoelectric element 1702 is formed on a second flexible element 1706.

The first flexible element 1704 and the second flexible element 1706 similarly have an entwined spiral configuration. The first piezoelectric element 1700 and the second piezoelectric element 1702 may be configured to operate in the $d_{31}$ mode or the $d_{33}$ mode. The first flexible element 1704 and the second flexible element 1706 are attached to a proof mass 1708 at a central ends of the first flexible element 1704 and the second flexible element 1706. The first flexible element 1704 may be attached to a first base 1710 and the second flexible element 1706 may be attached to a second base 1712 at outer ends of the first flexible element 1704 and the second flexible element 1706. Forming the first piezoelectric element 1700, the first flexible element 1704, the second piezoelectric element 1702 and the second flexible element 1706 in an entwined spiral configuration may advantageously reduce a resonant frequency of the first flexible element 1704 and the second flexible element 1706 for a given proof mass 1708.

Figure 18A:
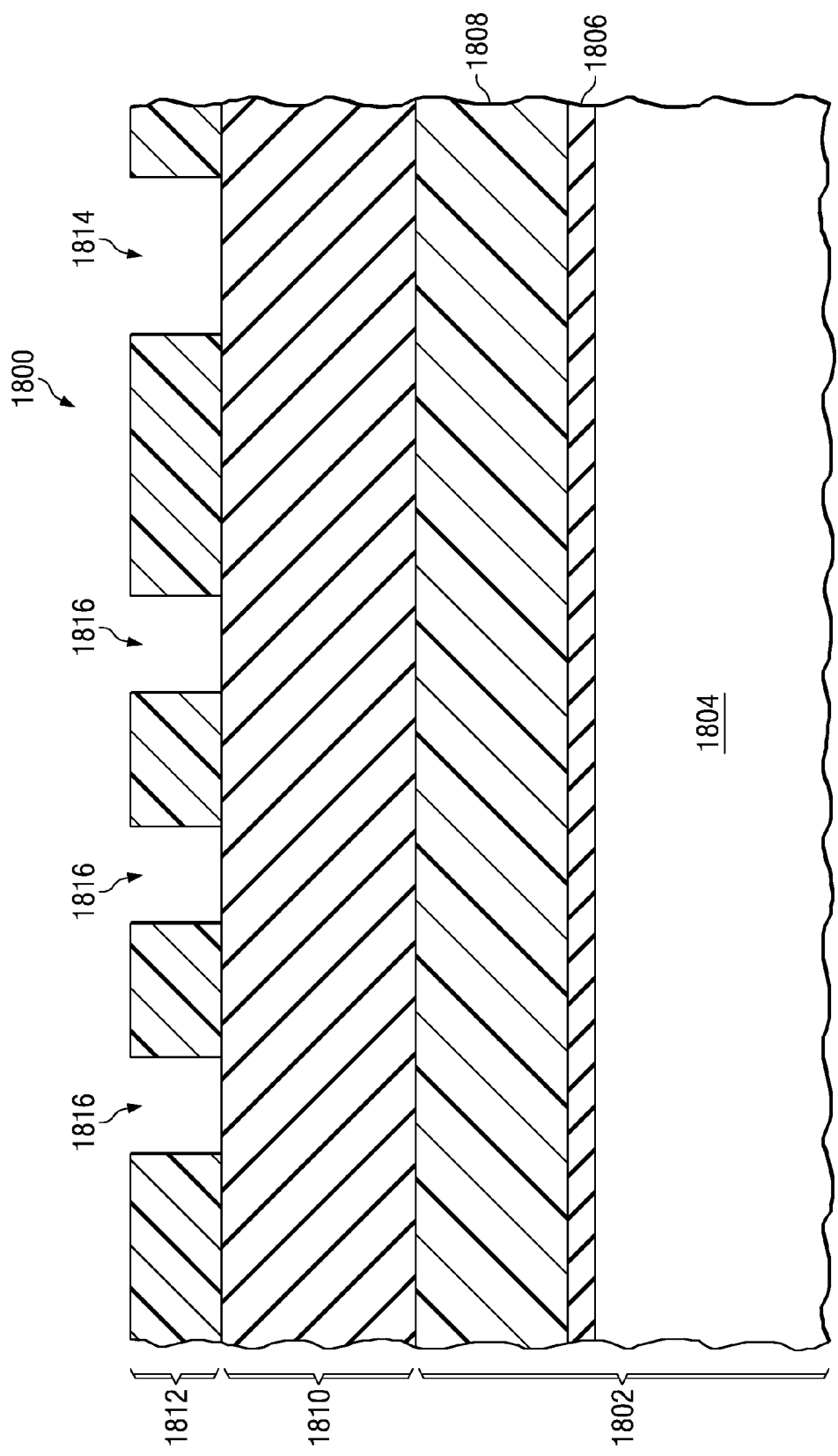
FIGS. 18A-18C and 19A-19B are cross-sectional views showing the formation of ferroelectric capacitors concurrently with steps for fabricating MEMS devices with piezoelectric elements.

FIG. 18A through FIG. 18F are cross sections of a planar integrated MEMS device with a ferroelectric capacitor, formed according to an embodiment, depicted in successive stages of fabrication. Referring to FIG. 18A, the MEMS device 1800 is formed on a semiconductor substrate 1802 which in the version of the instant embodiment depicted in FIG. 18A through FIG. 18E, is an SOI wafer 1802, which includes a support wafer 1804, a buried oxide layer 1806 and an SOI film 1808, as described in reference to FIG. 1A. In other versions of the instant embodiment, the semiconductor substrate 1802 may be, for example, a single crystal semiconductor substrate. A dielectric isolation layer 1810 is formed on the semiconductor substrate 1802 as described in reference to FIG. 1A.

In the instant embodiment, front side singulation trenches are formed prior to formation of a piezoelectric element, not shown, of the MEMS device 1800. A front side trench etch mask 1812 is formed over the dielectric isolation layer 1810. The front side trench etch mask 1812 includes a singulation trench opening 1814 and at least one capacitor trench opening 1816, which expose the dielectric isolation layer 1810. In the instant embodiment, the capacitor trench openings 1816 are less than half as wide as the singulation trench opening 1814. The singulation trench opening 1814 surrounds the MEMS device 1800, with a possible exception of gaps which are less than 20 percent of a length of a boundary of the MEMS device 1800. The front side trench etch mask 1812 may include layers of photoresist and dielectric hard mask material such as silicon nitride, silicon carbide or silicon carbon nitride.

Figure 18B:
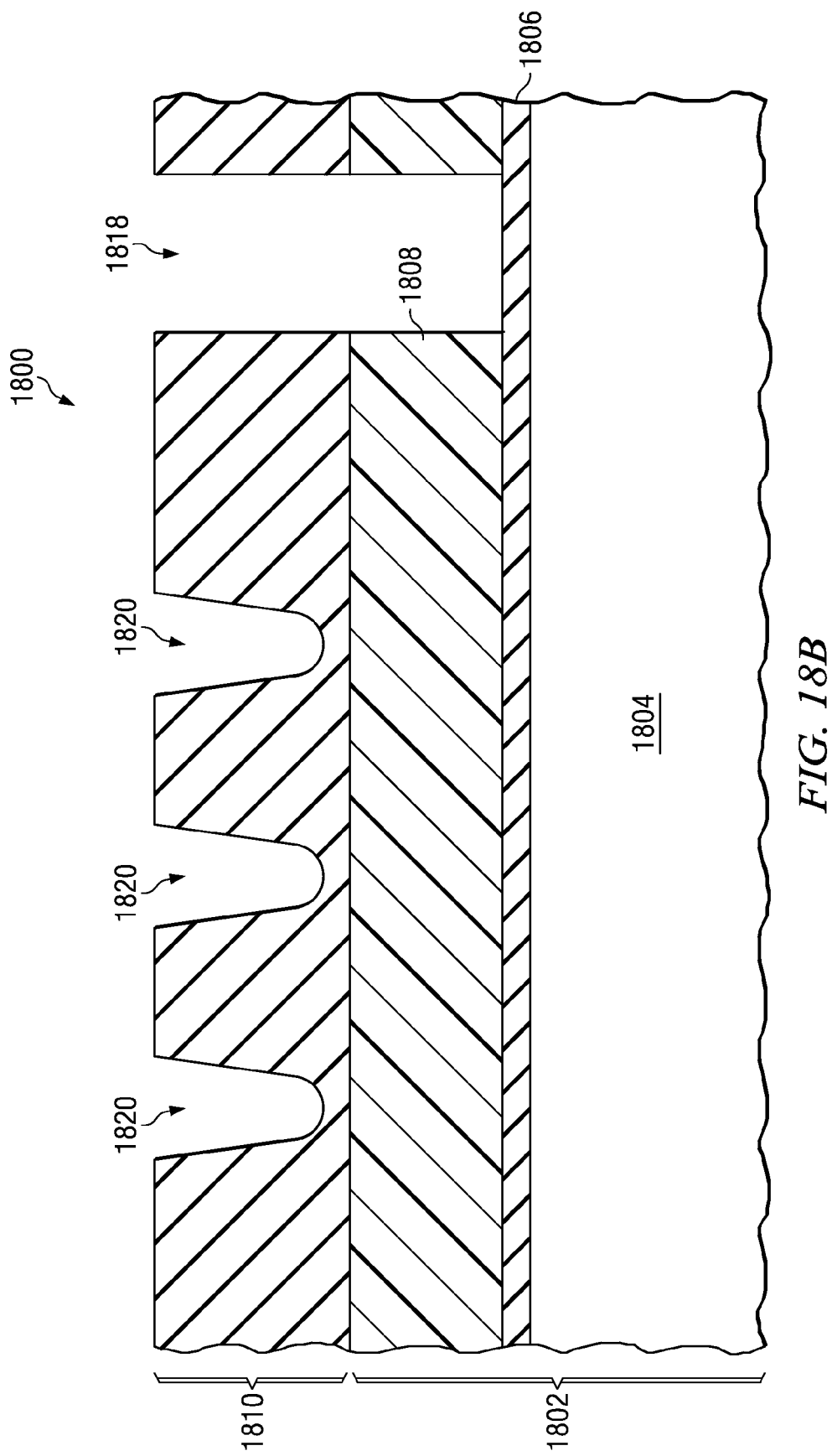

FIG. 18B depicts the MEMS device 1800 during a front side trench etch process which removes material from the dielectric isolation layer 1810 and subsequently the SOI film 1808 under the singulation trench opening 1814 and the capacitor trench openings 1816, forming a front side singulation trench 1818 and capacitor trenches 1820, respectively. The front side trench etch process is performed so that an etch rate in the capacitor trenches 1820 is lower than an etch rate in the front side singulation trench 1818, due to the narrower width of the capacitor trench openings 1816 in the front side trench etch mask 1812.

Figure 18C:
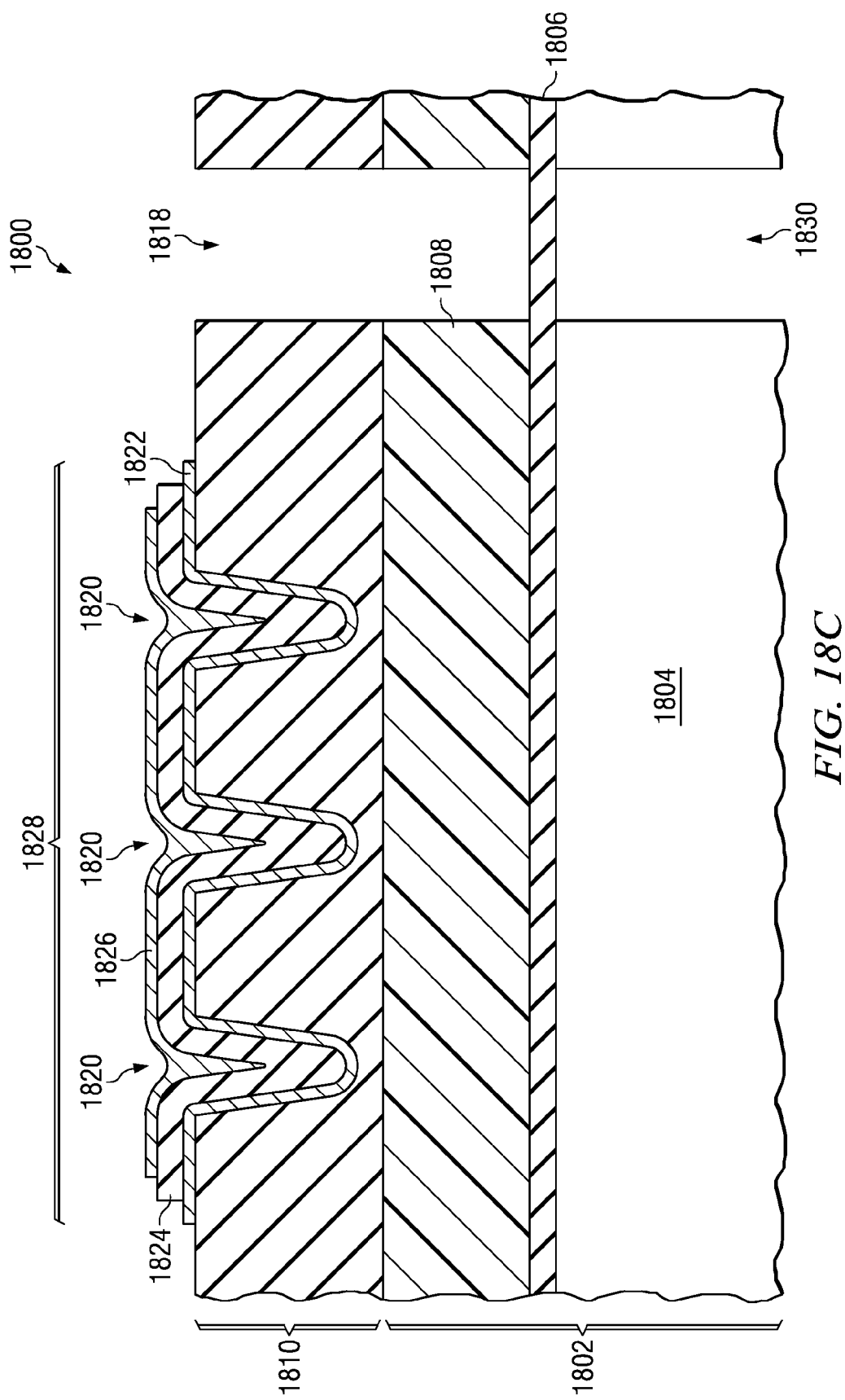

FIG. 18C depicts the MEMS device 1800 after the front side trench etch process is completed. The front side trench etch mask 1812, of FIG. 18A, is subsequently removed. The front side singulation trench 1818 extends through the dielectric isolation layer 1810 and the SOI film 1808. The capacitor trenches 1820 do not extend as far as the front side singulation trench 1818. In one version of the instant embodiment, the capacitor trenches 1820 may extend only into the dielectric isolation layer 1810 and not into the SOI film 1808, as depicted in FIG. 18C. Etching the capacitor trenches 1820 concurrently with the front side singulation trench 1818 may advantageously reduce a fabrication cost and complexity of the MEMS device 1800.

Referring to FIG. 18D, a first capacitor plate 1822 is formed in the capacitor trenches 1820, for example using an MOCVD or atomic layer deposition (ALD) process. In one version of the instant embodiment, the first capacitor plate 1822 may be formed concurrently with a first electrode, not shown, of a piezoelectric element, not shown, which operates in the $d_{31}$ mode, of the MEMS device 1800. Performing the front side trench etch process so as to have a lower etch rate in the narrower capacitor trench openings 1816 may advantageously configure the capacitor trenches to be electrically isolated by the dielectric isolation layer 1810.

A ferroelectric capacitor insulator 1824 is formed in the capacitor trenches 1820 on the first capacitor plate 1822. The capacitor insulator may be formed, for example, using an MOCVD process so as to obtain a conformal ferroelectric layer in the capacitor trenches 1820. In one version of the instant embodiment, the capacitor insulator 1824 may be formed concurrently with a ferroelectric element, not shown, of the piezoelectric element of the MEMS device 1800.

A second capacitor plate 1826 is formed in the capacitor trenches 1820 on the capacitor insulator 1824, for example using an MOCVD or ALD process. In one version of the instant embodiment, the second capacitor plate 1826 may be formed concurrently with a second electrode, not shown, of the piezoelectric element of the MEMS device 1800. A combination of the first capacitor plate 1822, the ferroelectric capacitor insulator 1824 and the second capacitor plate 1826 forms a ferroelectric capacitor 1828.

Referring to FIG. 18E, a back side DRIE etch is performed on the semiconductor substrate 1802 which removes substrate material from a back side singulation trench 1830 disposed under the front side singulation trench 1818. In the instant embodiment, the back side DRIE may be continued until the buried oxide layer 1806 is exposed in the back side singulation trench 1830.

FIG. 18F depicts the MEMS device 1800 after singulation is completed. The ferroelectric capacitor 1828 may be used, for example, to store energy produced by the piezoelectric element of the MEMS device 1800. Forming the ferroelectric capacitor insulator 1824 concurrently with the ferroelectric element of the piezoelectric element may advantageously reduce a fabrication cost and complexity of the MEMS device 1800.

Figure 19A:
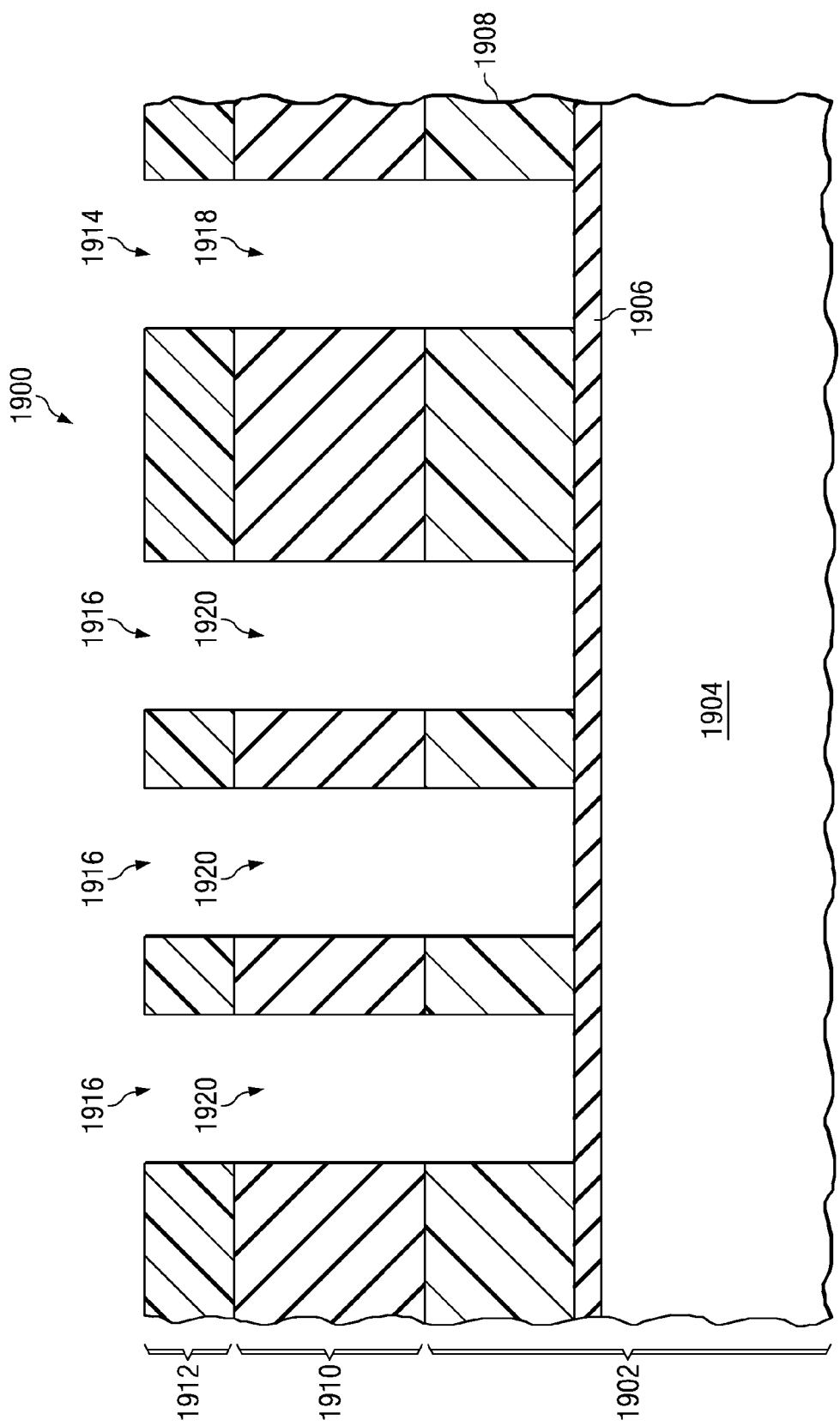

FIG. 19A through FIG. 19E are cross sections of a planar integrated MEMS device with a ferroelectric capacitor, formed according to an embodiment, depicted in successive stages of fabrication. Referring to FIG. 19A, the MEMS device 1900 is formed on a semiconductor substrate 1902 which in the version of the instant embodiment depicted in FIG. 19A through FIG. 19E, is an SOI wafer 1902, which includes a support wafer 1904, a buried oxide layer 1906 and an SOI film 1908, as described in reference to FIG. 1A. In other versions of the instant embodiment, the semiconductor substrate 1902 may be, for example, a single crystal silicon wafer. A dielectric isolation layer 1910 is formed on the semiconductor substrate 1902 as described in reference to FIG. 1A.

In the instant embodiment, front side singulation trenches are formed prior to formation of a piezoelectric element, not shown, of the MEMS device 1900. A front side trench etch mask 1912 is formed over the dielectric isolation layer 1910, as described in reference to FIG. 18A. The front side trench etch mask 1912 includes a singulation trench opening 1914 and at least one capacitor trench opening 1916, which expose the dielectric isolation layer 1910. In the instant embodiment, the capacitor trench openings 1916 are more than half as wide as the singulation trench opening 1914. The singulation trench opening 1914 surrounds the MEMS device 1900, as described in reference to FIG. 18A.

Figure 19B:
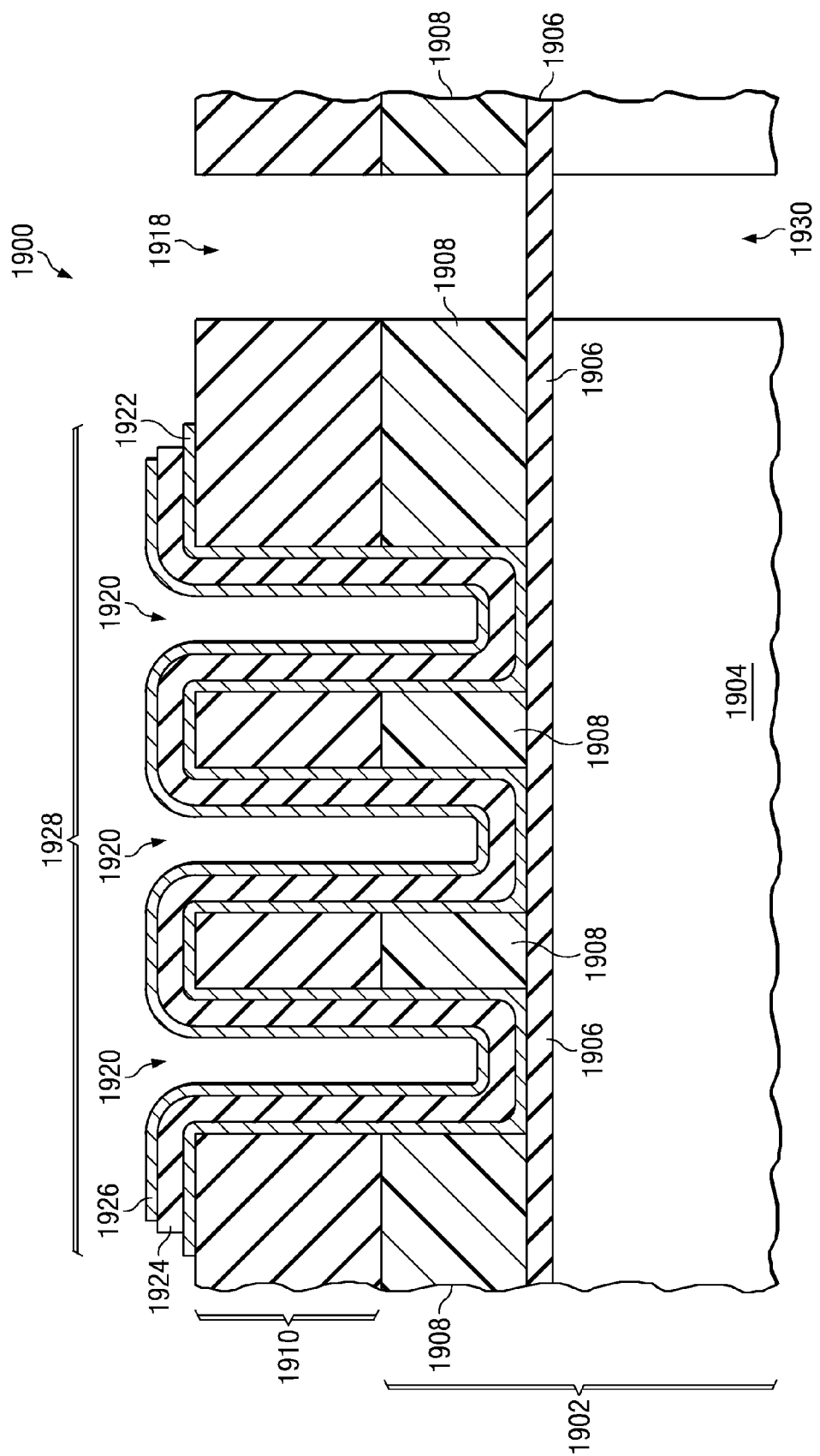

FIG. 19B depicts the MEMS device 1900 during a front side trench etch process which removes material from the dielectric isolation layer 1910 and subsequently the SOI film 1908 under the singulation trench opening 1914 and the capacitor trench openings 1916, forming a front side singulation trench 1918 and capacitor trenches 1920, respectively. The front side trench etch process is performed so that an etch rate in the capacitor trenches 1920 is substantially equal to an etch rate in the front side singulation trench 1918. After the front side trench etch process is completed, the front side trench etch mask 1912 is subsequently removed.

FIG. 19C depicts the MEMS device 1900 after the front side trench etch process is completed and the ferroelectric capacitor 1928 is formed. The front side singulation trench 1918 extends through the dielectric isolation layer 1910 and the SOI film 1908. The capacitor trenches 1920 also extend through the dielectric isolation layer 1910 and the SOI film 1908. A first capacitor plate 1922 is formed in the capacitor trenches 1920, for example using an MOCVD or ALD process. In one version of the instant embodiment, the first capacitor plate 1922 may be formed concurrently with a first electrode, not shown, of a piezoelectric element, not shown, which operates in the $d_{31}$ mode, of the MEMS device 1900. In one version of the instant embodiment, the first capacitor plate 1922 may electrically connect to the semiconductor substrate 1902, as depicted in FIG. 19C. In another version, a dielectric liner, not shown, may be formed in the capacitor trenches 1920 prior to forming the first capacitor plate 1922, so as to electrically isolate the first capacitor plate 1922 from the semiconductor substrate 1902.

A ferroelectric capacitor insulator 1924 is formed in the capacitor trenches 1920 on the first capacitor plate 1922. The capacitor insulator may be formed, for example, using an MOCVD process so as to obtain a conformal ferroelectric layer in the capacitor trenches 1920. In one version of the instant embodiment, the capacitor insulator 1924 may be formed concurrently with a ferroelectric element, not shown, of the piezoelectric element of the MEMS device 1900.

A second capacitor plate 1926 is formed in the capacitor trenches 1920 on the capacitor insulator 1924, for example using an MOCVD or ALD process. In one version of the instant embodiment, the second capacitor plate 1926 may be formed concurrently with a second electrode, not shown, of the piezoelectric element of the MEMS device 1900. A combination of the first capacitor plate 1922, the ferroelectric capacitor insulator 1924 and the second capacitor plate 1926 forms the ferroelectric capacitor 1928.

Referring to FIG. 19D, a back side DRIE etch is performed on the semiconductor substrate 1902 which removes substrate material from a back side singulation trench 1930 disposed under the front side singulation trench 1918. In the instant embodiment, the back side DRIE may be continued until the back side singulation trench 1930 connects with the front side singulation trench 1918.

FIG. 19E depicts the MEMS device 1900 after singulation is completed. The ferroelectric capacitor 1928 may be used, for example, to store energy produced by the piezoelectric element of the MEMS device 1900. Forming the ferroelectric capacitor insulator 1924 concurrently with the ferroelectric element of the piezoelectric element may advantageously reduce a fabrication cost and complexity of the MEMS device 1900.

Figure 20:
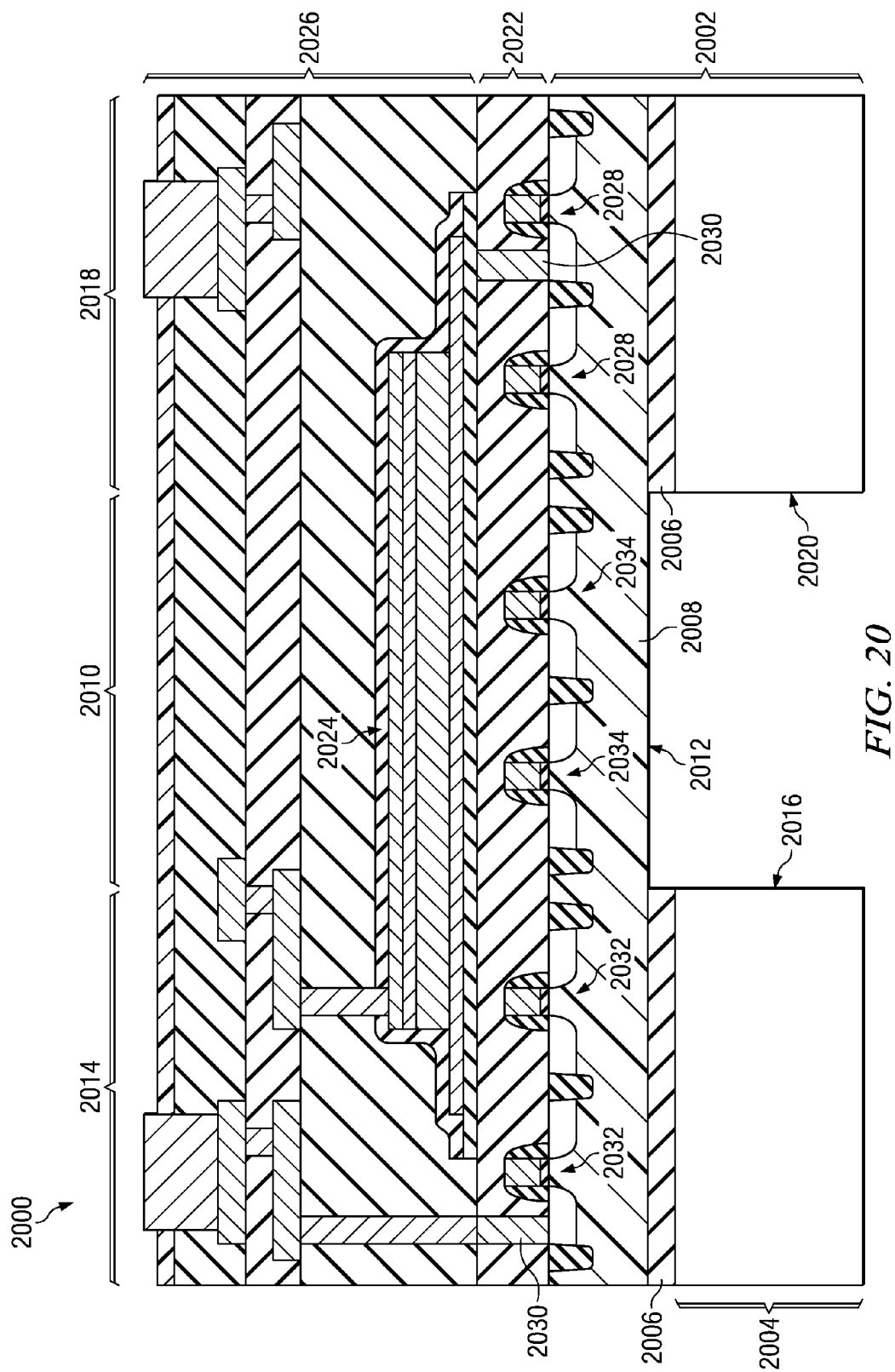
FIG. 20 is a cross-sectional view showing the formation of other circuit elements integrated with the methods for fabricating MEMS devices with piezoelectric elements.

FIG. 20 depicts a MEMS device with transistors disposed in a base area, in a proof mass area and/or in a flexible element area. The MEMS device 2000 is formed on a semiconductor substrate 2002, which may be an SOI wafer as depicted in FIG. 20, or may be a single crystal wafer. In the instant embodiment, the SOI wafer 2002 includes a support wafer 2004, buried oxide layer 2006 and SOI film 2008 as described in reference to FIG. 1A. An area 2010 for a flexible element 2012, an area 2014 for a proof mass 2016 and an area 2018 for a base 2020 are defined in the MEMS device 2000. A dielectric isolation layer 2022 is disposed over the semiconductor substrate 2002. A piezoelectric element 2024 is disposed over the dielectric isolation layer 2022, as described in reference to embodiment recited herein. Additional dielectric layers and electrical interconnect elements 2026 may be formed over the piezoelectric element 2024.

In the instant embodiment, a first plurality of transistors 2028 may be disposed on the semiconductor substrate 2002 in the base area 2018. Instances of the first plurality of transistors 2028 may be electrically coupled to the piezoelectric element 2024 or other components, not shown, through instances of contacts 2030 in the dielectric isolation layer 2022. Instances of the first plurality of transistors 2028 may be parts of circuits, not shown, of the MEMS device 2000.

A second plurality of transistors 2032 may be disposed on the semiconductor substrate 2002 in the proof mass area 2014. Instances of the second plurality of transistors 2032 may be electrically coupled to the piezoelectric element 2024 or other components, not shown, through instances of contacts 2030 in the dielectric isolation layer 2022. Instances of the second plurality of transistors 2032 may be parts of circuits, not shown, of the MEMS device 2000.

In versions of the instant embodiment in which the flexible element 2012 includes a sufficient amount of semiconductor material of the semiconductor substrate 2002, a third plurality of transistors 2034 may be disposed on the semiconductor substrate 2002 in the flexible element area 2010. Instances of the third plurality of transistors 2034 may be electrically coupled to the piezoelectric element 2024 or other components, not shown, through instances of contacts 2030 in the dielectric isolation layer 2022. Instances of the third plurality of transistors 2034 may be parts of circuits, not shown, of the MEMS device 2000.

Those skilled in the art to which the invention relates will appreciate that the described embodiments may be varied and that other embodiments may be established within the scope of the claimed invention.

What is claimed is:

1. A method of fabricating a MEMS device integrated on a same substrate as an integrated circuit, the method comprising:

forming integrated circuit components proximate a top surface of a semiconductor substrate;

forming a dielectric isolation layer over a substrate in an area defined for a flexible element;

forming a lower hydrogen barrier layer over the dielectric isolation layer;

forming a ferroelectric layer over the lower hydrogen barrier layer;

patterning the ferroelectric layer to form a piezoelectric element;

forming first and second electrodes on the piezoelectric element;

forming an upper hydrogen barrier over the piezoelectric element;

forming metal contacts to make electrical connections to the first and second electrodes; and etching a back of the substrate to remove material from the substrate in a flexible element area and in a back side singulation trench area, thereby defining a flexible element, a proof mass and a base.

2. The method of claim 1, wherein the first and second electrodes comprise a lower electrode contacting a bottom surface of the piezoelectric element, and an upper electrode contacting a top surface of the piezoelectric element.

3. The method of claim 1, wherein the first and second electrodes comprise patterned first and second electrodes both contacting a top or bottom surface of the piezoelectric element.

4. The method of claim 1, wherein at least one metal contact is formed in the dielectric isolation layer and connects to a bottom surface of one of the first and second electrodes.

5. The method of claim 1, wherein at least one metal contact is formed above the piezoelectric element and connects to a top surface of one of the first and second electrodes.

6. The method of claim 1, wherein a first metal contact is formed in the dielectric isolation layer and connects to a bottom surface of one of the first and second electrodes; and a second metal contact is formed above the piezoelectric element and connects to a top surface of the other of the first and second electrodes.

7. The method of claim 1, further comprising forming a front side singulation trench extending to the substrate around a periphery of the MEMS device.

8. The method of claim 1, wherein patterning the ferroelectric layer also forms an insulator of a capacitor, and wherein forming the first and second electrodes also forms plates of the capacitor.

9. The method of claim 1, wherein forming the circuit components includes forming transistors in one or more of a base area, proof mass area or flexible element area of the MEMS device.

10. The method of claim 1, wherein forming the circuit components includes forming rectifier diodes configured to rectify current generated from the piezoelectric element.

11. The method of claim 1, wherein the flexible element is formed to have a cantilever beam configuration, with the proof mass disposed at one at one end of the beam and the base is disposed at an opposite end of the beam.

12. The method of claim 1, wherein the flexible element is formed to have a membrane configuration, with the base disposed around a periphery of the flexible element and the proof mass disposed at a central region of the flexible element.

13. The method of claim 1, wherein the flexible element is formed to have a membrane configuration, with the base disposed at a central region of the central element and the proof mass disposed around a periphery of the flexible element.

14. A method of forming a MEMS device integrated on a same substrate as an integrated circuit, the method comprising:
providing a semiconductor substrate;
forming a dielectric isolation layer over the semiconductor substrate;
forming a piezoelectric element over the dielectric isolation layer, by a process including:
  forming a planar ferroelectric element having a perovskite structure over the dielectric isolation layer;
  forming a first electrode with at least a portion disposed on one of a top or bottom surface of the ferroelectric element; and
  forming a second electrode with at least a portion disposed on the top surface of the ferroelectric element;
forming an upper hydrogen barrier over the piezoelectric element;
forming a first contact to establish electrical connection to the first electrode;
forming a second contact to establish electrical connection to the second electrode;
etching front side singulation trenches through the dielectric isolation layer and into the semiconductor substrate around a periphery of the MEMS device;
forming a back side deep reactive ion etch (DRIE) mask on a bottom surface of the semiconductor substrate, such that:
  the DRIE mask exposes the semiconductor substrate in a flexible element etch area of the MEMS device, the flexible element area being disposed under the piezoelectric element;
  the DRIE mask includes a proof mass segment disposed adjacent to the flexible element etch area;
  the proof mass segment masks a portion of the semiconductor substrate in a proof mass area of the MEMS device; and
  the DRIE mask exposes the semiconductor substrate in back side singulation trench areas disposed under the front side singulation trenches;
performing a back side DRIE process, in which
  the back side DRIE process removes substrate material from the flexible element etch area so as to form a flexible element of the MEMS device, so that at least a portion of the piezoelectric element overlaps the flexible element;
  a proof mass is formed in the semiconductor substrate in the proof mass area so that the proof mass is adjacent to the flexible element; and
  the back side DRIE process removes substrate material from the back side singulation trench areas; and
singulating the MEMS device at the front side singulation trenches.

15. The process of claim 14, in which the step of forming the ferroelectric element includes steps:
forming a plurality of sol gel layers over the dielectric isolation layer, each the sol gel layer being formed by a process including steps:
  dispensing a quantity of sol gel solution on existing top surface of the MEMS device, the sol gel solution including solvents;
  spinning the semiconductor substrate so as to distribute the sol gel solution over the top surface of the MEMS device to form the sol gel layer on the top surface of the MEMS device, and so as to remove a portion of the solvents from the sol gel layer;
  drying the sol gel layer in a non-reducing ambient, the non-reducing ambient having at least 1 percent relative humidity at 25 C; and
  baking the sol gel layer in a non-reducing ambient so that a temperature of the sol gel layer increases from a starting temperature between 100 C and 225 C to a final temperature between 275 C and 425 C over a time period of at least 2 minutes; and
annealing the plurality of sol gel layers, by a process including steps:
  baking the semiconductor substrate and the plurality of sol gel layers at a temperature between 250 C and 350 C for at least 30 seconds, while ramping a pressure of an oxidizing ambient over the plurality of sol gel layers from less than 100 torr to between 700 torr and 1000 torr at a ramp rate greater than 10 torr per second, while flowing an oxidant in the ambient between 3 and 7 standard liters per minute (slm);

ramping the temperature of the semiconductor substrate and the plurality of sol gel layers to between 425 C and 475 C over a time period of at least 20 seconds, while the pressure of the ambient is maintained between 700 torr and 1000 torr, while flowing the oxidant in the ambient between 3 and 7 slm;

baking the semiconductor substrate and the plurality of sol gel layers at a temperature between 475 C and 525 C for at least 30 seconds, while the pressure of the ambient is maintained between 700 torr and 1000 torr, while flowing the oxidant in the ambient between 3 and 7 slm;

ramping the temperature of the semiconductor substrate and the plurality of sol gel layers to between 650 C and 750 C at a ramp rate between 20 and 60 degrees C. per minute, while the pressure of the ambient is maintained between 700 torr and 1000 torr, while flowing the oxidant in the ambient between 3 and 7 slm;

annealing the semiconductor substrate and the plurality of sol gel layers at a temperature between 650 C and 750 C for at least 60 seconds, while spinning the semiconductor substrate between 50 and 125 rpm, while the pressure of the ambient is maintained between 700 torr and 1000 torr, while flowing the oxidant in the ambient between 3 and 7 slm;

annealing the semiconductor substrate and the plurality of sol gel layers at a temperature between 650 C and 750 C for at least 20 seconds, while spinning the semiconductor substrate between 50 and 125 rpm, while the pressure of the ambient is maintained between 4 torr and 10 torr, while flowing the oxidant in the ambient at least 5 slm;

annealing the semiconductor substrate and the plurality of sol gel layers at a temperature between 650 C and 750 C for at least 20 seconds, while spinning the semiconductor substrate between 50 and 125 rpm, while the pressure of the ambient is maintained between 4 torr and 10 torr, while flowing the oxidant in the ambient at least 5 slm; and reducing the temperature of the semiconductor substrate and the plurality of sol gel layers at a ramp rate greater than 5 degrees C. per second to a temperature below 475 C, while spinning the semiconductor substrate between 50 and 125 rpm, while the pressure of the ambient is maintained between 4 torr and 10 torr, while flowing the oxidant in the ambient at least 5 slm.

16. The process of claim 15, further including steps:

forming a first capacitor plate over the dielectric isolation layer concurrently with the step of forming the first electrode of the piezoelectric element;

forming a ferroelectric capacitor insulator disposed on the first capacitor plate concurrently with the step of forming the ferroelectric element of the piezoelectric element, the ferroelectric capacitor insulator having a perovskite structure; and forming a second capacitor plate disposed on the ferroelectric capacitor insulator concurrently with the step of forming the second electrode of the piezoelectric element.

* * * * *